(12) United States Patent
Katayama

(10) Patent No.: US 10,453,512 B2
(45) Date of Patent: Oct. 22, 2019

(54) MEMORY DEVICE

(71) Applicant: TOSHIBA MEMORY CORPORATION, Minato-ku, Tokyo (JP)

(72) Inventor: Akira Katayama, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/128,030

(22) Filed: Sep. 11, 2018

(65) Prior Publication Data

US 2019/0295622 A1    Sep. 26, 2019

(30) Foreign Application Priority Data

Mar. 22, 2018 (JP) ................. 2018-054416

(51) Int. Cl.
| | |
|---|---|
| *G11C 11/16* | (2006.01) |
| *G11C 11/419* | (2006.01) |
| *G11C 7/06* | (2006.01) |
| *G11C 13/00* | (2006.01) |

(52) U.S. Cl.
CPC ...... *G11C 11/1673* (2013.01); *G11C 11/1675* (2013.01); *G11C 11/16* (2013.01); *G11C 11/1659* (2013.01); *G11C 11/1677* (2013.01); *G11C 13/004* (2013.01)

(58) Field of Classification Search
CPC . G11C 11/1673; G11C 11/1659; G11C 11/16; G11C 13/004; G11C 11/1677
USPC ....................................................... 365/158
See application file for complete search history.

(56) References Cited

U.S. PATENT DOCUMENTS

| | | | |
|---|---|---|---|
| 2006/0092734 A1 | 5/2006 | Tsuchida et al. | |
| 2010/0321994 A1 | 12/2010 | Zhu et al. | |
| 2016/0049203 A1* | 2/2016 | Alrod ..................... | G11C 16/26 714/2 |
| 2016/0225427 A1 | 8/2016 | Chen et al. | |
| 2017/0084825 A1 | 3/2017 | Tsunoda | |
| 2017/0329556 A1* | 11/2017 | Hirano ................. | G11C 7/1006 |

(Continued)

FOREIGN PATENT DOCUMENTS

| | | |
|---|---|---|
| JP | 2006127672 A | 5/2006 |
| JP | 2017059740 A | 3/2017 |

OTHER PUBLICATIONS

Gitae Jeong, et al., "A 0.24 μm 2.0V 1T1MTJ 16kb NV Magnetoresistance RAM with Self Reference Sensing," ISSCC 2003 / Session 16 / Non-Volatile Memory / Paper 16.2, 8 Pages.

(Continued)

*Primary Examiner* — Ly D Pham
(74) *Attorney, Agent, or Firm* — Holtz, Holtz & Volek PC

(57) ABSTRACT

According to one embodiment, a memory device, includes a memory cell; and a first circuit that performs a first read on the memory cell to generate a first voltage, performs a reference read on the memory cell to generate a second voltage, generates first data based on the first voltage and the second voltage, writes the first data in the memory cell on which the first read has been performed, performs a second read on the memory cell in which the first data has been written to generate a third voltage, and determines data that was stored in the memory cell when the first read was performed, based on the first voltage and the third voltage.

19 Claims, 68 Drawing Sheets

(56) References Cited

U.S. PATENT DOCUMENTS

2018/0277188 A1\* 9/2018 Fujino ................ G11C 11/1673

OTHER PUBLICATIONS

Hiroaki Tanizaki, et al., "A high-density and high-speed 1T-4MTJ MRAM with Voltage Offset Self-Reference Sensing Scheme," IEEE Asian Solid-State Circuits Conference, Nov. 2006, 4 Pages.

\* cited by examiner

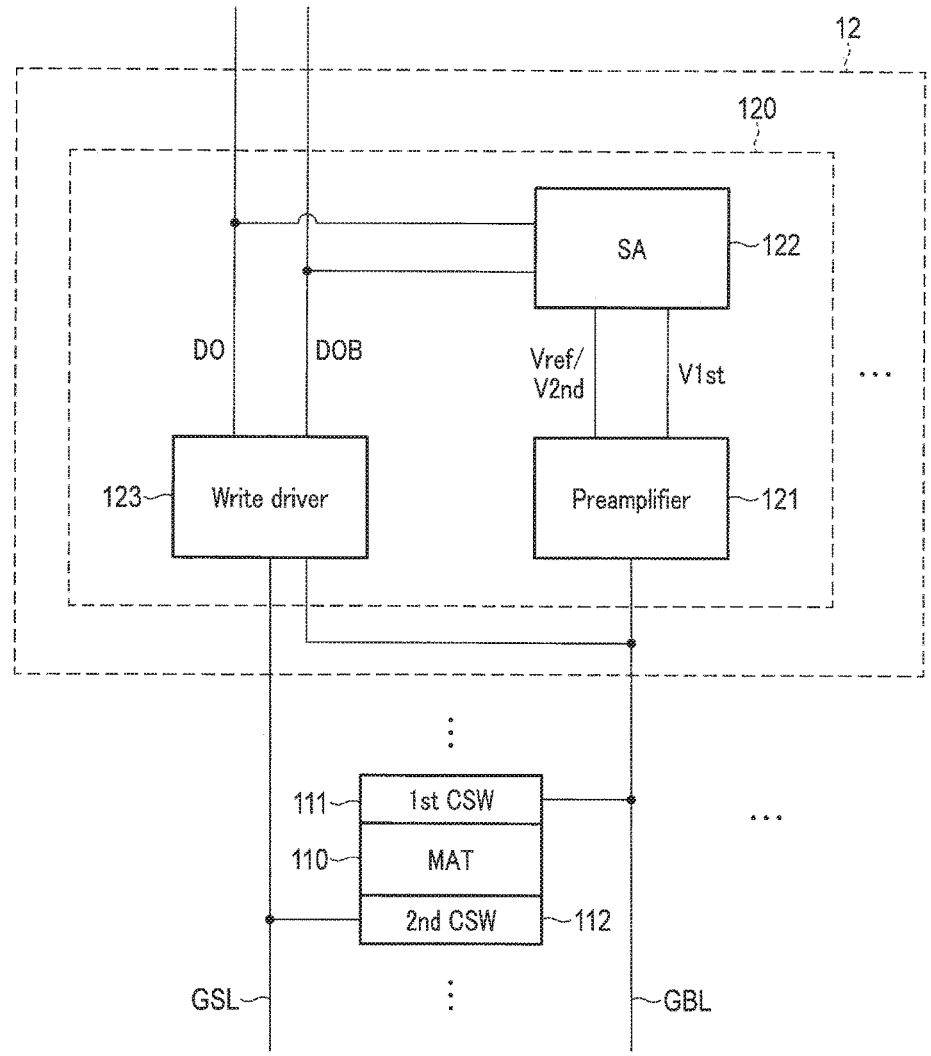
F I G. 3

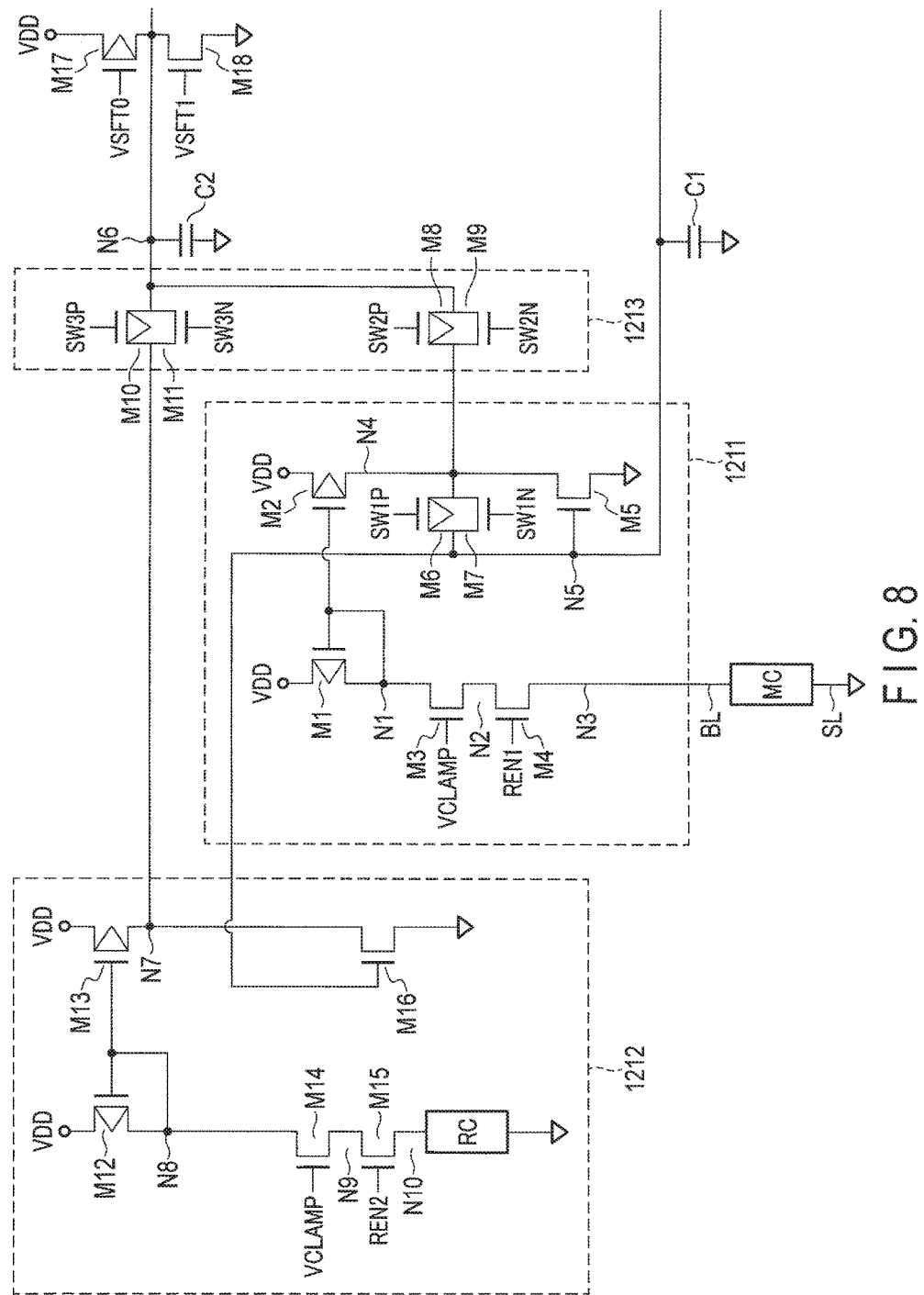
F I G. 8

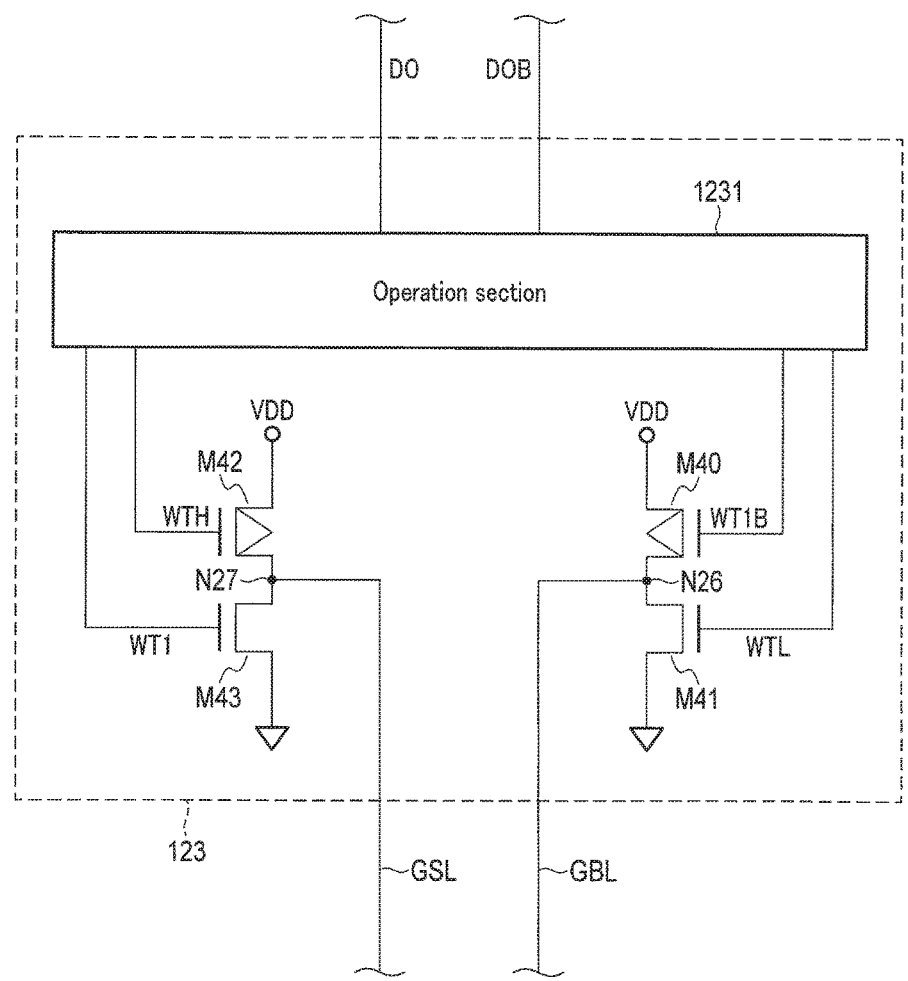
F I G. 10

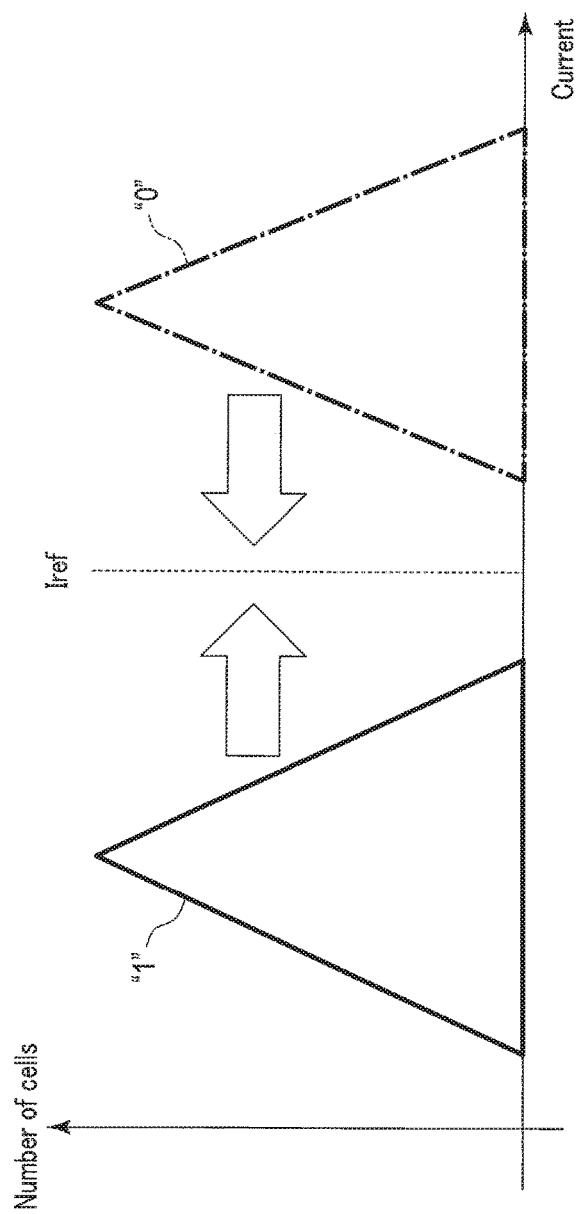
F I G. 11

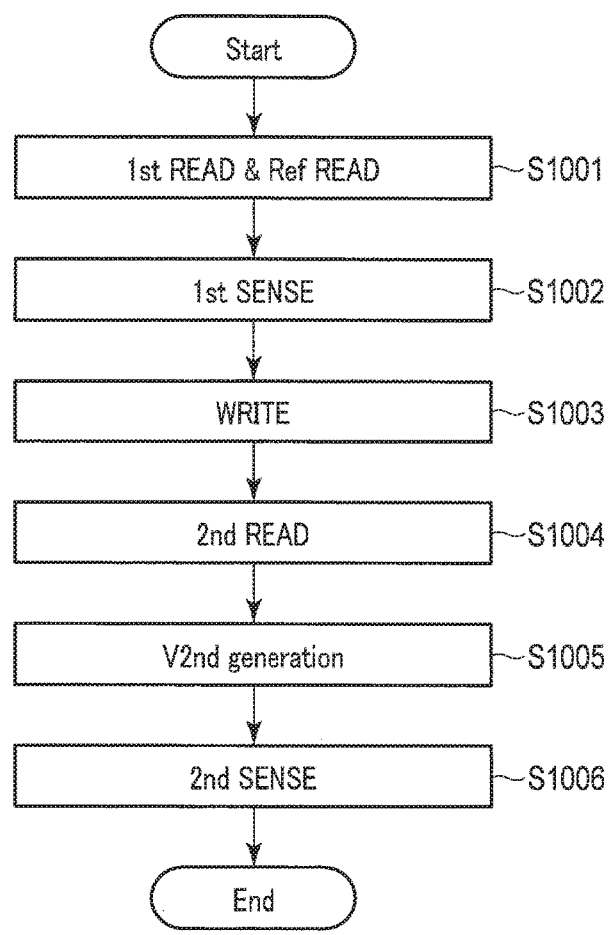
F I G. 13

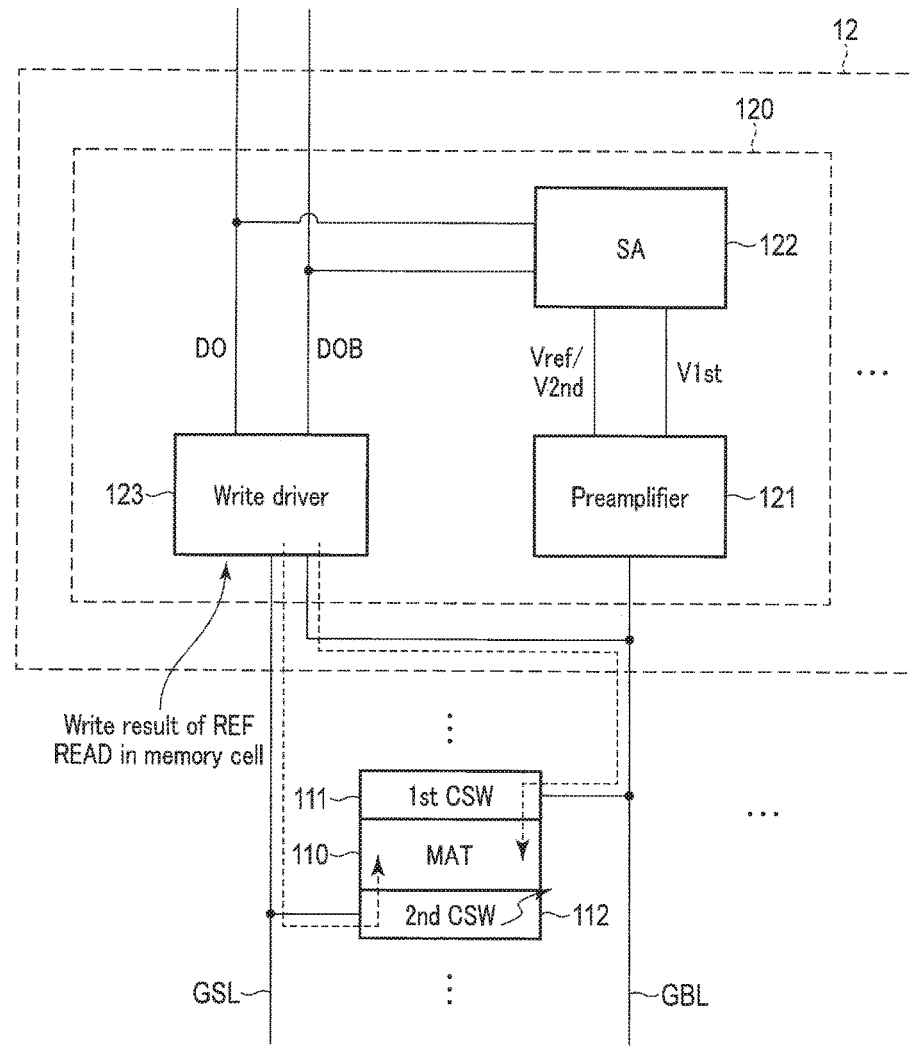
F I G. 15

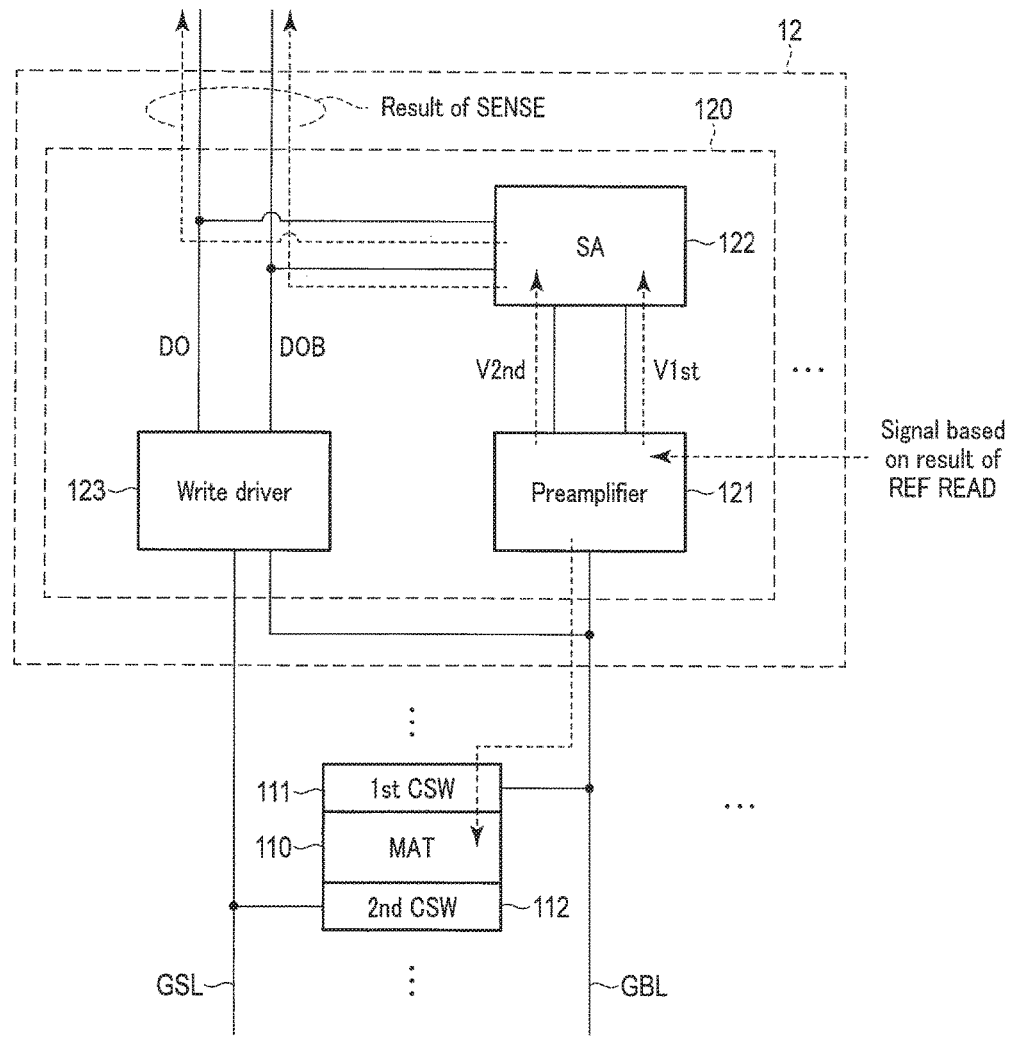
F I G. 17

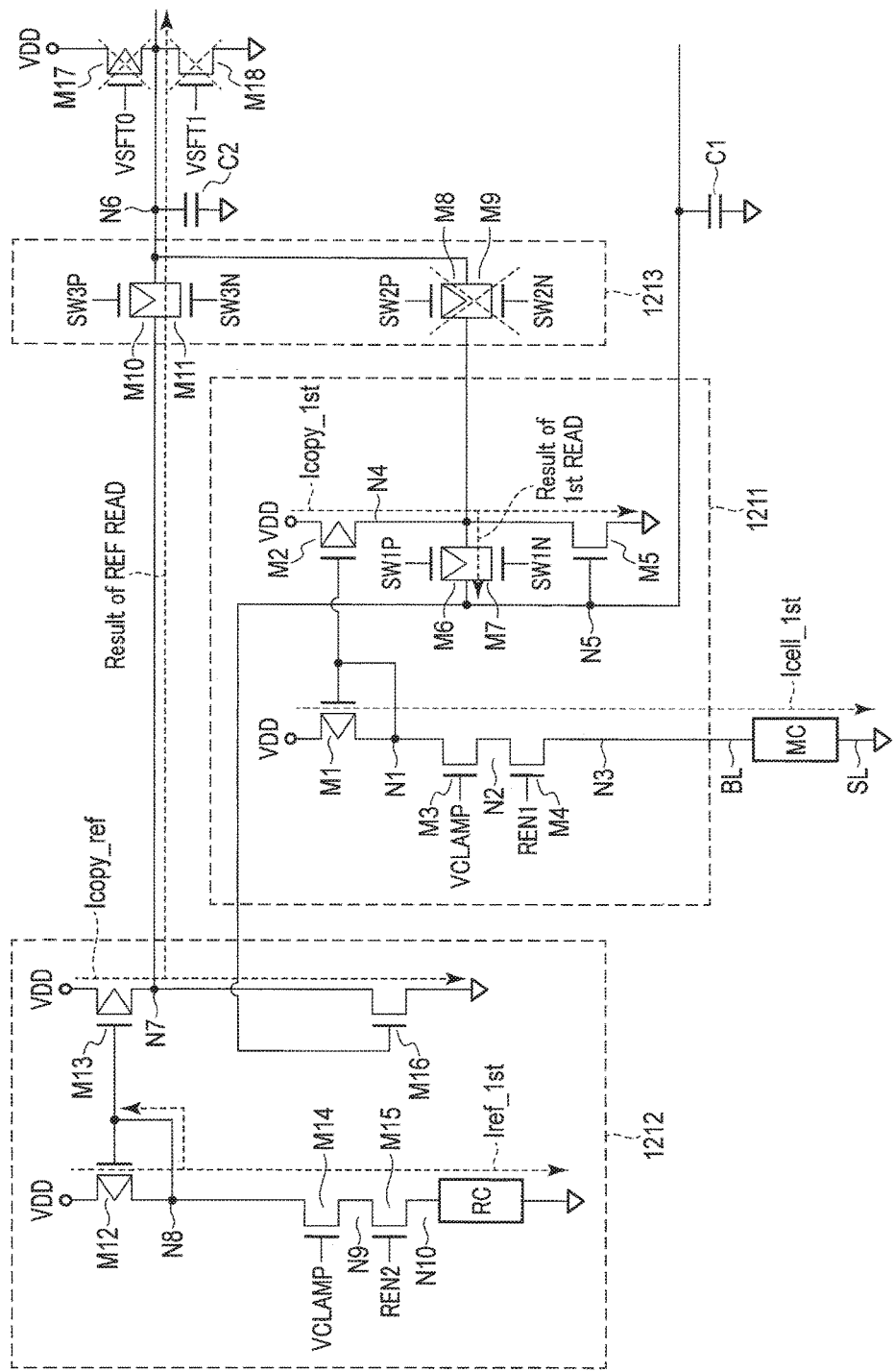
F I G. 22

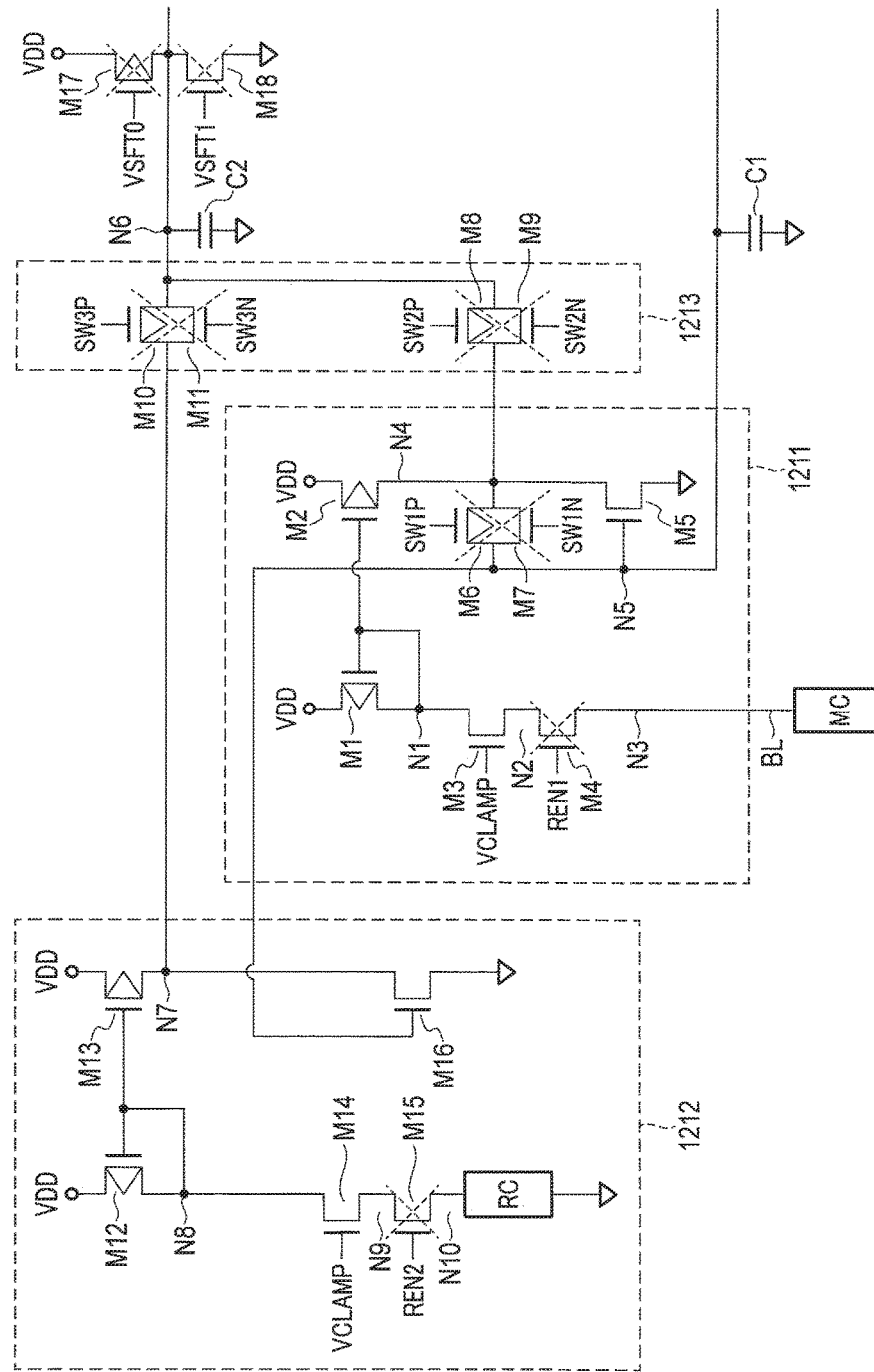
F I G. 23

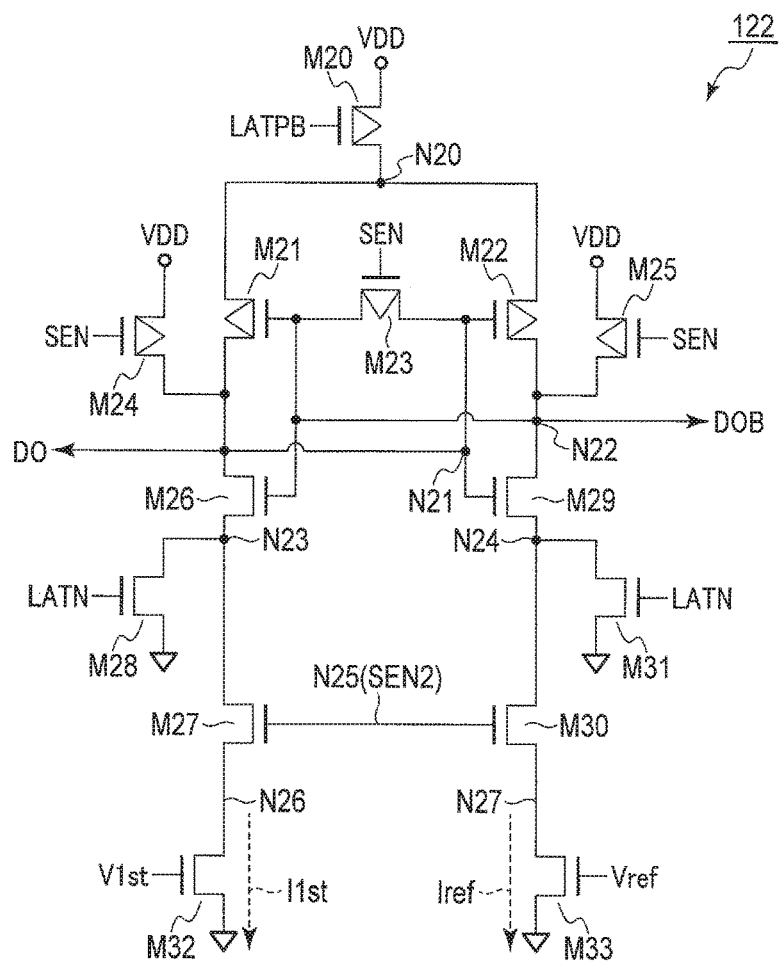
F I G. 24

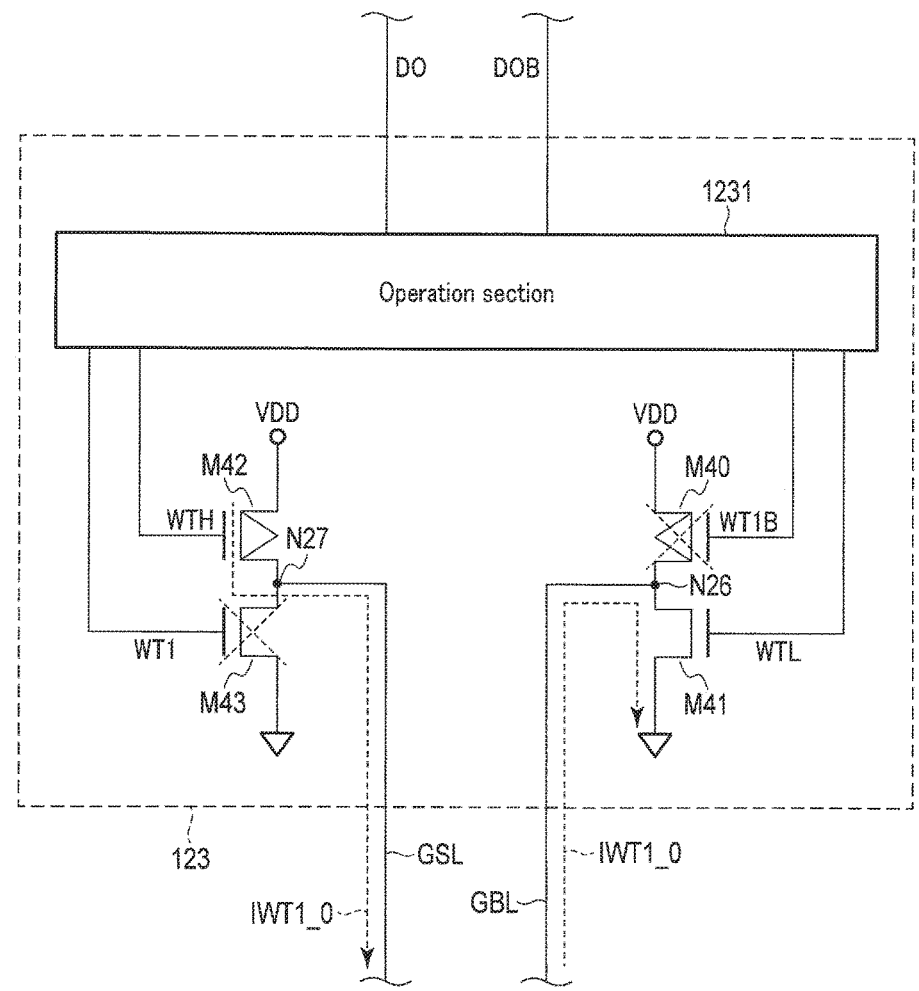
F I G. 26

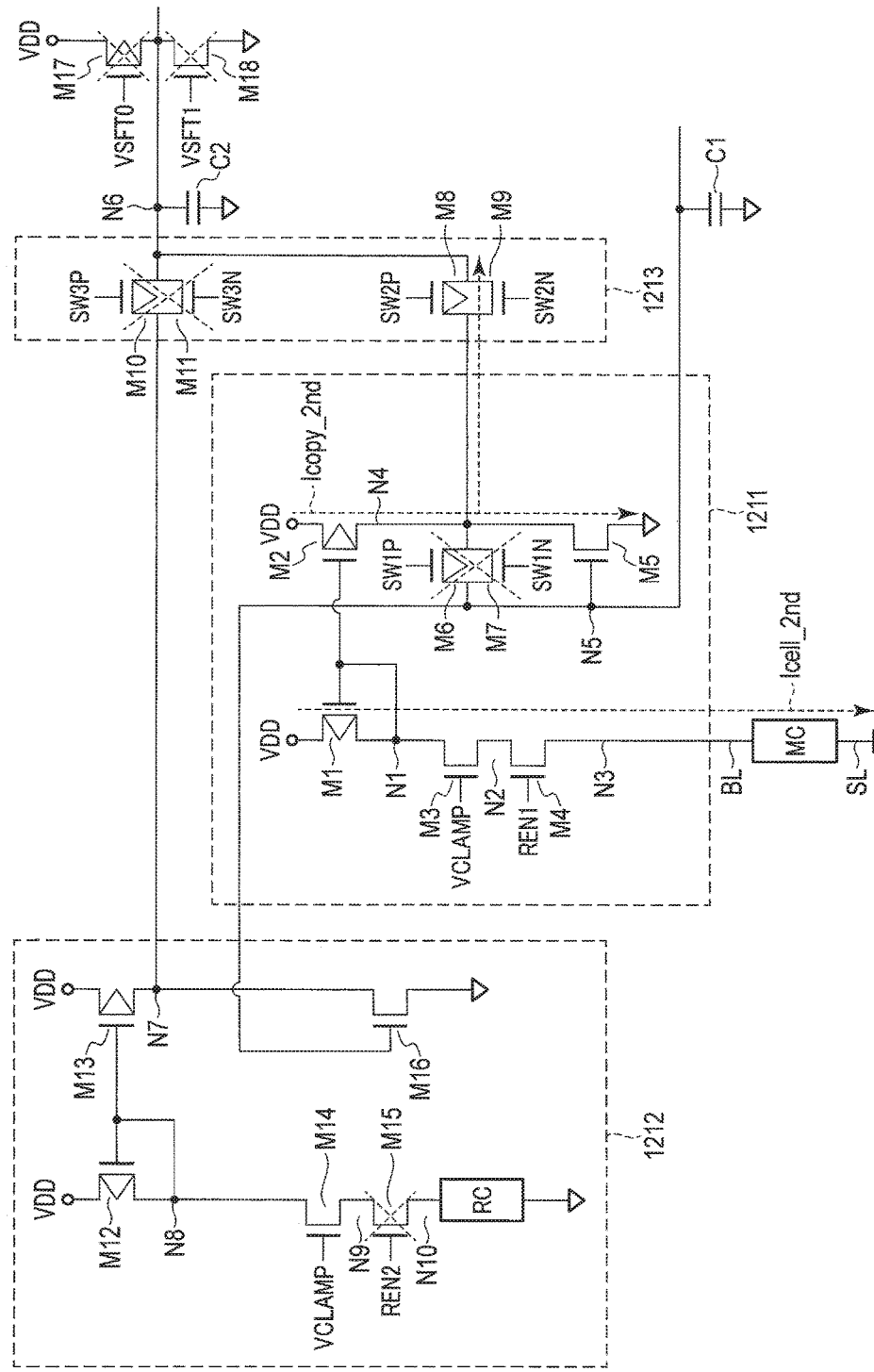
F I G. 27

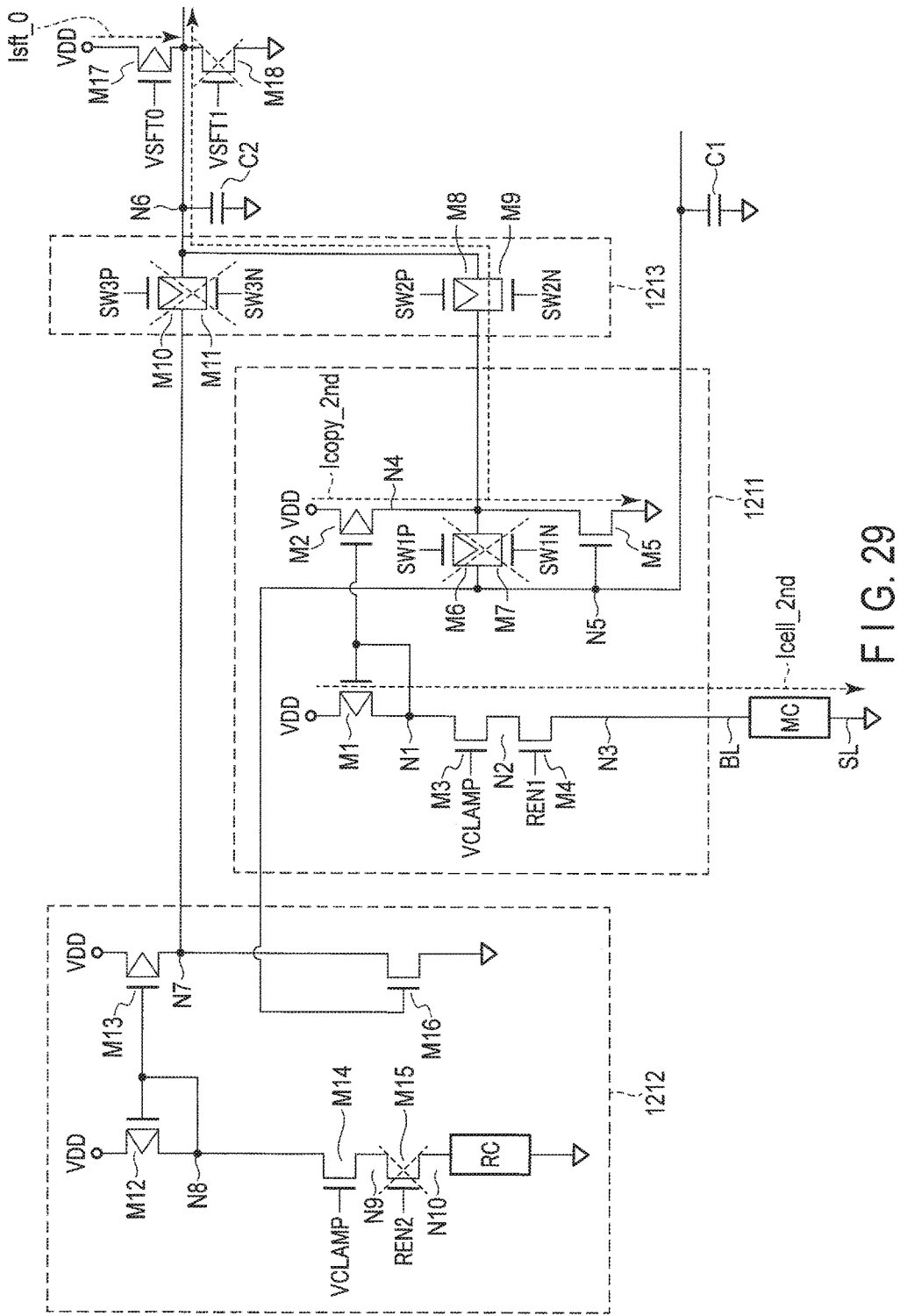
F I G. 29

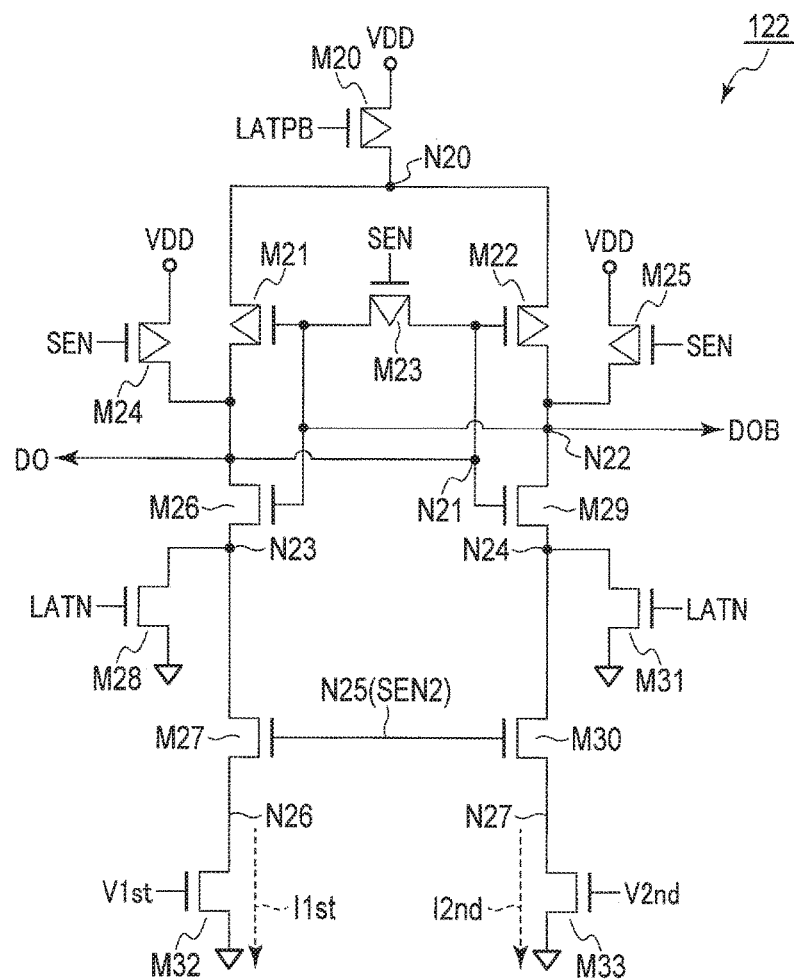
F I G. 32

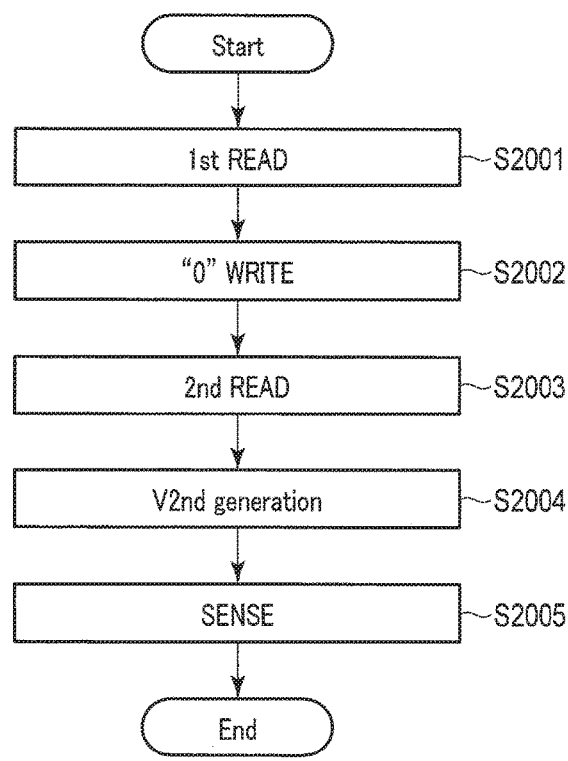
F I G. 33

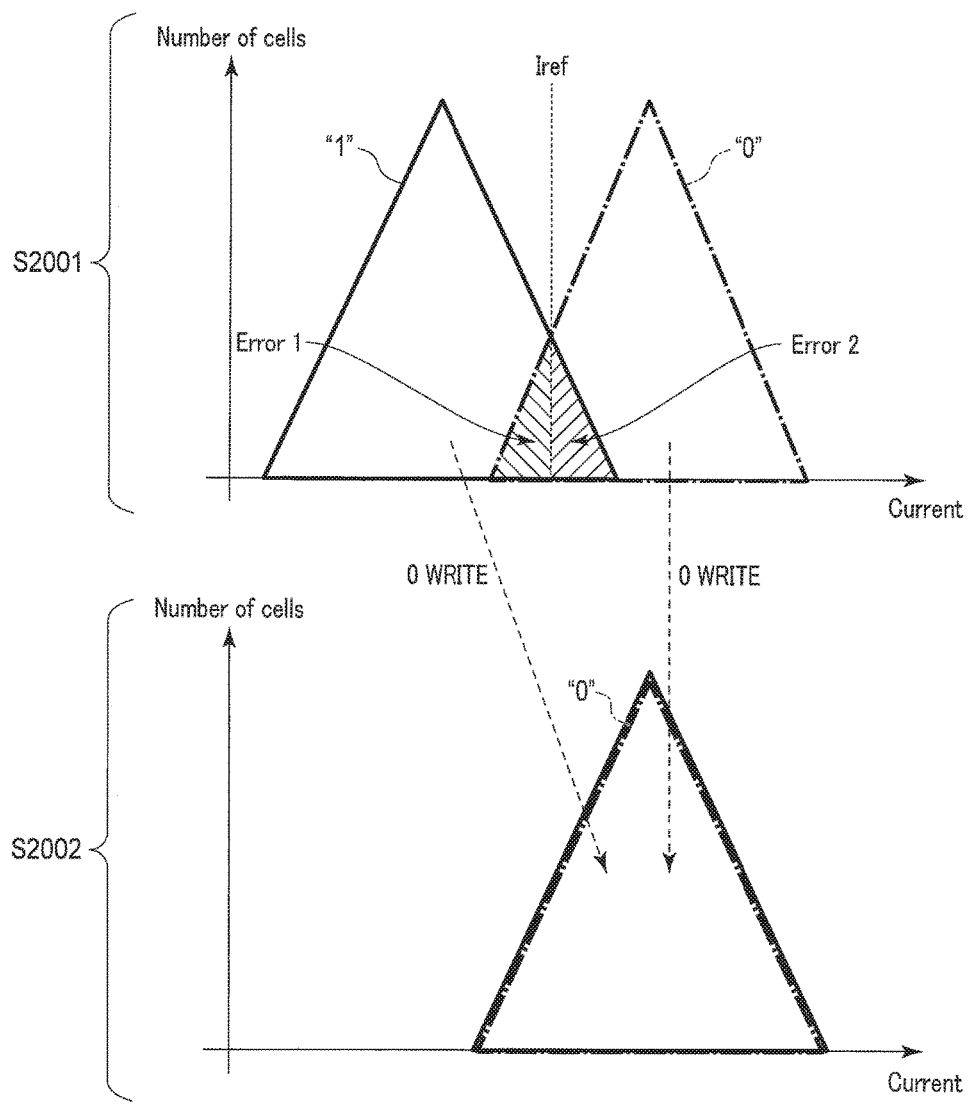
F I G. 34

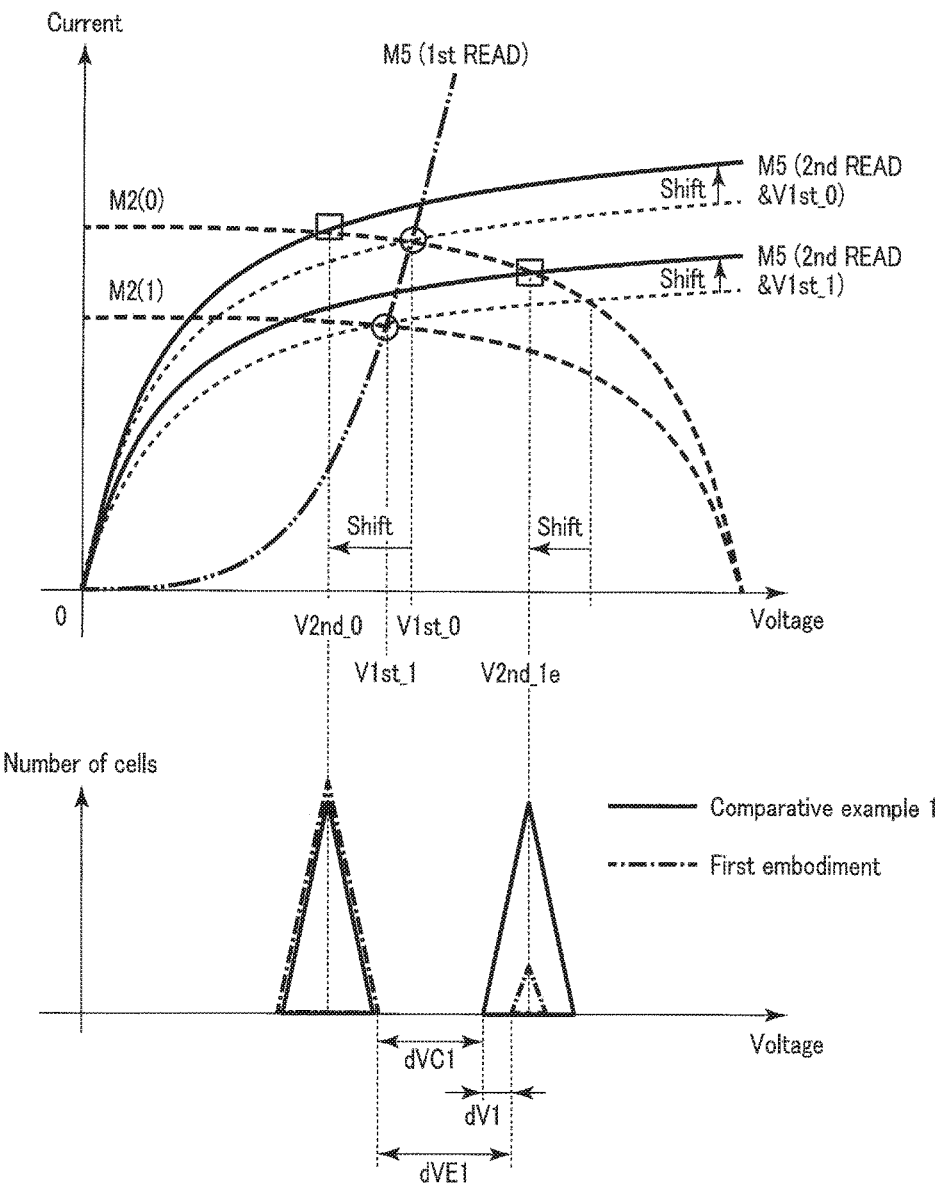
F I G. 35

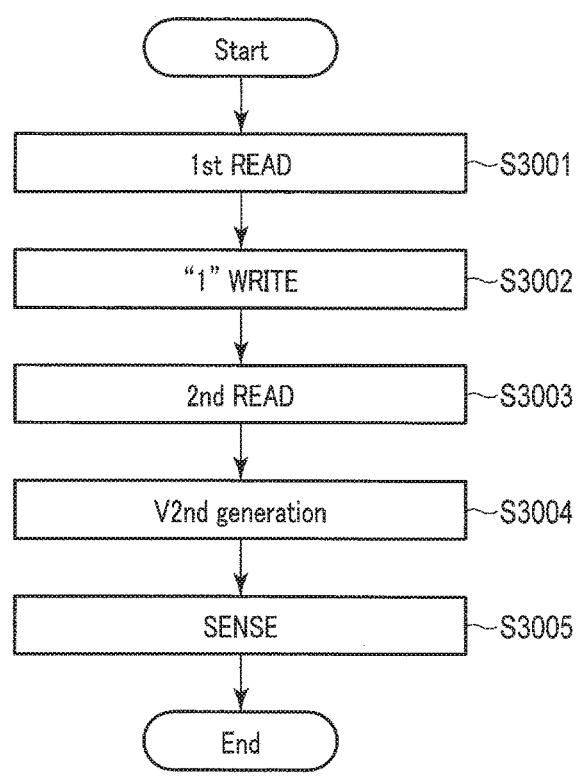
F I G. 36

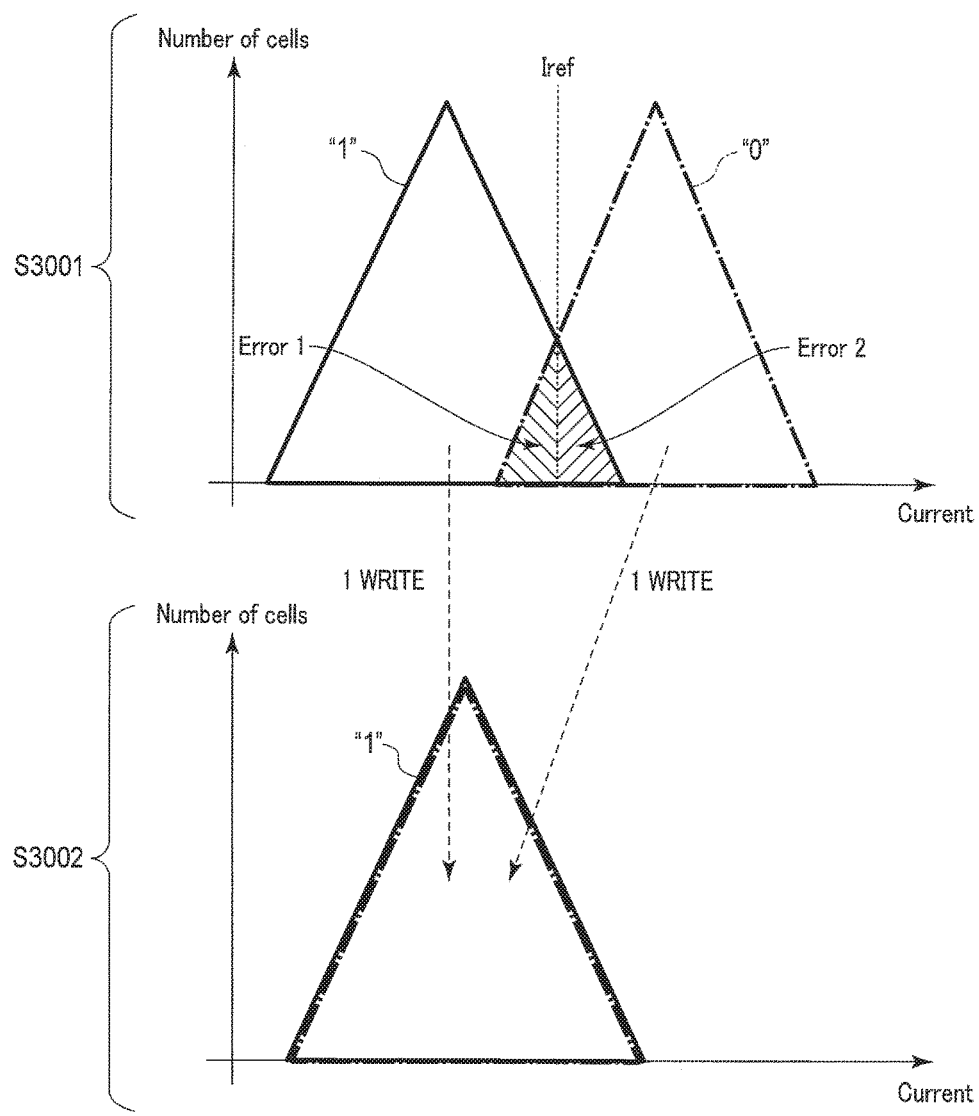
F I G. 37

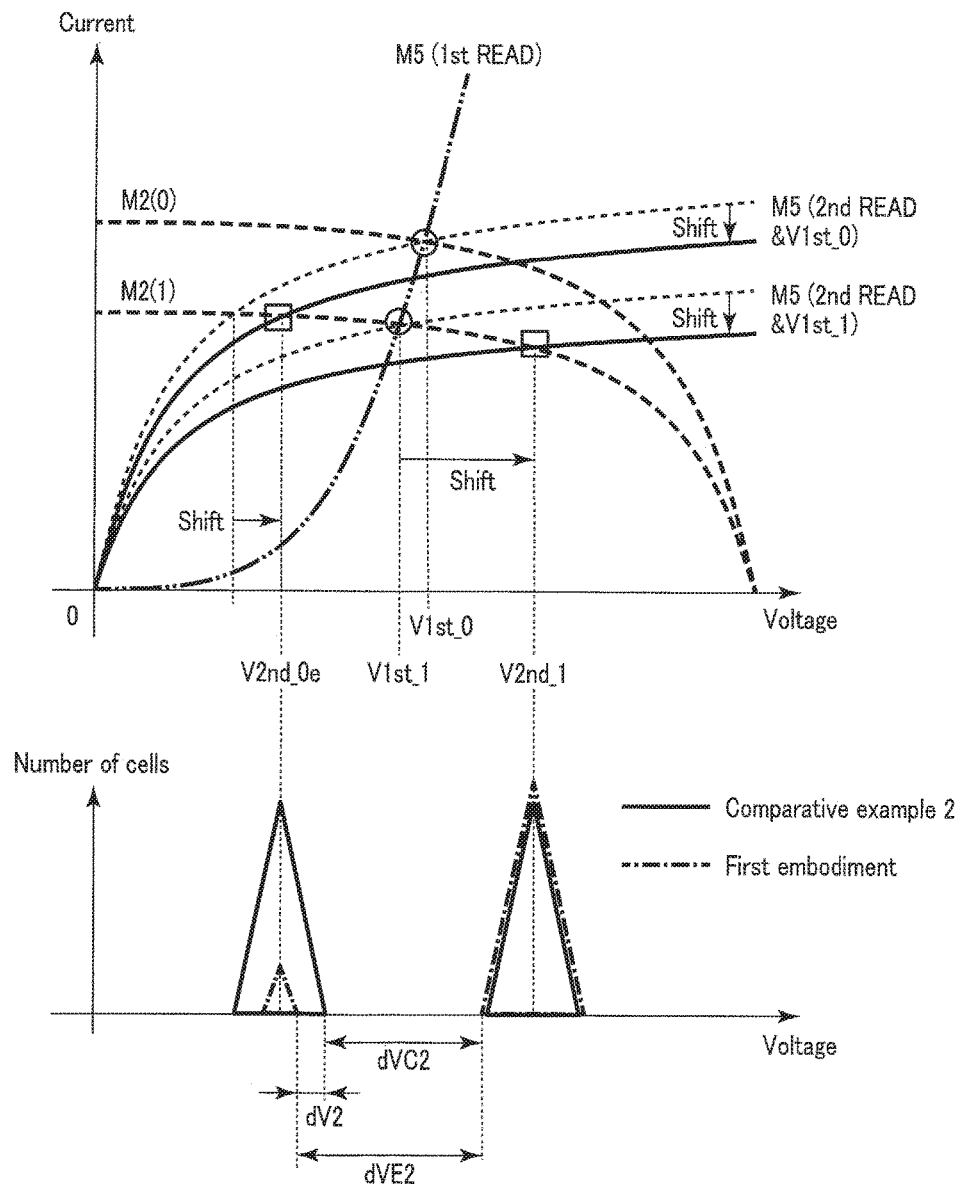
F I G. 38

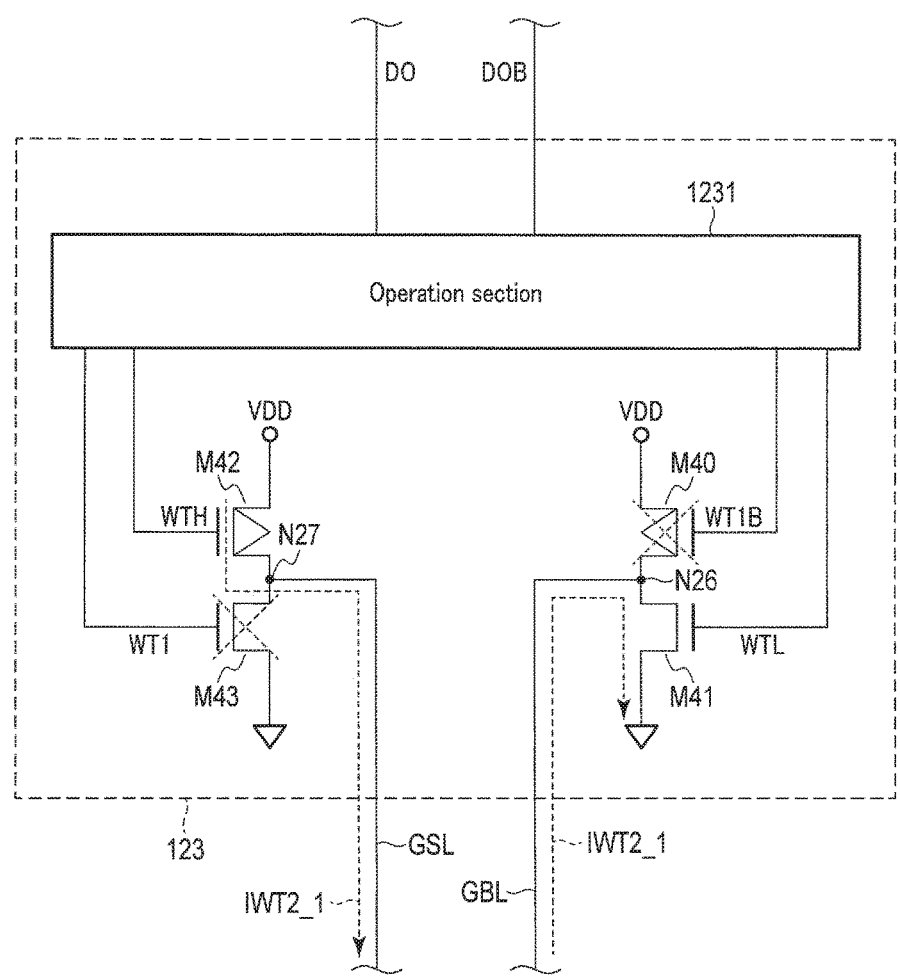
F I G. 40

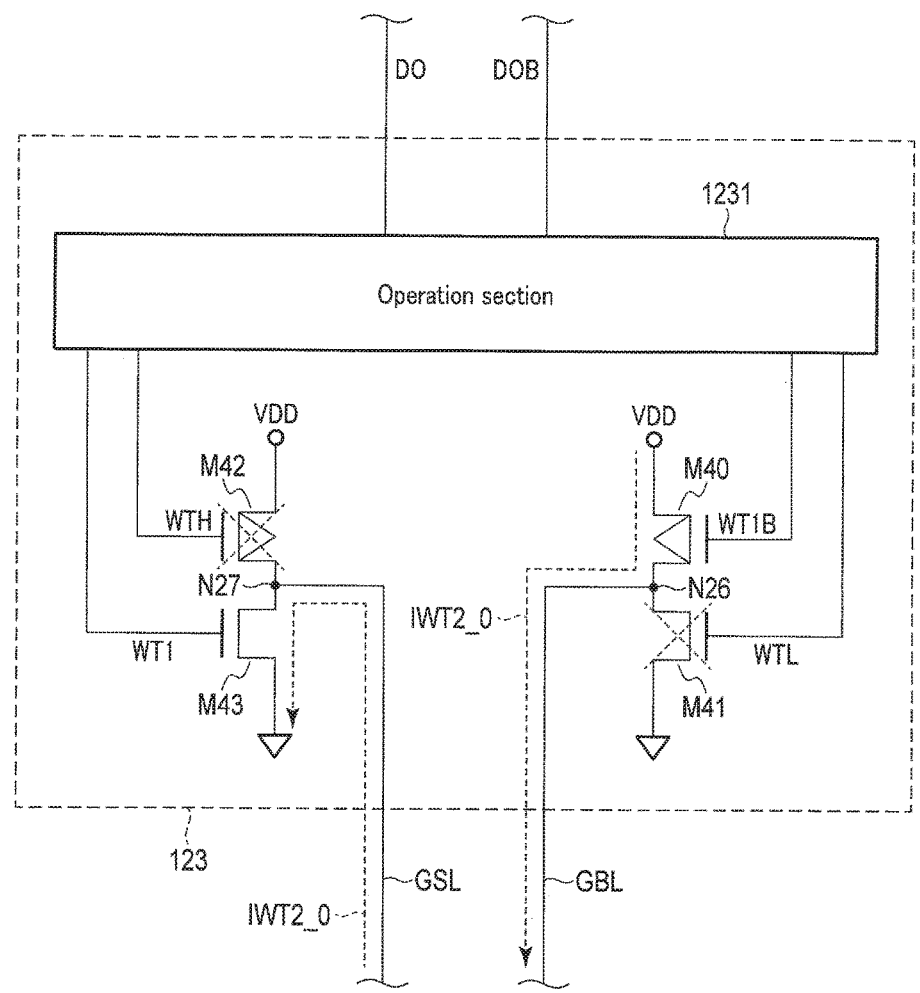
F I G. 41

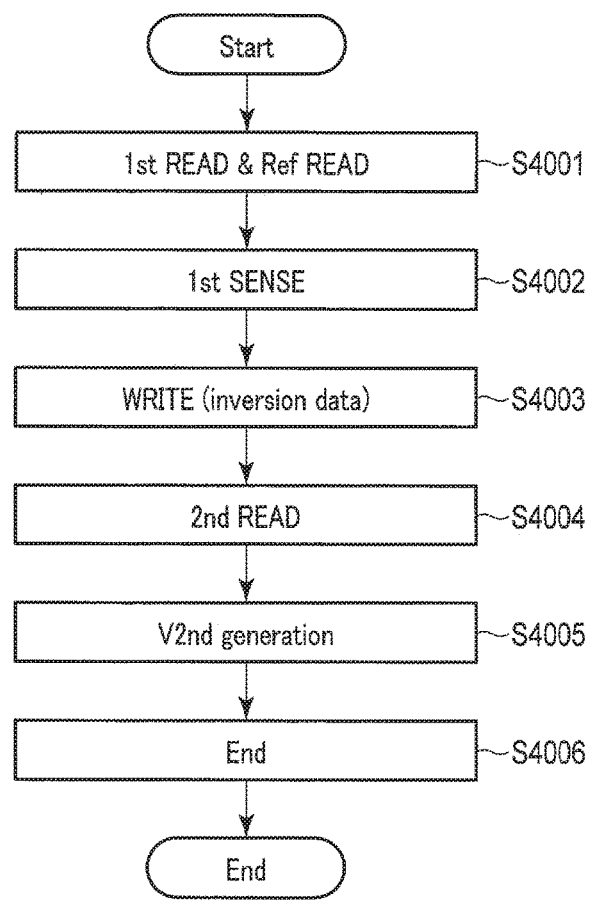
F I G. 42

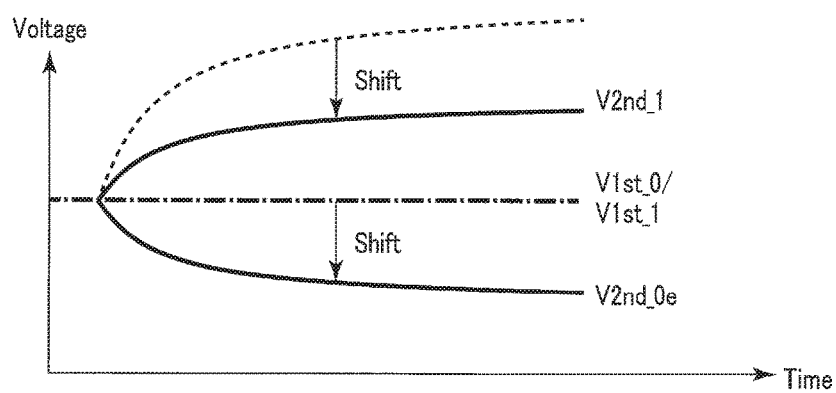
F I G. 46

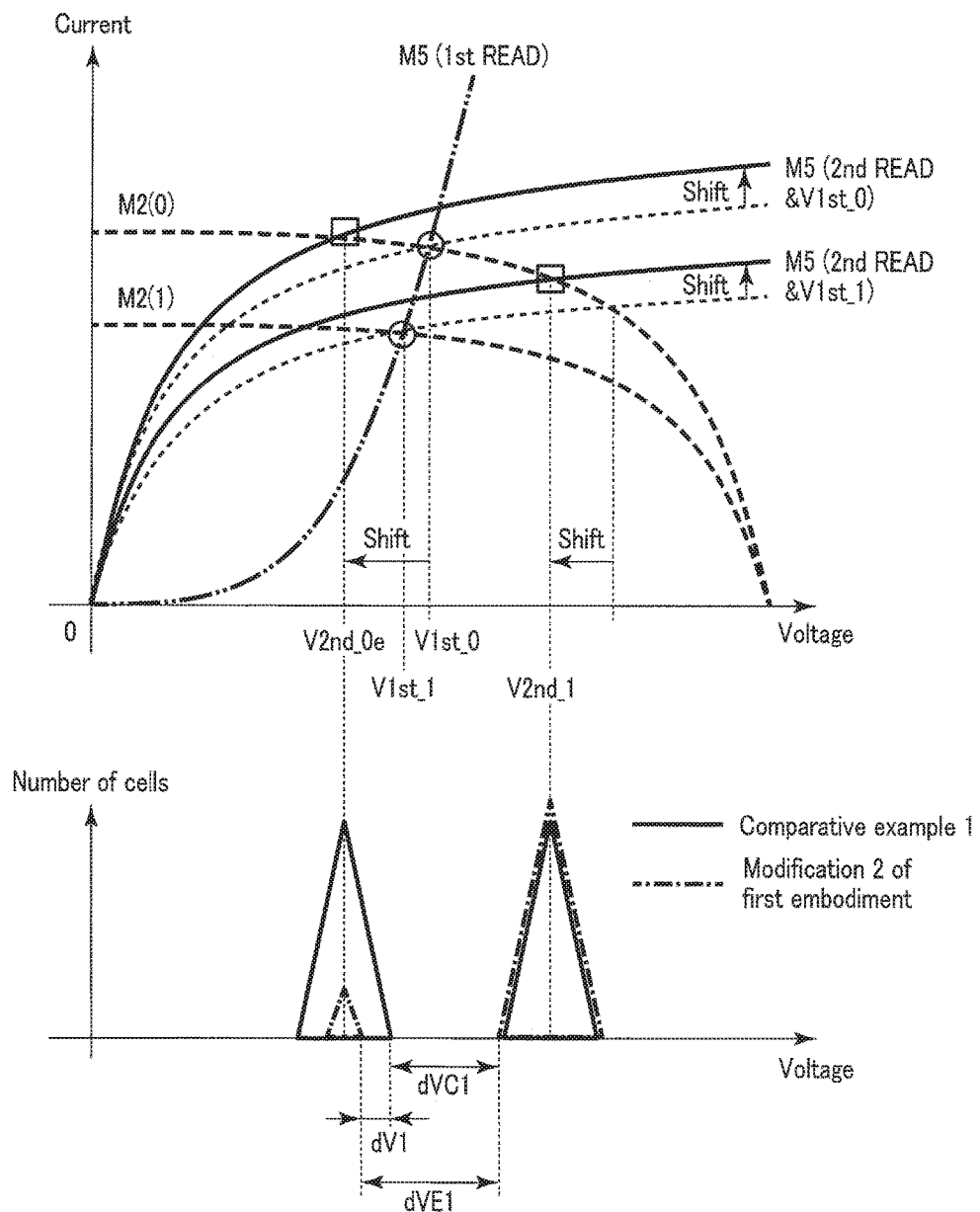
F I G. 47

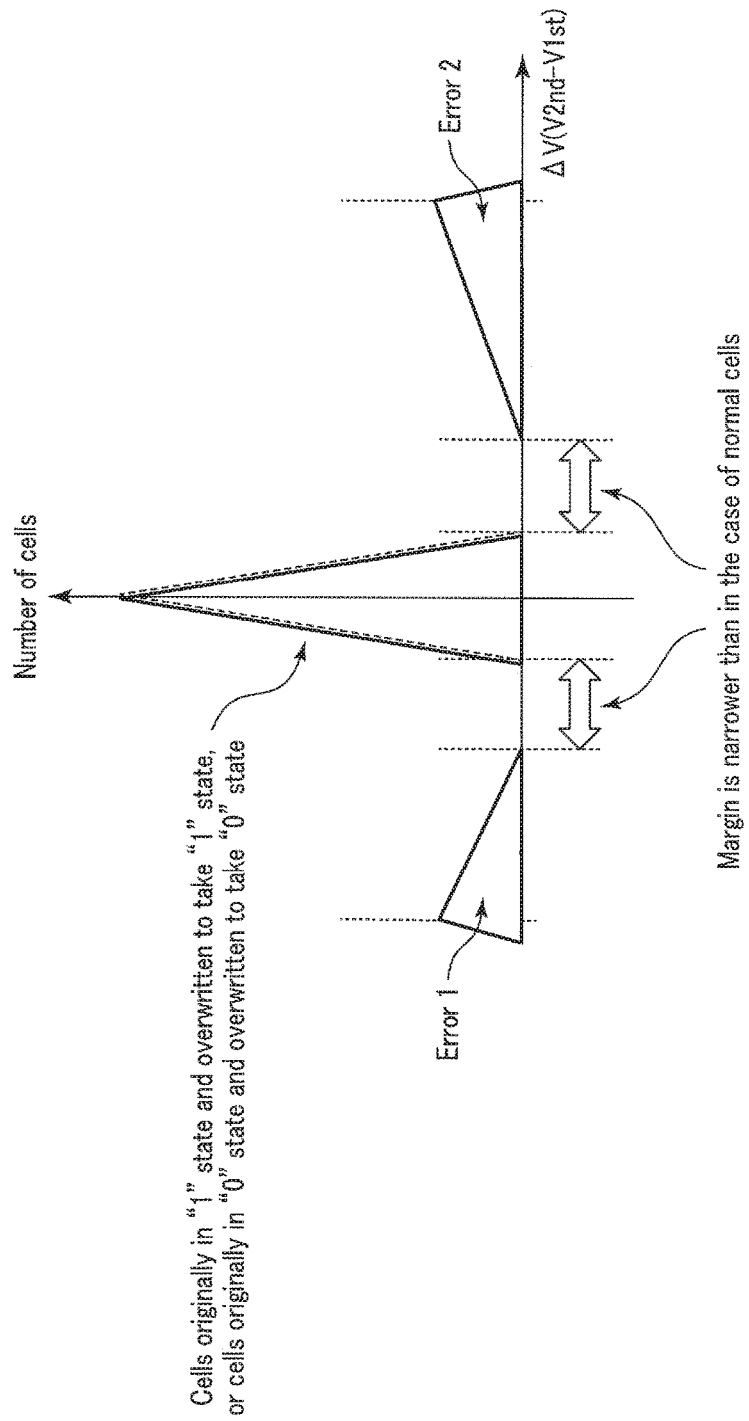
F I G. 52

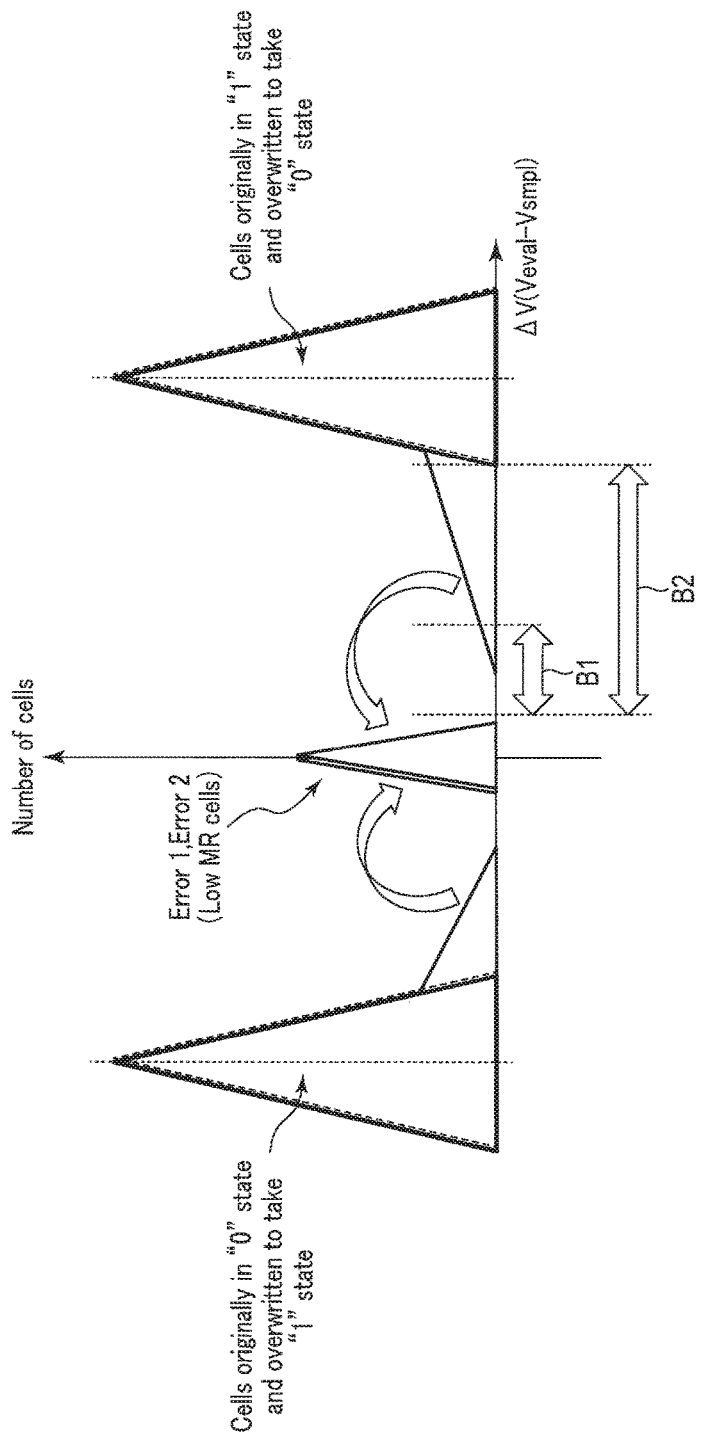
F I G. 53

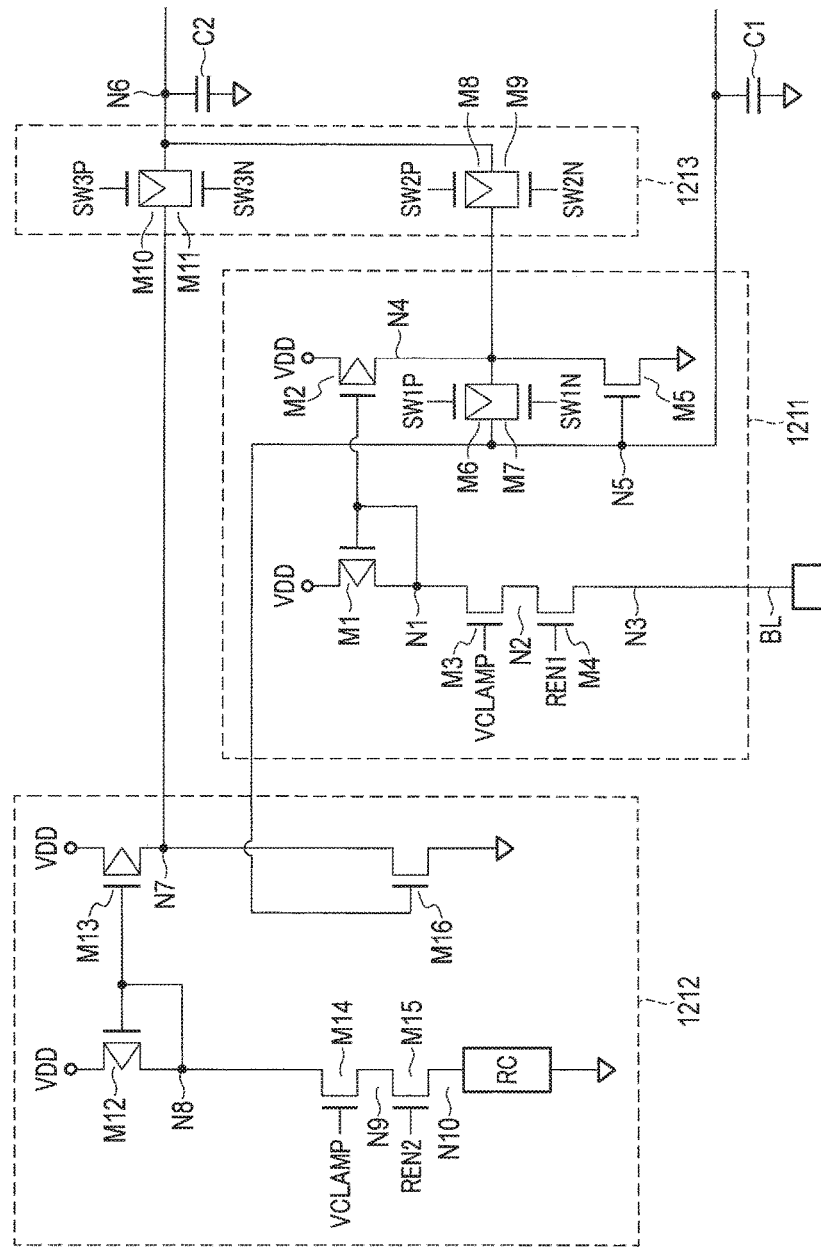
F I G. 54

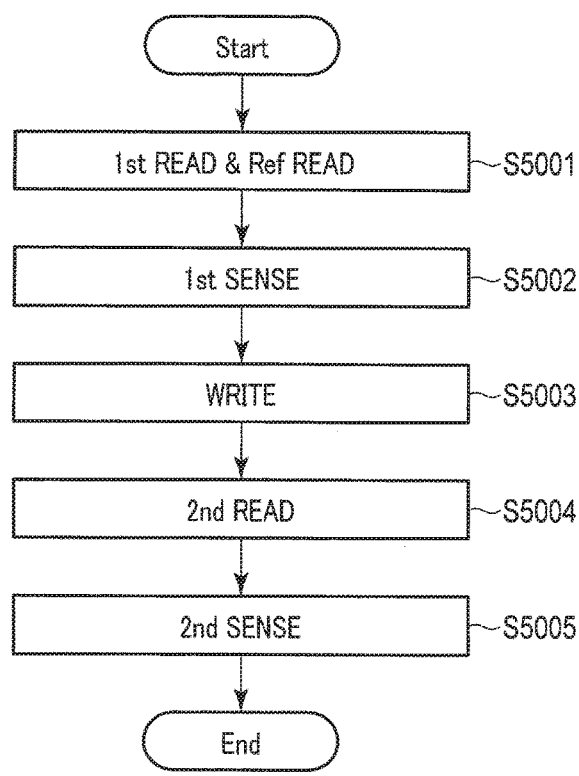
F I G. 56

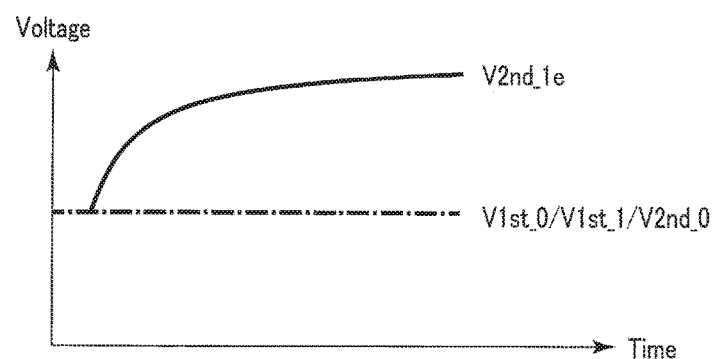
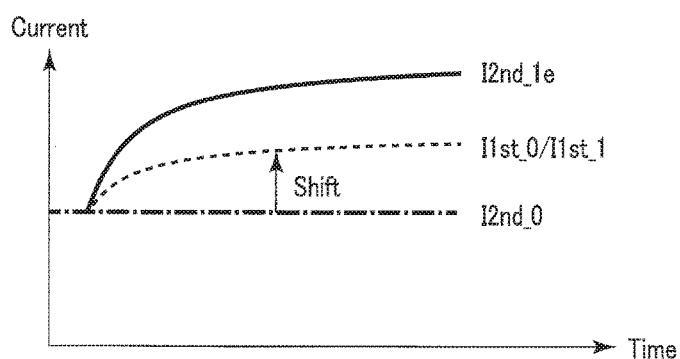
F I G. 57

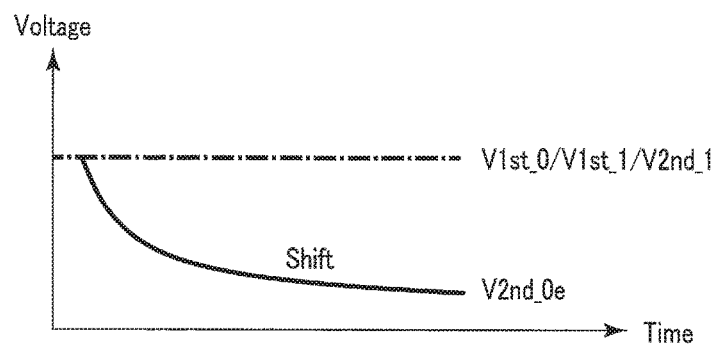
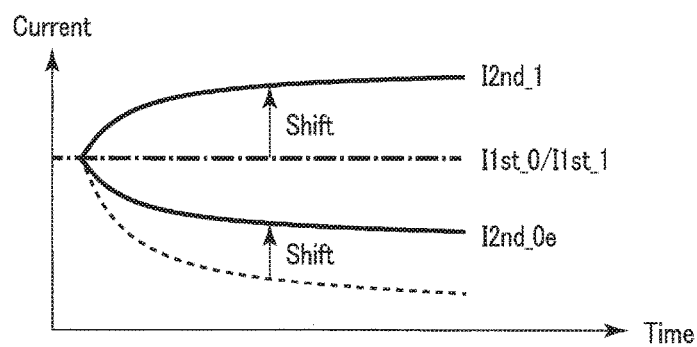
F I G. 58

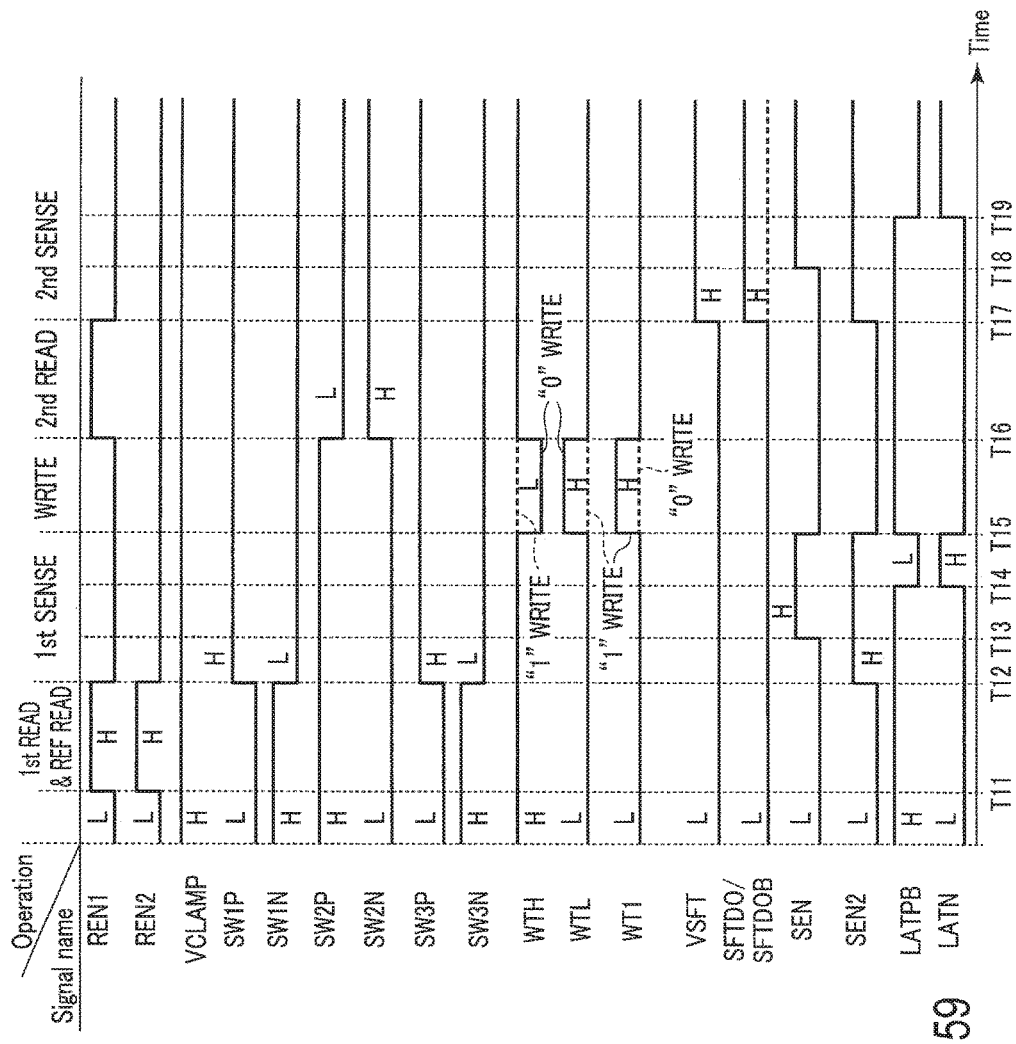
F I G. 59

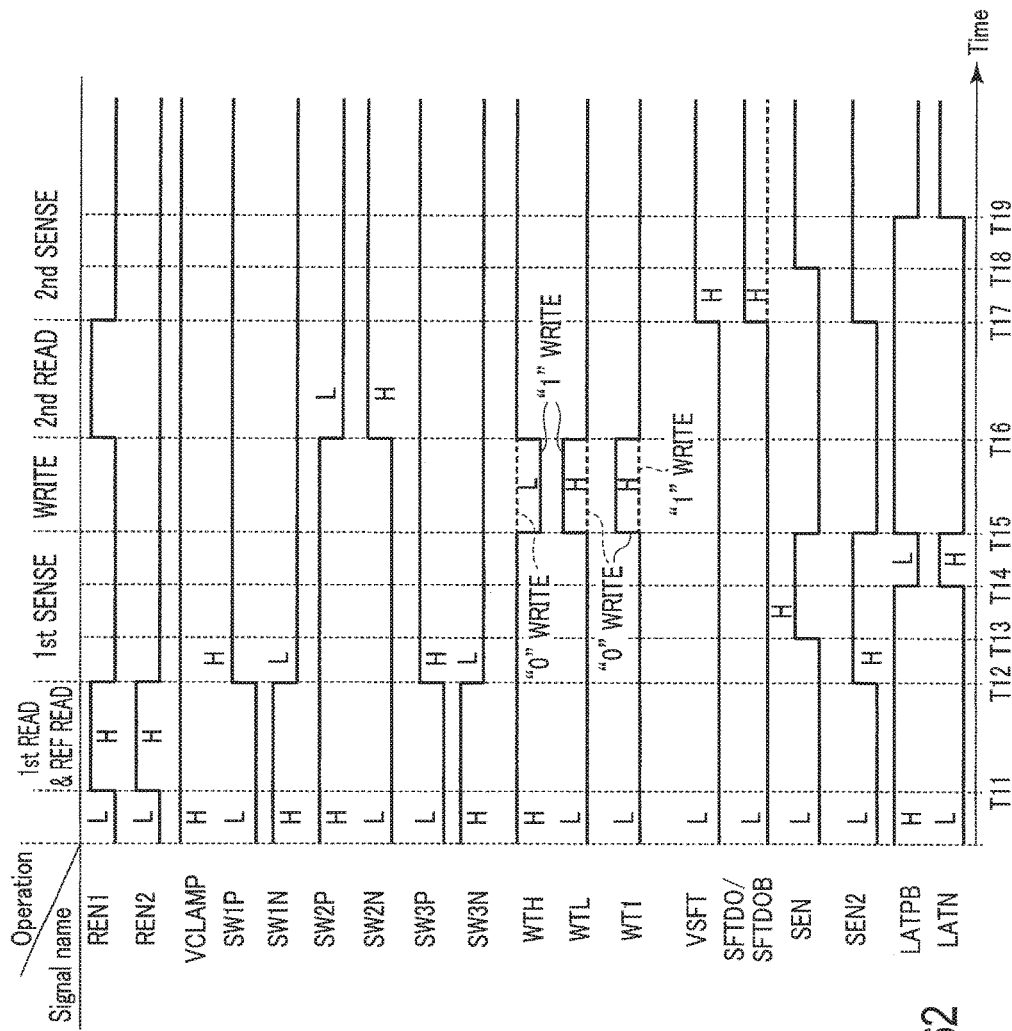
F I G. 62

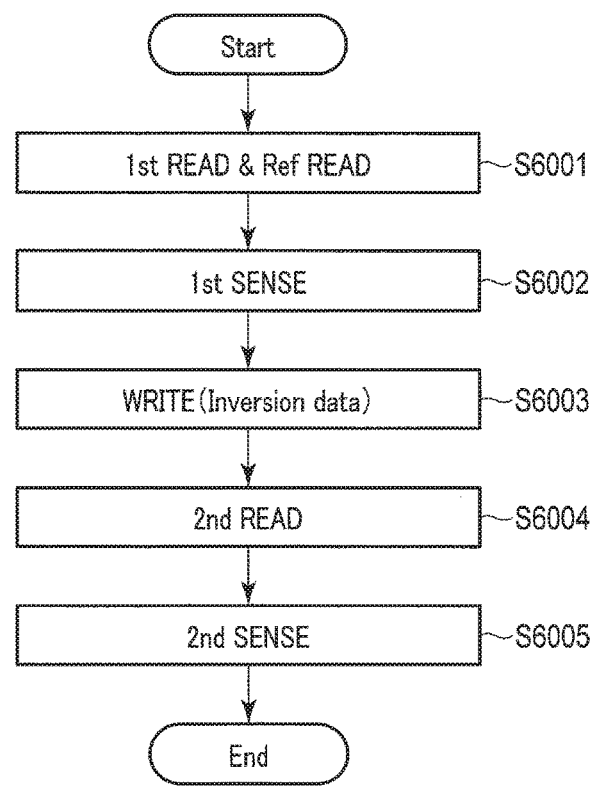
F I G. 63

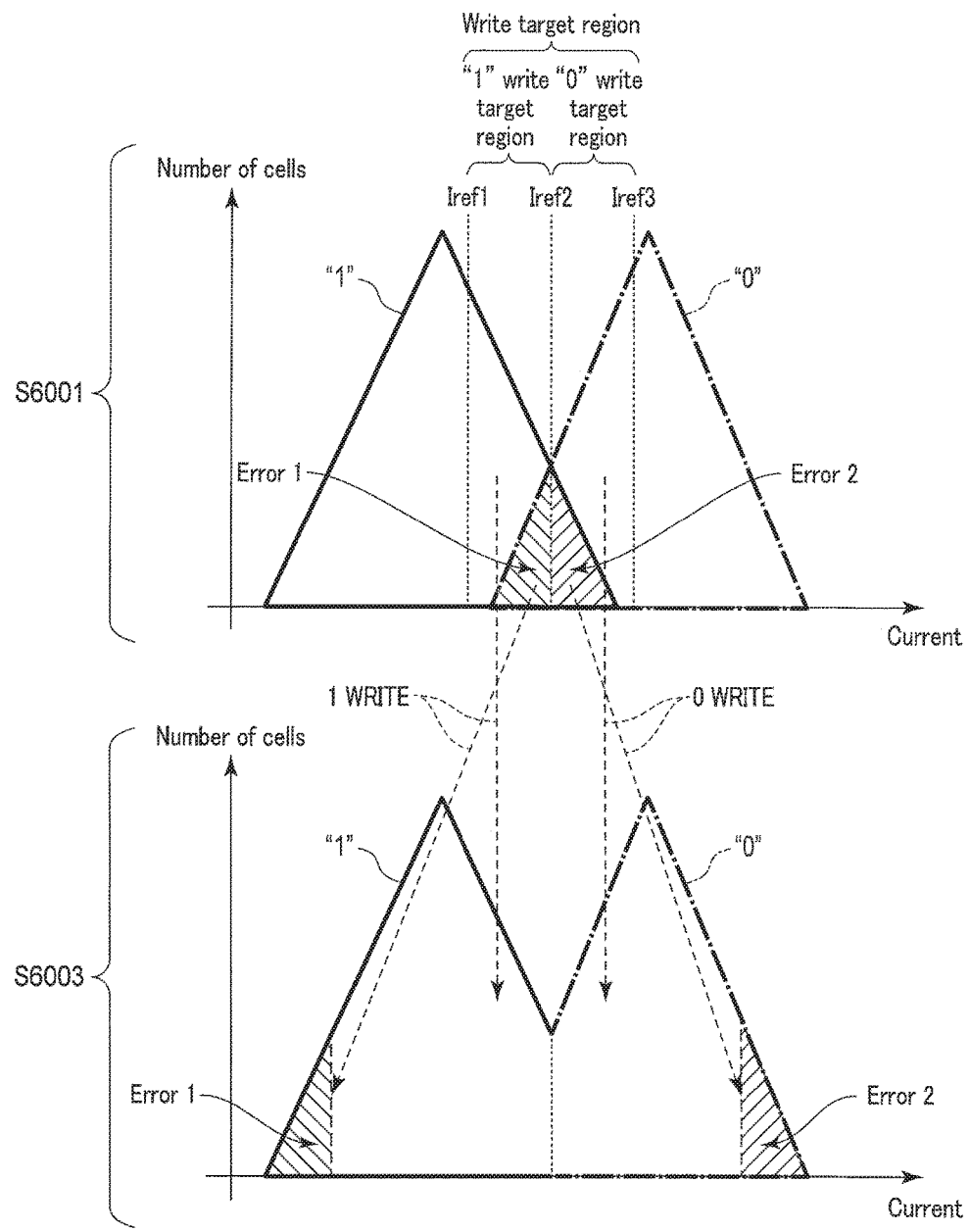
F I G. 64

|  | Iref1 (1st SA) | Iref2 (2nd SA) | Iref3 (3rd SA) | Write operation |
| --- | --- | --- | --- | --- |
| Case 1 | 1 | 1 | 1 | Skip |
| Case 2 | 0 | 1 | 1 | "1" write |
| Case 3 | 0 | 0 | 1 | "0" write |
| Case 4 | 0 | 0 | 0 | Skip |

F I G. 65

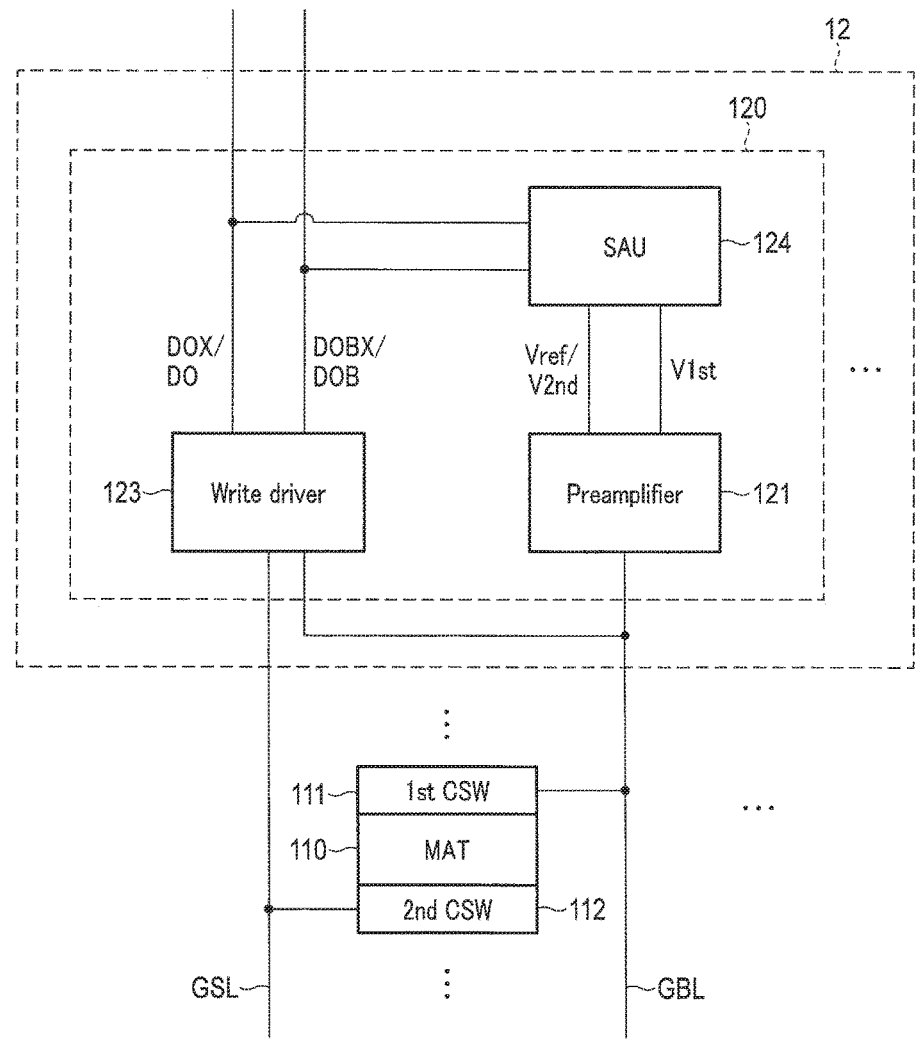
F I G. 66

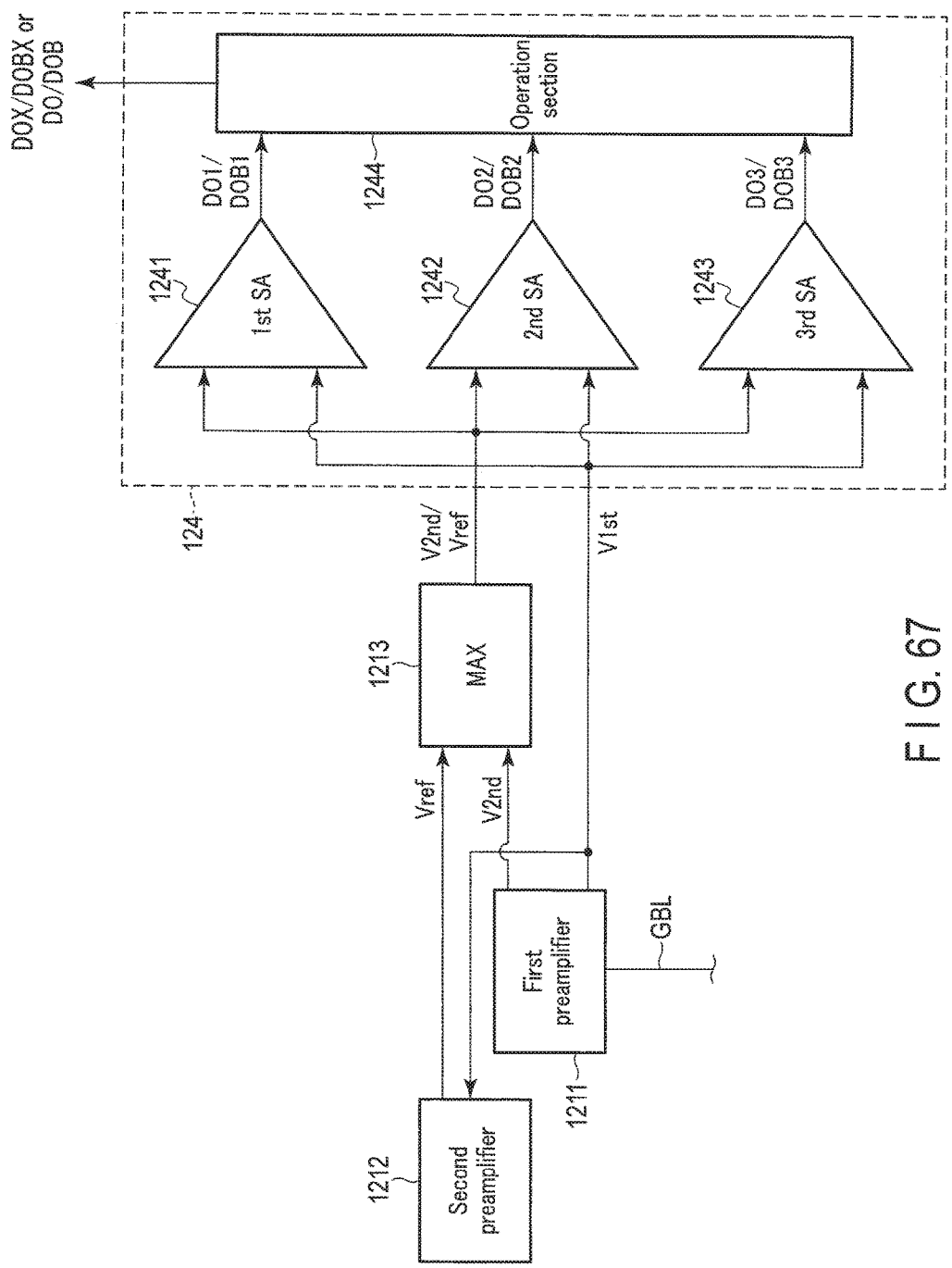
F I G. 67

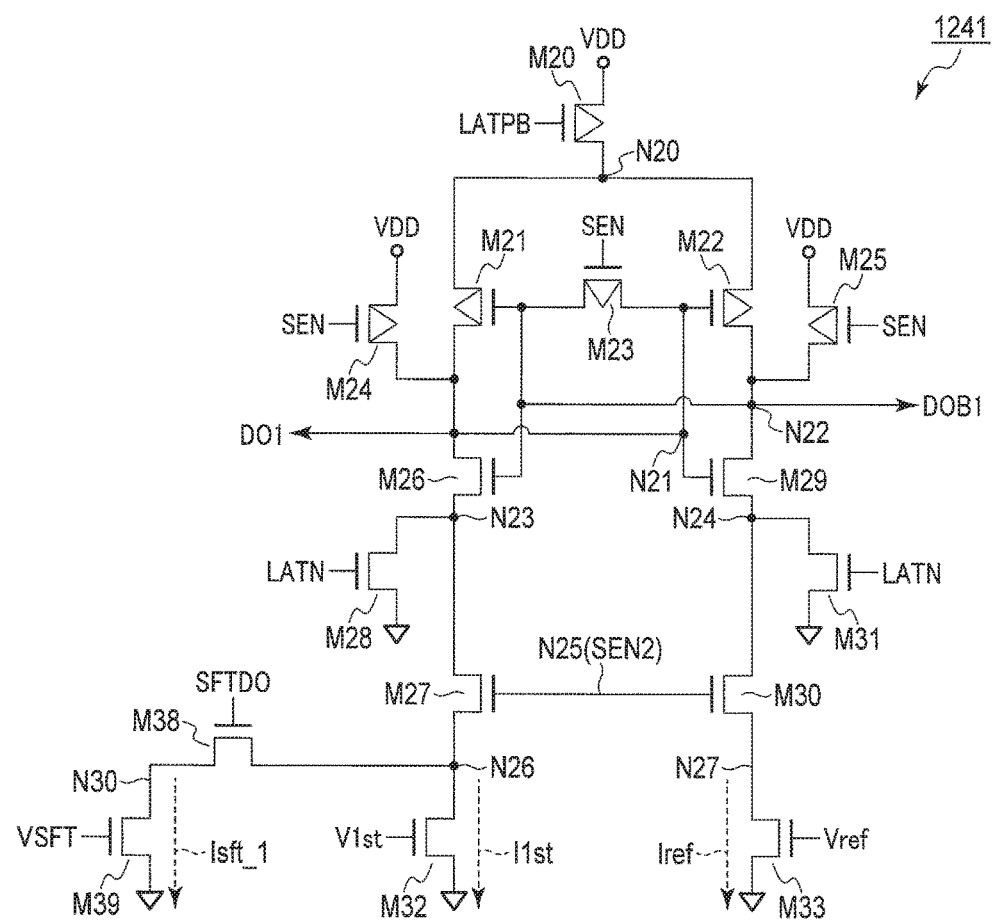
F I G. 68

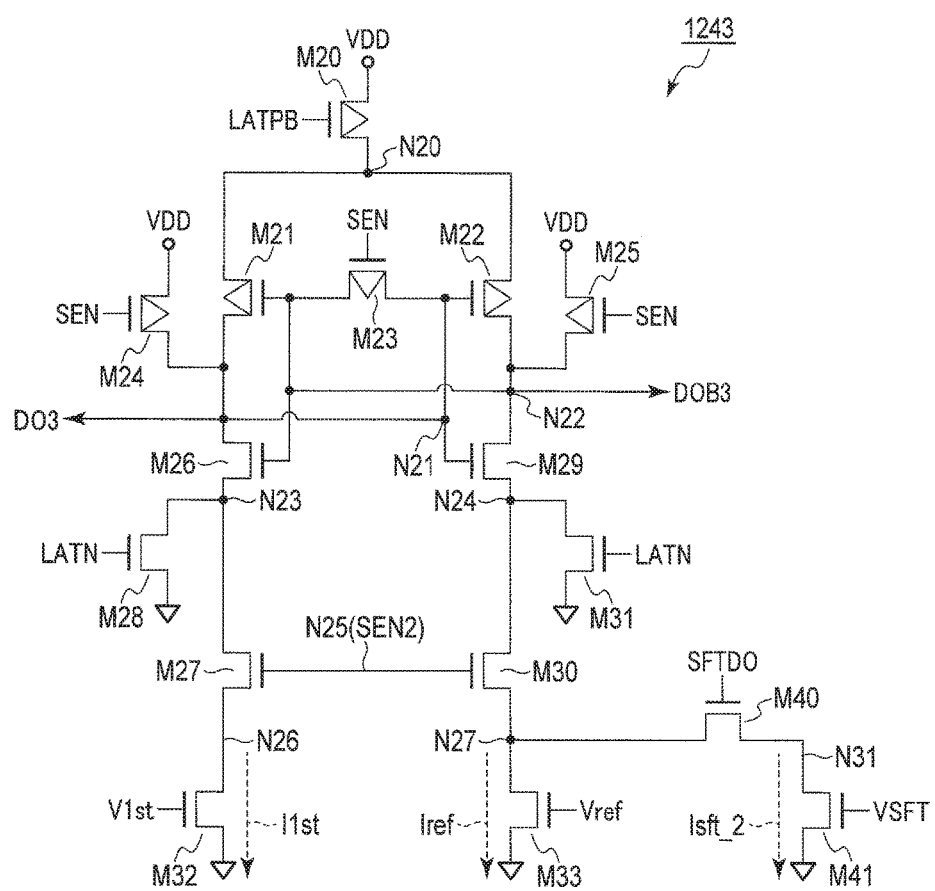
F I G. 69

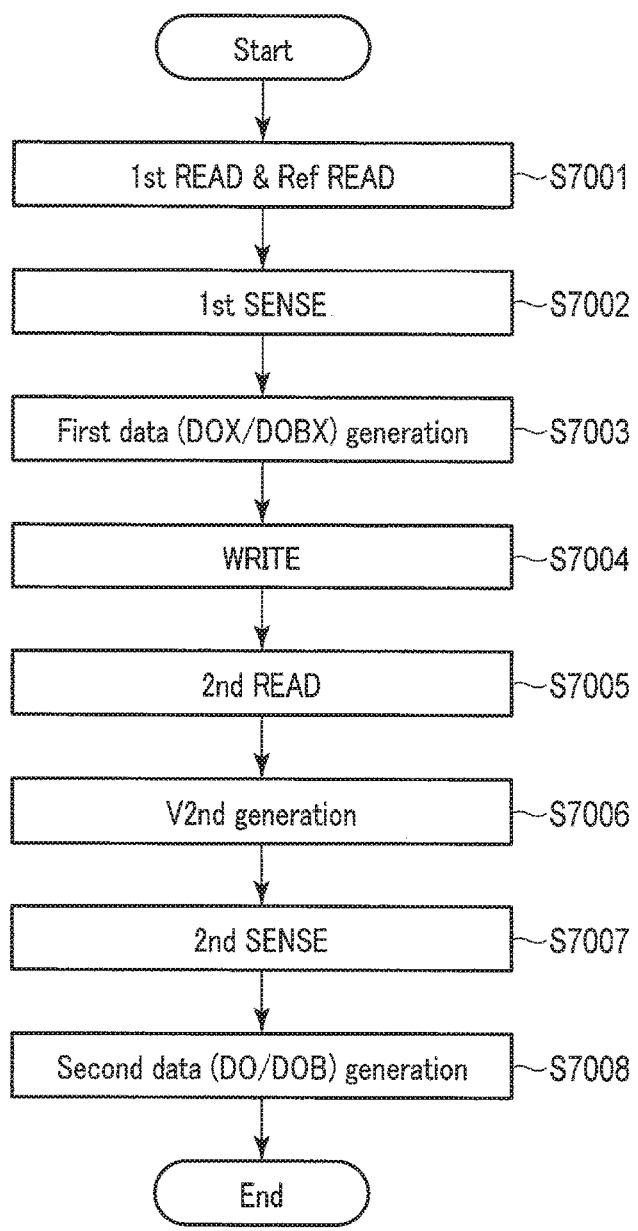
F I G. 70

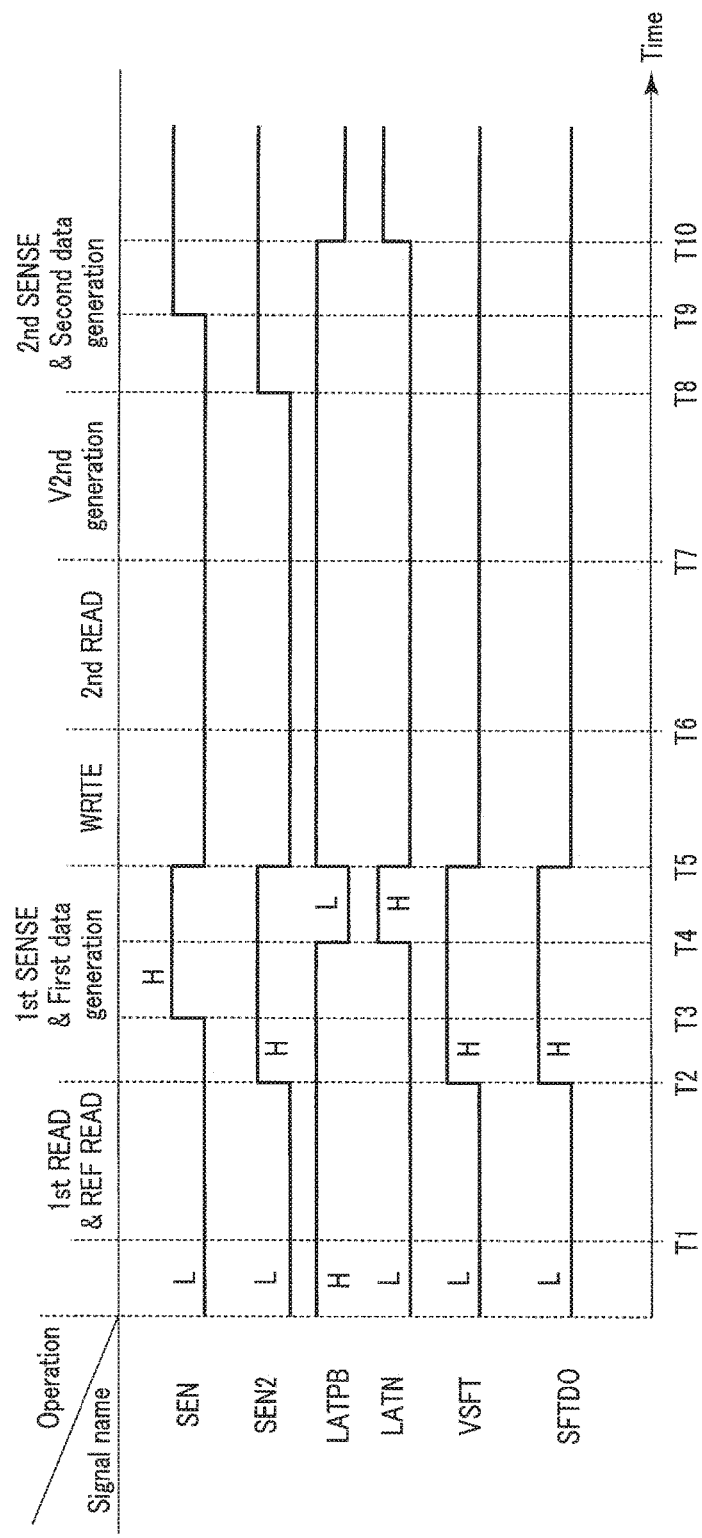
F I G. 71

MEMORY DEVICE

CROSS-REFERENCE TO RELATED APPLICATIONS

This application is based upon and claims the benefit of priority from prior Japanese Patent Application No. 2018-054416, filed Mar. 22, 2018; the entire contents of which are incorporated herein by reference.

FIELD

Embodiments relate to a memory device.

BACKGROUND

A magnetoresistive random access memory (MRAM) is a memory device employing, as a memory cell for storing information, a magnetic element having a magnetoresistive effect. The MRAM is receiving attention as a next-generation memory device characterized by its high-speed operation, large storage capacity, and non-volatility. Research and development is advancing to use the MRAM as a replacement for a volatile memory, such as a dynamic random access memory (DRAM) or a static random access memory (SRAM). In order to lower development costs and enable smooth replacement, it is desirable to operate the MRAM on the same specifications as the DRAM and SRAM.

BRIEF DESCRIPTION OF THE DRAWINGS

FIG. 3 is a block diagram showing the sense amplifier/write driver of the memory device according to the first embodiment.

FIG. 8 is a circuit diagram of the preamplifier of the memory device according to the first embodiment.

FIG. 10 is a circuit diagram of the write driver of the memory device according to the first embodiment.

FIG. 11 is a distribution map of cell currents of all memory cells included in the memory array.

FIG. 13 is a flowchart showing the read operation of the memory system according to the first embodiment.

FIG. 15 is a block diagram showing the read operation of the memory system according to the first embodiment.

FIG. 17 is a block diagram showing the read operation of the memory system according to the first embodiment.

FIG. 22 is a circuit diagram showing the operation of the preamplifier from time T1 to time T2.

FIG. 23 is a circuit diagram showing the operation of the preamplifier from time T2 to time T6.

FIG. 24 is a circuit diagram showing the operation of the preamplifier from time T2 to time T5.

FIG. 26 is a circuit diagram showing the operation of the write driver of the case where the memory cell has the configuration according to the first example, and data "0" is written.

FIG. 27 is a circuit diagram showing the operation of the preamplifier from time T6 to time T7.

FIG. 29 is a circuit diagram showing the operation of the preamplifier from time T7 to time T8.

FIG. 32 is a circuit diagram showing the operation of the sense amplifier after time T8.

FIG. 33 is a flowchart showing the read operation of the memory system according to Comparative Example 1 of the first embodiment.

FIG. 34 is a distribution map of cell currents of all memory cells included in the memory array.

FIG. 35 illustrates a graph showing operation characteristics of the preamplifier based on characteristics of the memory cell, and a graph showing the relationship between voltage V2nd and the number of memory cells.

FIG. 36 is a flowchart showing the read operation of the memory system according to Comparative Example 2 of the first embodiment.

FIG. 37 is a distribution map of cell currents of all memory cells included in the memory array.

FIG. 38 illustrates a graph showing operation characteristics of the preamplifier based on characteristics of the memory cell, and a graph showing the relationship between voltage V2nd and the number of memory cells.

FIG. 40 is a circuit diagram showing the operation of the write driver of the case where the memory cell has the configuration according to the second example, and data "1" is written.

FIG. 41 is a circuit diagram showing the operation of the write driver of the case where the memory cell has the configuration according to the second example, and data "0" is written.

FIG. 42 is a flowchart showing the read operation of the memory system according to Modification 2 of the first embodiment.

FIG. 46 is a diagram showing the relationship between voltage V1st and voltage V2nd.

FIG. 47 illustrates a graph showing operation characteristics of the preamplifier based on characteristics of the memory cell, and a graph showing the relationship between voltage V2nd and the number of memory cells.

FIG. 52 is a diagram showing the relationship between (voltage V2nd-voltage V1st) and the number of cells.

FIG. 53 is a diagram showing the relationship between (voltage V2nd-voltage V1st) and the number of cells.

FIG. 54 is a circuit diagram of the preamplifier of the memory device according to the second embodiment.

FIG. 56 is a flowchart showing the read operation of the memory system according to the second embodiment.

FIG. 57 illustrates a diagram showing the relationship between voltage V1st and voltage V2nd, and a diagram showing the relationship between current I1st and current I2nd.

FIG. 58 illustrates a diagram showing the relationship between voltage V1st and voltage V2nd, and a diagram showing the relationship between current I1st and current I2nd.

FIG. 59 is a timing chart showing the read operation of the memory system according to the second embodiment.

FIG. 62 is a flowchart showing the read operation of the memory system according to Modification 1 of the second embodiment.

FIG. 63 is a flowchart showing the read operation of the memory system according to Modification 2 of the second embodiment.

FIG. 64 is a distribution map of cell currents of all memory cells included in the memory array.

FIG. 65 is a diagram showing the relationship between the reference currents and the write operations.

FIG. 66 is a block diagram showing the sense amplifier/write driver of the memory device according to the third embodiment.

FIG. 67 is a block diagram showing the sense amplifier unit of the memory device according to the third embodiment.

FIG. 68 is a circuit diagram of the first sense amplifier of the memory device according to the third embodiment.

FIG. 69 is a circuit diagram of the third sense amplifier of the memory device according to the third embodiment.

FIG. 70 is a flowchart showing the read operation of the memory system according to the third embodiment.

FIG. 71 is a timing chart showing the senses in the read operation of the memory system according to the third embodiment.

DETAILED DESCRIPTION

In general, according to one embodiment, a memory device, includes a memory cell; and a first circuit that performs a first read on the memory cell to generate a first voltage, performs a reference read on the memory cell to generate a second voltage, generates first data based on the first voltage and the second voltage, writes the first data in the memory cell on which the first read has been performed, performs a second read on the memory cell in which the first data has been written to generate a third voltage, and determines data that was stored in the memory cell when the first read was performed, based on the first voltage and the third voltage.

Hereinafter, embodiments will be described with reference to the drawings. In the following description, structural elements having approximately the same function and configuration will be assigned the same reference symbol, and a repetitive description will be given only where necessary. Each of the embodiments described below merely indicates an exemplary apparatus or method for embodying the technical idea of the embodiment. The structural elements' materials, shapes, structures, arrangements, etc. of the technical ideas of the embodiments are not limited to the ones described below. The technical ideals of the embodiments may be varied within the range of the claims.

Each of the function blocks can be implemented in the form of hardware, computer software, or a combination thereof. In order to clarify that each block may be any of them, the block will be described below in general in terms of their functions. Whether the functions are implemented as hardware or software depends on specific embodiments or design restrictions imposed on the entire system. Those skilled in the art can implement the functions in various ways for respective specific embodiments, and how to implement the functions is within the range of the present invention.

Described in each embodiment below is the case where an MRAM is applied to the memory array.

<1> First Embodiment

<1-1> Configuration

<1-1-1> Configuration of Memory System

Figure 1:
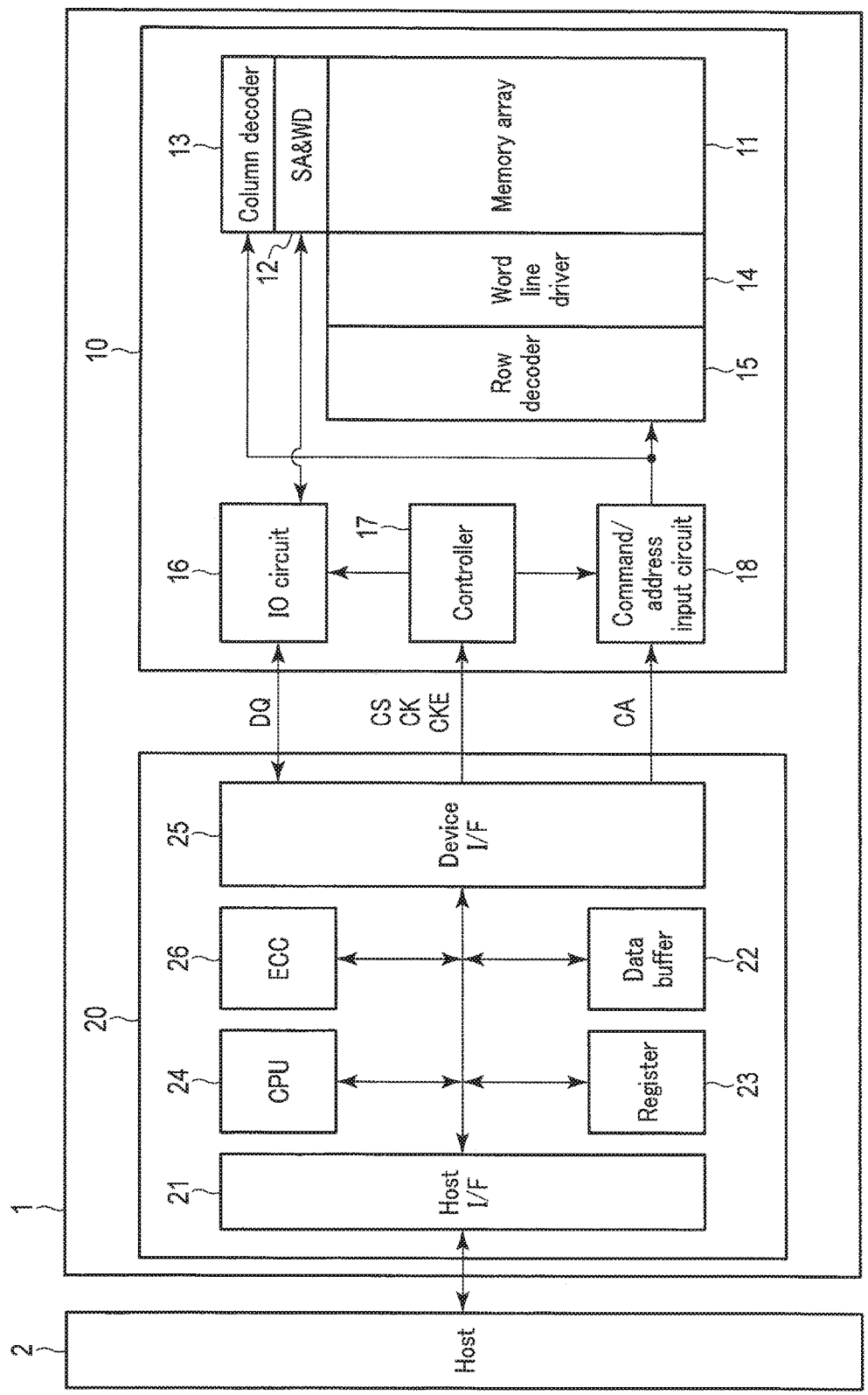
FIG. 1 is a block diagram showing a basic configuration of the memory system according to the first embodiment.

A basic configuration of a memory system 1 according to the first embodiment will be schematically described with reference to FIG. 1. FIG. 1 is a block diagram showing a basic configuration of the memory system according to the first embodiment.

The memory system 1 includes a memory device 10 and a memory controller 20.

<1-1-2> Configuration of Memory Controller

Upon receipt of a command from a host (external device) 2, such as a personal computer, the memory controller 20 reads data from the memory device 10 or writes data in the memory device 10.

The memory controller 20 includes a host interface (I/F) 21, a data buffer 22, a register 23, a central processing unit (CPU) 24, a device interface (I/F) 25, and an error correcting code (ECC) circuit 26.

The host interface 21 is coupled to the host 2. Data transmission and reception or the like is performed between the host 2 and the memory system 1 via the host interface 21.

The data buffer 22 is coupled to the host interface 21. The data buffer 22 receives data transmitted from the host 2 to the memory system 1 via the host interface 21, and temporarily stores the data. The data buffer 22 also temporarily stores data to be transmitted from the memory system 1 to the host 2 via the host interface 21. The data buffer 22 may be either a volatile memory or a nonvolatile memory.

The register 23 is, for example, a volatile memory, and stores information on setting executed by the CPU 24, commands, and statuses, etc. The register 23 may be either a volatile memory or a nonvolatile memory.

The CPU 24 controls the overall operation of the memory system 1. The CPU 24 performs predetermined processing for the memory device 10 in accordance with a command received from the host 2, for example.

The device interface 25 performs transmission and reception of various signals or the like between the memory controller 20 and the memory device 10.

The ECC circuit 26 receives, via the data buffer 22, write data received from the host 2. The ECC circuit 26 adds an error correcting code to the write data. The ECC circuit 26 supplies the write data, to which the error correcting code has been added, to, for example, the data buffer 22 or the device interface 25.

The ECC circuit 26 also receives data supplied from the memory device 10 via the device interface 25. The data is data that is stored in a memory cell of the memory array 11. The ECC circuit 26 determines whether or not the data received from the memory device 10 contains an error. When the ECC circuit 26 determines that the received data contains an error, the ECC circuit 26 performs error correction processing on the received data by using the error correcting code. Then, the ECC circuit 26 supplies the error-corrected data to the data buffer 22, the device interface 25, etc.

<1-1-3> Configuration of Memory Device

The memory device 10 according to the first embodiment includes a memory array 11, a sense amplifier/write driver (SA&WD) 12, a column decoder 13, a word line driver 14, a row decoder 15, an input-output (IO) circuit 16, a controller 17, and a command address input circuit 18.

The command address input circuit 18 receives various external control signals, such as a chip select signal CS, a clock signal CK, a clock enable signal CKE, and a command address signal CA, from the memory controller 20. The command address input circuit 18 transfers the command address signal CA to the controller 17.

The controller 17 distinguishes between a command and an address. The controller 17 controls the memory device 10.

The memory array 11 is an MRAM and includes a two-dimensional matrix of a plurality of memory cells MC. Each memory cell MC includes a magnetic tunnel junction (MTJ) element 30 (not shown) and a selection transistor 31 (not shown). The MTJ element 30 is a magnetic tunnel junction element that stores data by a change in the resistance state and allows data to be rewritten by a current. The selection transistor 31 is provided to correspond to each MTJ element 30, and is brought into conduction when a current is applied to the corresponding MTJ element 30. The MTJ element may be described as a resistance change element.

A plurality of word lines WL extend in the row direction, and a plurality of bit lines BL extend in the column direction. The word lines WL are arranged to intersect the bit lines BL. Two adjacent bit lines BL (which will be referred to as a local bit line LBL and a local source line LSL for descriptive purposes in the present embodiment) form a pair, and a memory cell MC is provided at an intersection between each word line WL and each bit line pair. The MTJ element 30 and selection transistor 31 of each memory cell MC are coupled in series between the local bit line LBL and the local source line LSL (i.e., between the bit line pair). The gate of the selection transistor 31 is coupled to a word line WL.

The word line driver 14 is provided along at least one side of the memory array 11. The word line driver 14 is configured to apply a voltage to the word line WL via a main word line MWL in data reading or data writing.

The row decoder 15 decodes a row address of the command address signal CA supplied from the command/address input circuit 18. The row decoder 15 supplies the decoded row address to the word line driver 14. The word line driver 14 can thereby apply a voltage to a selected word line WL.

The column decoder 13 decodes a column address of the command address signal CA supplied from the command/address input circuit 18. The column decoder 13 supplies the decoded column address to the sense amplifier/write driver 12.

The sense amplifier/write driver 12 includes a sense amplifier and a write driver. The sense amplifier/write driver 12 is provided along at least one side of the memory array 11. The sense amplifier is coupled to a local bit line LBL via a global bit line GBL, and detects a current flowing in a memory cell MC coupled to a selected word line WL to read data stored in the memory cell MC. The write driver is coupled to a local bit line LBL via a global bit line GBL, or to a local source line LSL via a global source line GSL. The write driver applies a current to a selected memory cell MC coupled to a selected word line WL when data is written in the selected memory cell MC.

The sense amplifier/write driver 12 includes a page buffer (not shown). The page buffer is, for example, a volatile memory, and stores data read by the sense amplifier, or write data transferred via the IO circuit 16.

Data exchange between the sense amplifier/write driver 12 and a data line DQ is performed via the IO circuit 16.

<1-1-4> Memory Array

Figure 2:
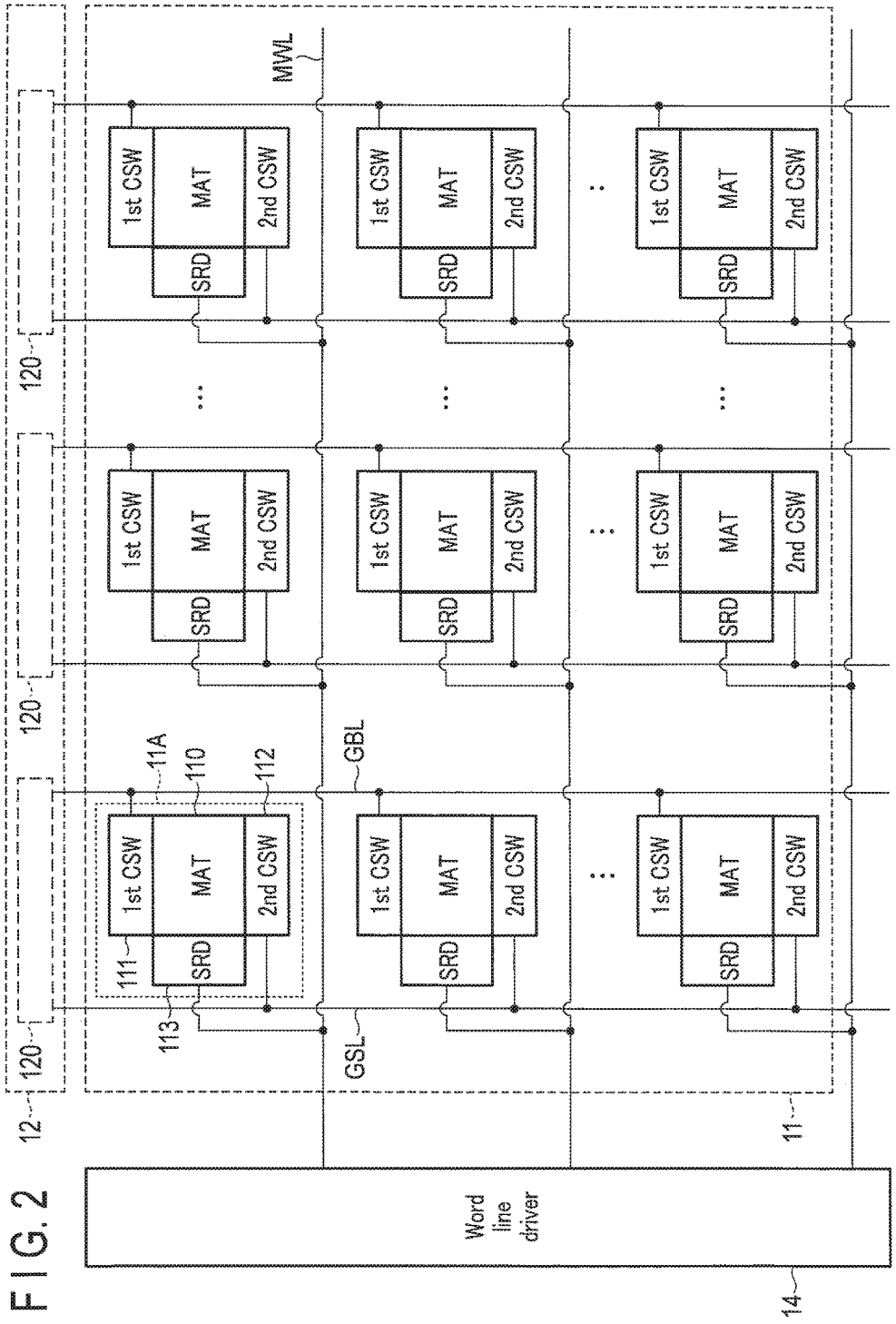
FIG. 2 is a block diagram showing the memory array of the memory device according to the first embodiment.

Next, a specific configuration of the memory array of the memory device according to the first embodiment will be described with reference to FIG. 2. FIG. 2 is a block diagram showing the memory array of the memory device according to the first embodiment.

As shown in FIG. 2, the memory array 11 includes a matrix of a plurality of sub-arrays 11A. Each sub-array 11A is coupled to the sense amplifier/write driver 12 via a global bit line GBL and a global source line GSL. The sub-array 11A is coupled to the word line driver 14 via a main word line MWL.

The sense amplifier/write driver 12 includes a core circuit 120 for each pair of the global bit line GBL and global source line GSL.

The sub-array 11A includes a MAT 110, a first column switch circuit 111, a second column switch circuit 112, and a sub-row decoder circuit 113.

The MAT 110 includes a plurality of memory cells MC arranged in a matrix on a semiconductor substrate. The details will be described later.

The first column switch circuit 111 controls coupling between a global bit line GBL and a local bit line LBL based on a signal from the column decoder 13.

The second column switch circuit 112 controls coupling between a global source line GSL and a local source line LSL based on a signal from the column decoder 13.

The sub-row decoder circuit 113 controls coupling between a main word line MWL and a word line WL based on a signal from the sequencer 50.

<1-1-5> Sense Amplifier/Write Driver

The sense amplifier/write driver 12 of the memory device according to the first embodiment will be described with reference to FIG. 3. FIG. 3 is a block diagram showing the sense amplifier/write driver 12 of the memory device according to the first embodiment.

As shown in FIG. 3, the sense amplifier/write driver 12 includes a plurality of core circuits 120. The core circuit 120 is provided for each pair of the global bit line GBL and global source line GSL. The core circuit 120 includes a preamplifier 121, a sense amplifier (SA) 122, and a write driver 123.

The preamplifier 121 supplies a current (cell current) to a memory cell MC via the global bit line GBL, and generates voltages V1st and V2nd based on the cell current. The preamplifier 121 also compares the current flowing in the memory cell MC and a current flowing in a reference cell RC, and generates voltage Vref based on the comparison result.

The sense amplifier 122 generates data (DO, DOB) based on voltages V1st and Vref supplied from the preamplifier 121. The sense amplifier 122 also generates data (DO, DOB) based on voltages V1st and V2nd.

Based on the data (DO, DOB) from the sense amplifier 122, the write driver 123 applies a given voltage to the global bit line GBL and the global source line GSL in a write operation.

<1-1-6> MAT, First Column Switch Circuit, and Second Column Switch Circuit

Figure 4:
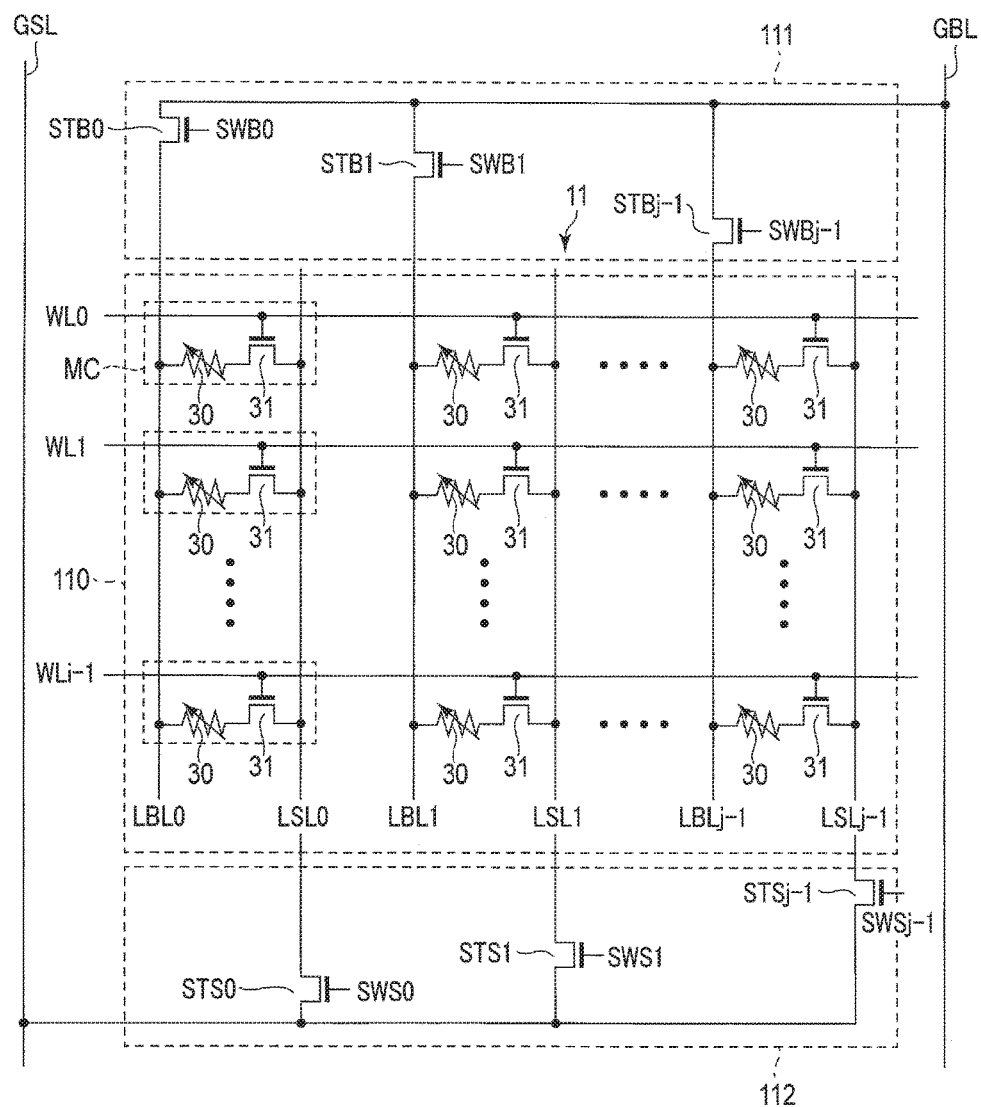
FIG. 4 is a block diagram showing the MAT, the first column switch circuit, and the second column switch circuit.

Next, the MAT, the first column switch circuit, and the second column switch circuit will be described with reference to FIG. 4. FIG. 4 is a block diagram showing the MAT, the first column switch circuit, and the second column switch circuit.

As shown in FIG. 4, the MAT 110 is formed by arranging a plurality of memory cells MC in a matrix. Specifically, the MAT 110 includes a plurality of word lines WL0 to WLi−1 (i: an integer not less than 2), a plurality of local bit lines LBL0 to LBLj−1, and a plurality of local source lines LSL0 to LSLj−1 (j: an integer not less than 2).

Each memory cell MC is constituted by an MTJ element 30 and a selection transistor 31. The selection transistor 31 is constituted by, for example, an N-channel metal oxide silicon field effect transistor (MOSFET).

One end of the MTJ element 30 is coupled to a local bit line LBL, and the other end thereof is coupled to the drain of the selection transistor 31. The gate of the selection transistor 31 is coupled to a word line WL, and the source thereof is coupled to a local source line LSL.

The first column switch circuit 111 includes an NMOS transistor STB (STB0 to STBj−1) for each local bit line LBL. One end of the transistor STB is coupled to a local bit line LBL, and the other end thereof is coupled to a global bit line GBL. The gate electrodes of the transistors STB0 to STBj−1 receive respective signals SWB0 to SWBj−1, each of which controls coupling of a local bit line LBL and a global bit line GBL.

The second column switch circuit 112 includes an NMOS transistor STS (STS0 to STSj−1) for each local source line LSL. One end of the transistor STS is coupled to a local source line LSL, and the other end thereof is coupled to a global source line GBL. The gate electrodes of the transistors STS0 to STSj−1 receive respective signals SWS0 to SWSj−1, each of which controls coupling of a local source line LSL and a global source line GSL.

<1-1-7> Memory Cell

<1-1-7-1> First Example

Figure 5:
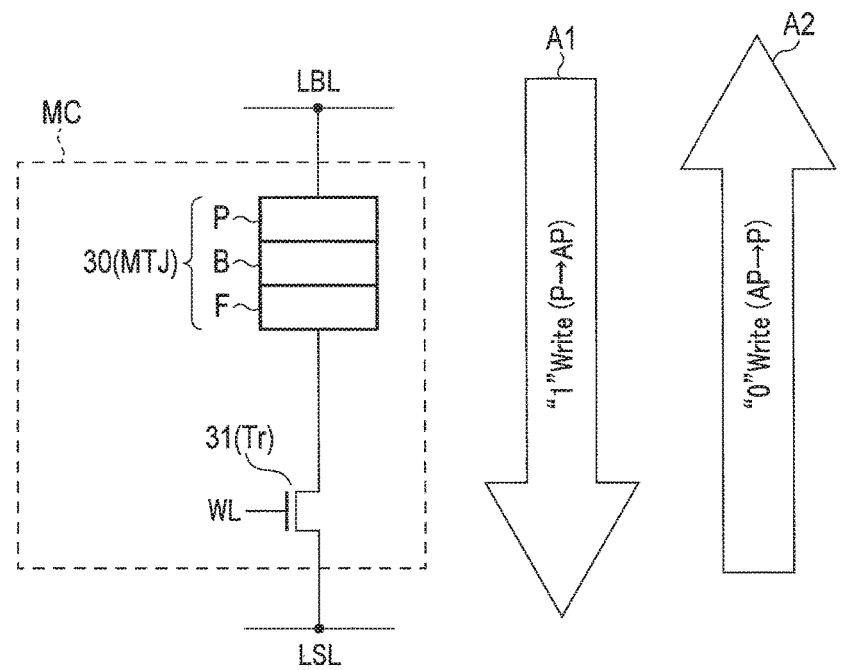
FIG. 5 is a diagram showing the first example of the configuration of the memory cell MC of the memory device according to the first embodiment.

Next, a first example of the configuration of the memory cell MC of the memory device according to the first embodiment will be schematically described with reference to FIG. 5. FIG. 5 is a diagram showing the first example of the configuration of the memory cell MC of the memory device according to the first embodiment.

As shown in FIG. 5, one end of the MTJ element 30 of the memory cell MC according to the first embodiment is coupled to a local bit line LBL, and the other end thereof is coupled to one end of a selection transistor 31. The other end of the selection transistor 31 is coupled to a local source line LSL. The MTJ element 30, which utilizes the tunneling magnetoresistive (TMR) effect, has a laminated structure of two ferromagnetic layers F and P and a non-magnetic layer (tunnel insulating film) B interposed therebetween, and stores digital data by utilizing a change in the magnetic resistance caused by the spin-polarized tunneling effect. The MTJ element 30 can take a low-resistance state or a high-resistance state in accordance with the magnetic directions of the two ferromagnetic layers F and P. For example, when the low-resistance state is defined as data "0", and the high-resistance state is defined as data "1", 1-bit data can be stored in the MTJ element 30. The low-resistance state may of course be defined as data "1", and the high-resistance state may be defined as data "0".

For example, the MTJ element 30 is formed by sequentially stacking a memory layer (free layer, recording layer) F, a non-magnetic layer B, and a reference layer (pin layer, fixed layer) P. The reference layer P and the memory layer F are composed of a ferromagnetic material, and the non-magnetic layer B is composed of an insulating film (such as Al2O3 or MgO). The reference layer P is a layer of which magnetic direction is fixed, while the memory layer F is a layer of which magnetic direction is variable and which stores data by the magnetic direction.

When a current flows in the direction of arrow A1 during writing, the magnetic direction of the free layer F becomes anti-parallel (AP state) to the magnetic direction of the pin layer P. As a result, the MTJ element 30 takes the high-resistance state (data "1"). When a current flows in the direction of arrow A2 during writing, the magnetic direction of the free layer F becomes parallel (P state) to the magnetic direction of the pin layer P. As a result, the MTJ element 30 takes the low-resistance state (data "0"). In this manner, different data can be written in the MTJ element depending on the direction in which a current flows. The expression "the magnetic direction is variable" used above means that the magnetic direction changes in response to a predetermined write current. The expression "the magnetic direction is fixed" means that the magnetic direction does not change in response to a predetermined write current.

<1-1-7-2> Second Example

Figure 6:
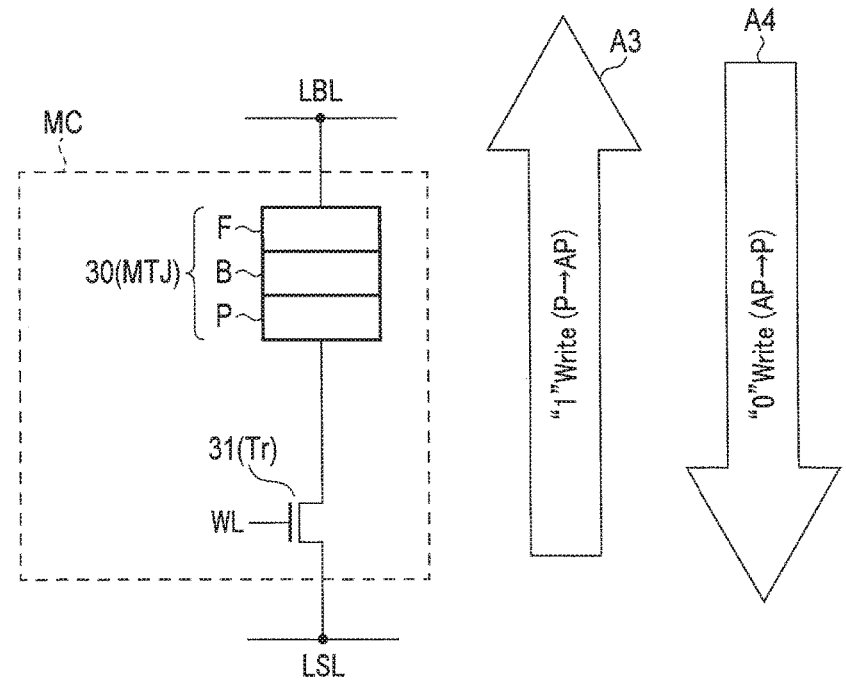
FIG. 6 is a diagram showing the second example of the configuration of the memory cell MC of the memory device according to the first embodiment.

Next, a second example of the configuration of the memory cell MC of the memory device according to the first embodiment will be schematically described with reference to FIG. 6. FIG. 6 is a diagram showing the second example of the configuration of the memory cell MC of the memory device according to the first embodiment. In the following description, only the matters different from the first example will be described.

In the second example, the MTJ element 30 is formed by sequentially stacking the reference layer (pin layer, fixed layer) P, the non-magnetic layer B, and the memory layer (free layer, recording layer) F, as shown in FIG. 6.

When a current flows in the direction of arrow A3 during writing, the magnetic direction of the free layer F becomes anti-parallel (AP state) to the magnetic direction of the pin layer P. As a result, the MTJ element 30 takes the high-resistance state (data "1"). When a current flows in the direction of arrow A4 during writing, the magnetic direction of the free layer F becomes parallel (P state) to the magnetic direction of the pin layer P. As a result, the MTJ element 30 takes the low-resistance state (data "0").

Hereinafter, the memory device will be described based on the memory cell MC having the configuration according to the first example.

<1-1-8> Configuration of Preamplifier

<1-1-8-1> Outline

Figure 7:
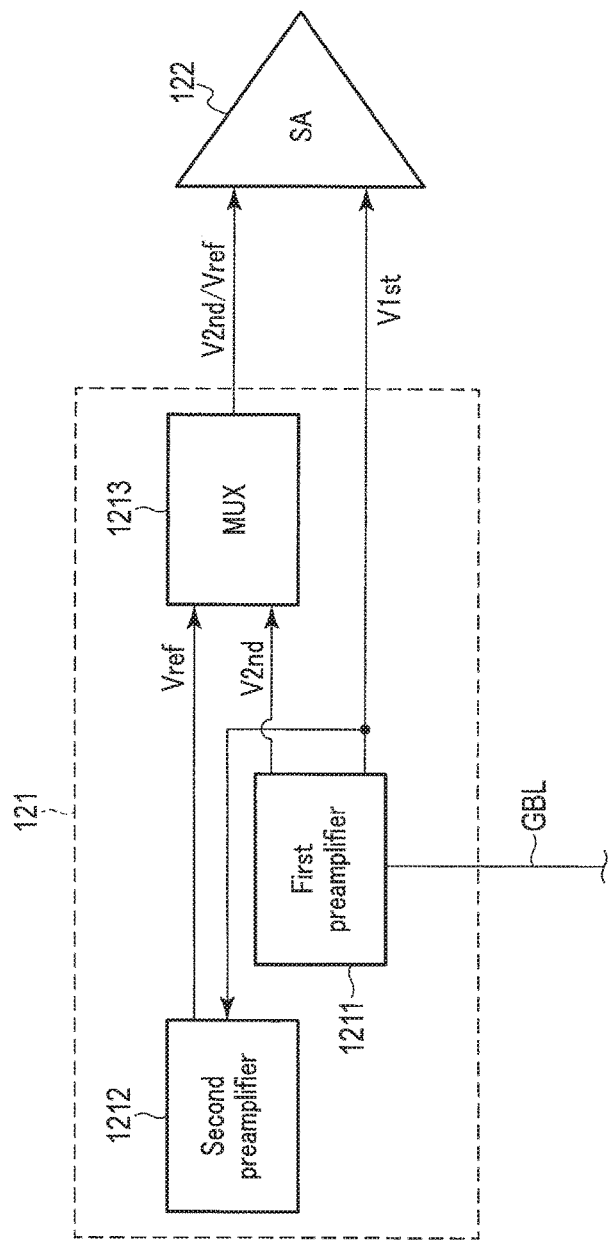
FIG. 7 is a block diagram showing a configuration of the preamplifier of the memory device according to the first embodiment.

Next, a configuration of the preamplifier 121 of the memory device according to the first embodiment will be described with reference to FIG. 7. FIG. 7 is a block diagram showing a configuration of the preamplifier 121 of the memory device according to the first embodiment.

As shown in FIG. 7, the preamplifier 121 includes a first preamplifier 1211, a second preamplifier 1212, and a multiplexer (MUX) 1213.

The first preamplifier 1211 supplies a current to a memory cell MC via a global bit line GBL, and generates voltages V1st and V2nd. The second preamplifier 1212 generates voltage Vref based on a mirror current of the cell current supplied from the first preamplifier 1211. The multiplexer 1213 selectively supplies voltages Vref and V2nd to the sense amplifier 122.

<1-1-8-2> Details

Next, details of the preamplifier 121 of the memory device according to the first embodiment will be described with reference to FIG. 8. FIG. 8 is a circuit diagram of the preamplifier 121 of the memory device according to the first embodiment.

As shown in FIG. 8, the first preamplifier 1211 includes PMOS transistors M1, M2, and M6, and NMOS transistors M3, M4, M5, and M7.

One end of transistor M1 is supplied with a source voltage VDD, and the other end and gate electrode thereof are coupled to node N1.

One end of transistor M2 is supplied with source voltage VDD, the other end thereof is coupled to node N4, and the gate electrode thereof is coupled to node N1.

Transistors M1 and M2 function as a current mirror.

One end of transistor M3 is coupled to node N1, the other end thereof is coupled to node N2, and the gate electrode thereof is supplied with signal VCLAMP.

One end of transistor M4 is coupled to node N2, the other end thereof is coupled to a global bit line GBL via node N3, and the gate electrode thereof is supplied with signal REN1.

One end of transistor M5 is coupled to node N4, the other end thereof is supplied with a reference voltage VSS, and the gate electrode thereof is coupled to node N5.

One end of transistor M6 is coupled to node N4, the other end thereof is coupled to node N5, and the gate electrode thereof is supplied with signal SW1P.

One end of transistor M7 is coupled to node N4, the other end thereof is coupled to node N5, and the gate electrode thereof is supplied with signal SW1N.

Transistors M6 and M7 function as a single switch.

A capacitor C1 is coupled to node N5. One end of the capacitor C1 is coupled to node N5, and the other end thereof is supplied with the reference voltage VSS.

The electrical potential of node N5 is supplied to the sense amplifier 122 as V1st. Transistors M5, M6, and M7, capacitor C1, and node N5 can be regarded as a V1st generator.

The second preamplifier 1212 includes PMOS transistors M12 and M13, and NMOS transistors M14, M15, and M16.

One end of transistor M12 is supplied with the source voltage VDD, and the other end and gate electrode thereof are coupled to node N8.

One end of transistor M13 is supplied with the source voltage VDD, the other end thereof is coupled to node N7, and the gate electrode thereof is coupled to node N8.

Transistors M12 and M13 function as a current mirror.

One end of transistor M14 is coupled to node N8, the other end thereof is coupled to node N9, and the gate electrode thereof is supplied with signal VCLAMP.

One end of transistor M15 is coupled to node N9, the other end thereof is coupled to the reference cell RC via node N10, and the gate electrode thereof is supplied with signal REN2.

One end of transistor M16 is coupled to node N7, the other end thereof is supplied with the reference voltage VSS, and the gate electrode thereof is coupled to node N5.

The multiplexer 1213 includes PMOS transistors M8 and M10, and NMOS transistors M9 and M11.

One end of transistor M8 is coupled to node N4, the other end thereof is coupled to node N6, and the gate electrode thereof is supplied with signal SW2P.

One end of transistor M9 is coupled to node N4, the other end thereof is coupled to node N6, and the gate electrode thereof is supplied with signal SW2N.

Transistors M8 and M9 function as a single switch.

One end of transistor M10 is coupled to node N7, the other end thereof is coupled to node N6, and the gate electrode thereof is supplied with signal SW3P.

One end of transistor M11 is coupled to node N7, the other end thereof is coupled to node N6, and the gate electrode thereof is supplied with signal SW3N.

Transistors M10 and M11 function as a single switch.

A capacitor C2 is coupled to node N6. One end of the capacitor C2 is coupled to node N6, and the other end thereof is supplied with the reference voltage VSS.

One end of transistor M17 is supplied with the source voltage VDD, the other end thereof is coupled to node N6, and the gate electrode thereof is supplied with signal VSFT0.

One end of transistor M18 is coupled to node N6, the other end thereof is supplied with the reference voltage VSS, and the gate electrode thereof is supplied with signal VSFT1.

Transistors M17 and M18 are those which shift a voltage in the charging direction or discharging direction when generating voltage V2nd.

When transistors M8 and M9 are on, the electrical potential of node N6 is supplied to the sense amplifier 122 as V2nd. Namely, transistors M5, M17, M18, M8, and M9, capacitor C2, and node N6 can be regarded as a V2nd generator.

When transistors M10 and M11 are on, the electrical potential of node N6 is supplied to the sense amplifier 122 as Vref. Namely, transistors M16, M10, and M11, capacitor C2, and node N6 can be regarded as a Vref generator.

The operation of the preamplifier 121 will be described later.

<1-1-9> Configuration of Sense Amplifier

Figure 9:
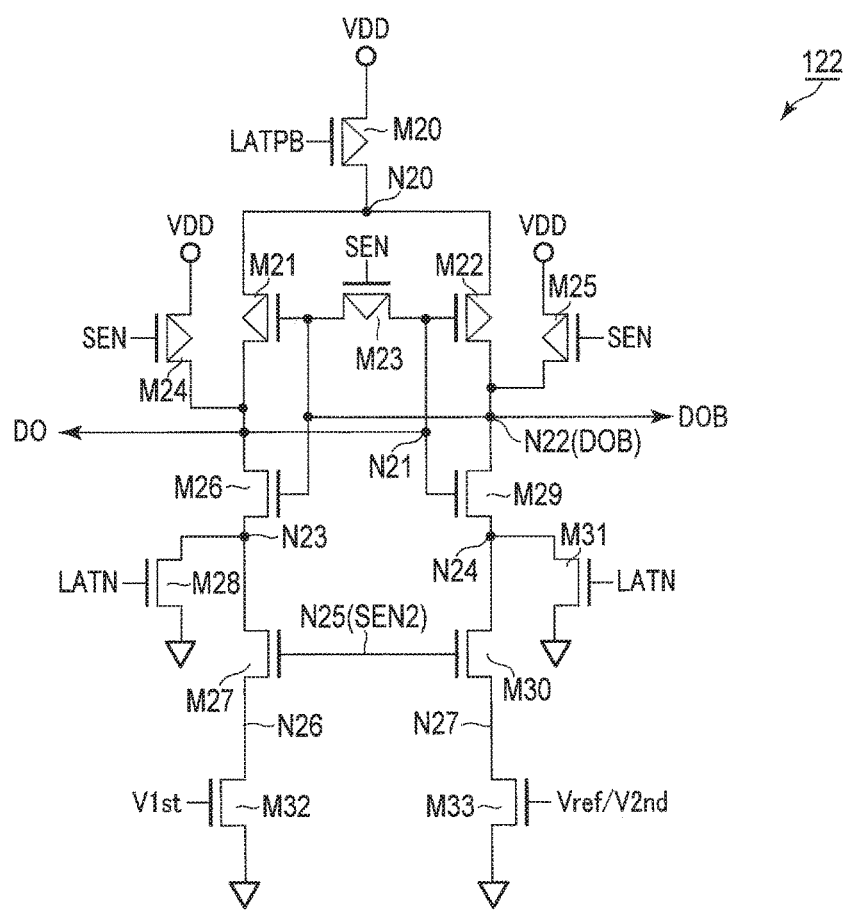
FIG. 9 is a circuit diagram of the sense amplifier of the memory device according to the first embodiment.

Next, a configuration of the sense amplifier 122 of the memory device according to the first embodiment will be described with reference to FIG. 9. FIG. 9 is a circuit diagram of the sense amplifier 122 of the memory device according to the first embodiment.

As shown in FIG. 9, the sense amplifier 122 includes PMOS transistors M20, M21, M22, M23, M24, and M25, and NMOS transistors M26, M27, M28, M29, M30, M31, M32, and M33.

One end of transistor M20 is supplied with the source voltage VDD, the other end thereof is coupled to node N20, and the gate electrode thereof is supplied with signal LATPB.

One end of transistor M21 is coupled to node N20, the other end thereof is coupled to node N21, and the gate electrode thereof is coupled to node N22.

One end of transistor M22 is coupled to node N20, the other end thereof is coupled to node N22, and the gate electrode thereof is coupled to node N21.

One end of transistor M23 is coupled to node N21, the other end thereof is coupled to node N22, and the gate electrode thereof is supplied with signal SEN.

One end of transistor M24 is supplied with the source voltage VDD, the other end thereof is coupled to node N21, and the gate electrode thereof is supplied with signal SEN.

One end of transistor M25 is supplied with the source voltage VDD, the other end thereof is coupled to node N22, and the gate electrode thereof is supplied with signal SEN.

One end of transistor M26 is coupled to node N21, the other end thereof is coupled to node N23, and the gate electrode thereof is coupled to node N22.

One end of transistor M27 is coupled to node N23, the other end thereof is coupled to node N26, and the gate electrode thereof is supplied with signal SEN2 via node N25.

One end of transistor M28 is coupled to node N23, the other end thereof is supplied with the reference voltage VSS, and the gate electrode thereof is supplied with signal LATN.

One end of transistor M29 is coupled to node N22, the other end thereof is coupled to node N24, and the gate electrode thereof is coupled to node N21.

One end of transistor M30 is coupled to node N24, the other end thereof is coupled to node N27, and the gate electrode thereof is supplied with signal SEN2 via node N25.

One end of transistor M31 is coupled to node N24, the other end thereof is supplied with the reference voltage VSS, and the gate electrode thereof is supplied with signal LATN.

One end of transistor M32 is coupled to node N26, the other end thereof is supplied with the reference voltage VSS, and the gate electrode thereof is supplied with signal V1st.

One end of transistor M33 is coupled to node N27, the other end thereof is supplied with the reference voltage VSS, and the gate electrode thereof is supplied with signal V2nd or Vref.

The electrical potential of node N21 is supplied to the IO circuit 16 and the write driver 123 as DO.

The electrical potential of node N22 is supplied to the IO circuit 16 and the write driver 123 as DOB.

The operation of the sense amplifier 122 will be described later.

<1-1-10> Configuration of Write Driver

Next, a configuration of the write driver 123 of the memory device according to the first embodiment will be described with reference to FIG. 10. FIG. 10 is a circuit diagram of the write driver 123 of the memory device according to the first embodiment.

The write driver 123 includes an operation section 1231, PMOS transistors M40 and M42, and NMOS transistors M41 and M43.

The operation section 1231 generates signals WT1 (WT1B: an inversion signal of WT1), WTL, and WTH based on data (DO, DOB) supplied from the sense amplifier 122.

One end of transistor M40 is supplied with the source voltage VDD, the other end thereof is coupled to a global bit line GBL via node N26, and the gate electrode thereof is supplied with signal WT1B.

One end of transistor M41 is coupled to the global bit line GBL via node N26, the other end thereof is supplied with the reference voltage VSS, and the gate electrode thereof is supplied with signal WTL.

One end of transistor M42 is coupled to the source voltage VDD, the other end thereof is coupled to a global source line GSL via node N27, and the gate electrode thereof is supplied with signal WTH.

One end of transistor M43 is coupled to the global source line GSL via node N27, the other end thereof is supplied with the reference voltage VSS, and the gate electrode thereof is supplied with signal WT1.

The operation of the write driver 123 will be described later.

<1-2> Operation

Figure 12:
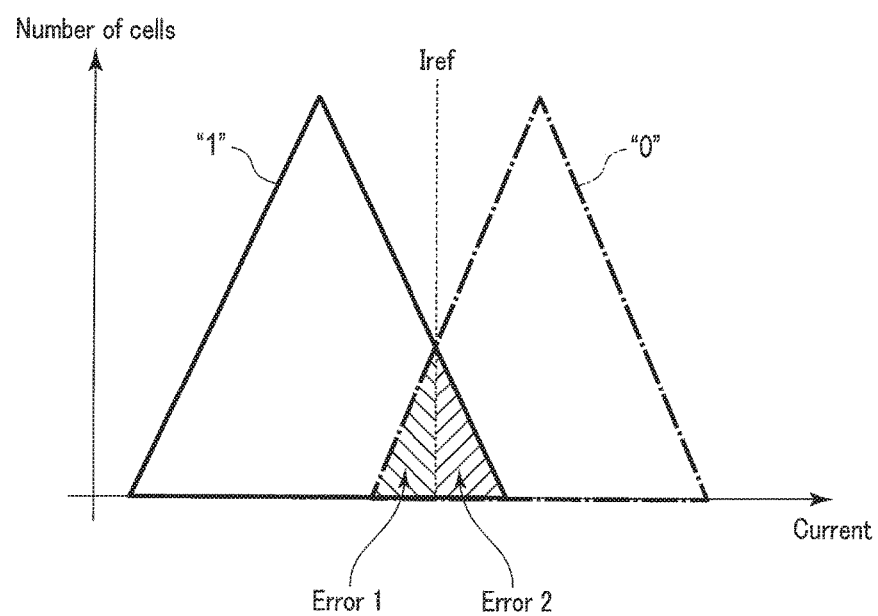
FIG. 12 is a distribution map of cell currents of all memory cells included in the memory array.

Prior to description of the read operation of the memory system according to the first embodiment, the threshold distribution of MTJ elements will be described with reference to FIGS. 11 and 12. FIGS. 11 and 12 are each a distribution map of cell currents of all memory cells included in the memory array. In FIGS. 11 and 12, the vertical axis indicates the number of memory cells by a logarithm, and the horizontal axis indicates the current value of the current flowing in the memory cell.

As described above, the MTJ element of the memory device according to the first embodiment stores data by using a change in the resistance value.

Then, the memory device 10 supplies a read current to a memory cell MC during data reading. The memory device 10 compares the current flowing in the memory cell MC with a reference current (such as a current flowing in the reference cell) to determine the resistance state of the memory cell MC. The current flowing in the memory cell MC during data reading is called a cell current Icell. As shown in FIG. 11, there are two types of cell current Icell, i.e., cell current Icell0 which flows in the memory cell MC in the low-resistance state and cell current Icell1 which flows in the memory cell MC in the high-resistance state. For simplification, the cell current flowing in the memory cell MC that stores data "1" will be described as cell current Icell1. The cell current flowing in the memory cell MC that stores data "0" will be described as cell current Icell0. The current flowing in the reference cell RC during data reading is called a reference current Iref.

When variation between the resistances of the MTJ elements increases, the margin between the cell current distribution of the "0" state and the cell current distribution of the "1" state may decrease. Therefore, the read margin extremely decreases in the reading method in which a reference value Iref is set between the cell current distribution of the "0" state and the cell current distribution of the "1" state, and the state of each MTJ element is determined based on the result of comparison with the reference value.

Furthermore, when variation between the resistances of the MTJ elements further increases, the cell current distribution of the "0" state may overlap the cell current distribution of the "1" state as shown in FIG. 12. In this situation, if data is determined by comparing a cell current with the reference value Iref, a memory cell MC that is in the "0" state, but is positioned in the distribution of the "1" state (at a position where the current value is smaller than Iref), is determined as being in the "1" state in error. Such a memory cell MC is an error (error 1) cell. Similarly, when a memory cell MC that is in the "1" state, but is positioned in the distribution of the "0" state (at a position where the current value is larger than Iref), the memory cell MC is determined as being in the "0" state in error. Such a memory cell MC is an error (error 2) cell.

To deal with the situation, the first embodiment employs a reference signal obtained by adding shift signal information to signal information (current value or voltage value) of one resistance state of the "0" state and "1" state of an MTJ element. Then, the initial state of the MTJ element is determined based on the reference signal. Such a self-reference reading method will be described.

Next, a read operation of the memory system according to the first embodiment will be described.

<1-2-1> Outline of Read Operation

Figure 14:
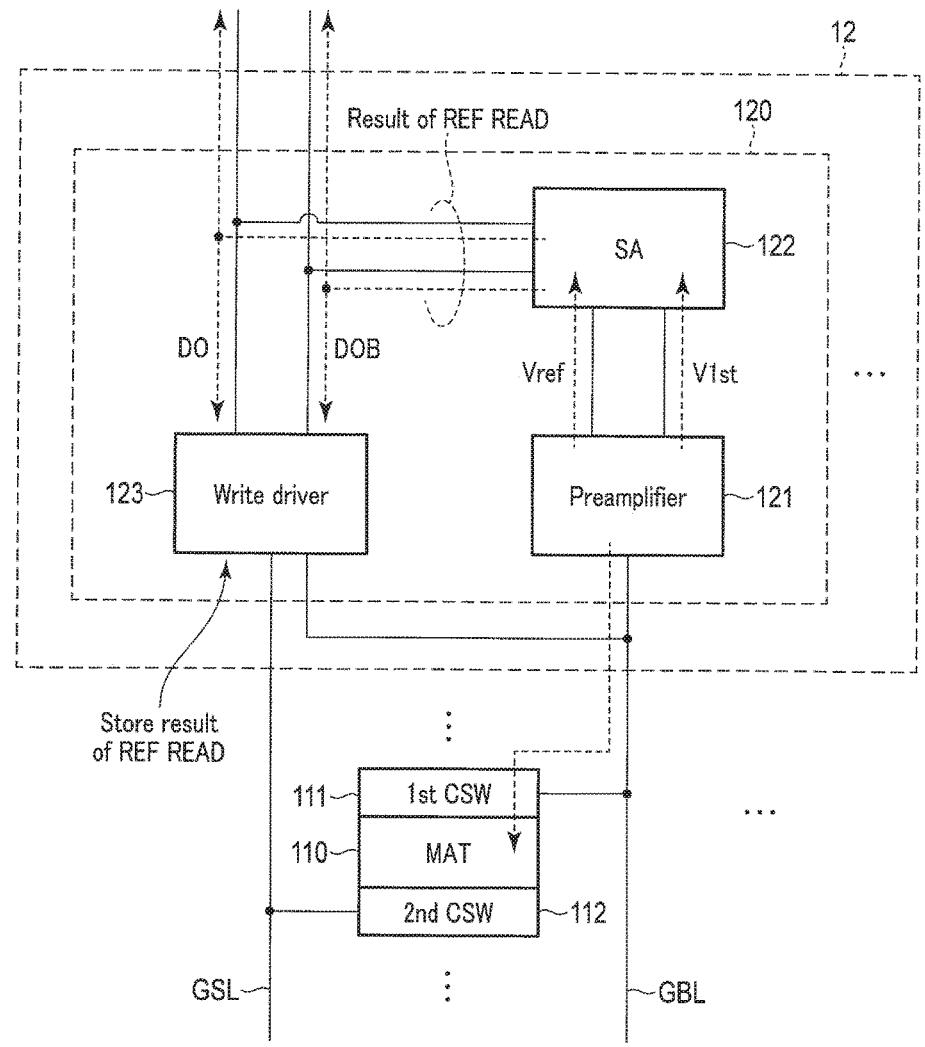
FIG. 14 is a block diagram showing the read operation of the memory system according to the first embodiment.
Figure 16:
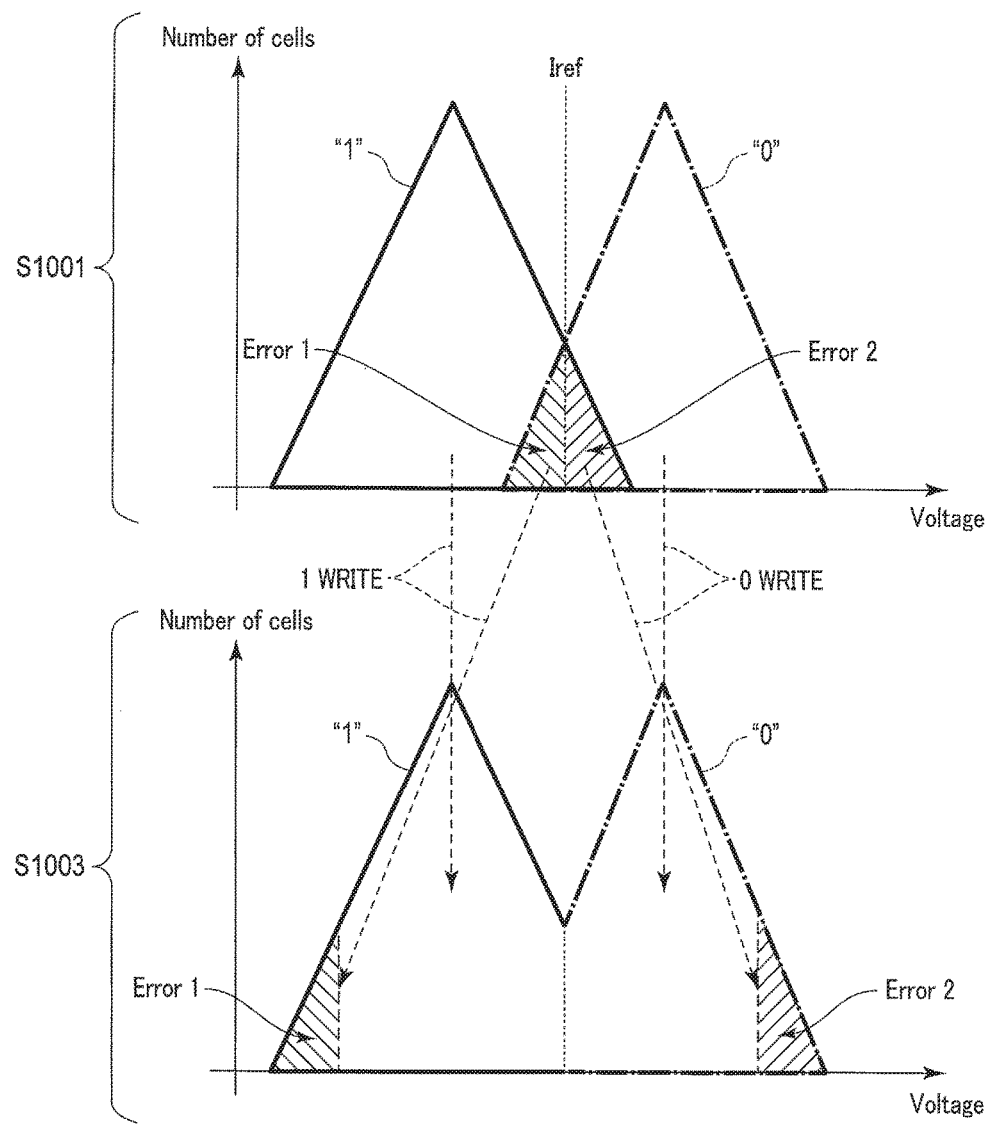
FIG. 16 is a distribution map of cell currents of all memory cells included in the memory array.

The outline of the read operation of the memory system according to the first embodiment will be described with reference to FIGS. 13-17. FIG. 13 is a flowchart of the read operation of the memory system according to the first embodiment. FIGS. 14, 15, and 17 are block diagrams showing the read operation of the memory system according to the first embodiment. FIG. 16 is a distribution map of cell currents of all memory cells included in the memory array. In FIG. 16, the vertical axis indicates the number of memory cells by a logarithm, and the horizontal axis indicates the current value of the current flowing in the memory cell.

[Step S1001]

Upon receipt of a read instruction from the host 2, the memory controller 20 issues an active command and a read command to the memory device 10.

As shown in FIG. 14, upon receipt of the active command and the read command from the memory controller 20, the memory device 10 performs a first read operation (1st READ) and a reference read operation (Ref READ) on a memory cell to be read. By this first read operation, the preamplifier 121 generates voltage information (signal voltage) V1st based on the resistance state of the memory cell to be read. By the reference read operation, the preamplifier 121 also generates voltage information (signal voltage) Vref based on the determination result of the resistance state of the memory cell to be read.

[Step S1002]

As shown in FIG. 14, the sense amplifier 122 determines the result of V1st generated in step S1001 based on voltage Vref generated in step S1001 (first sense). Specifically, the sense amplifier 122 compares current I1st based on V1st with current Iref based on Vref to determine data stored in the memory cell. Data based on the reference read operation can be thereby obtained.

[Step S1003]

As shown in FIG. 15, the write driver 123 performs a reference write operation (WRITE) for writing data obtained by the reference read operation on the memory cell subjected to step S1001. The memory cell subjected to step S1001 is thereby overwritten with data obtained by the reference read operation. This operation brings the memory cell to a reference state to generate V2nd to be described later.

Specifically, in the memory cells determined to be error memory cells by the reference read operation, data different from the one originally stored is stored as shown in FIG. 16. In the memory cells not determined to be error memory cells by the reference read operation, the same data as the one originally stored is stored.

[Step S1004]

As shown in FIG. 17, the memory device 10 performs a second read operation (2nd READ) on the memory cell subjected to step S1001.

[Step S1005]

As shown in FIG. 17, the preamplifier 121 shifts (decrease or increase) the voltage generated as a result of the second read operation to generate voltage information (signal voltage) V2nd.

[Step S1006]

As shown in FIG. 17, the sense amplifier 122 determines the result of V1st generated in step S1001 based on V2nd generated in step S1005 (second sense). Specifically, the sense amplifier 122 compares current I1st based on V1st with current I2nd based on V2nd to determine data stored in the memory cell.

After that, the memory device 10 writes back data only in memory cells MC determined to be error memory cells. The error memory cell MC is found by the memory device 10 by comparing the result of the first sense with the result of the second sense. When the result of the first sense differs from the result of the second sense, the memory cell MC is determined to be an error memory cell. In this case, the result of the second sense is written back in the memory cell MC.

Data is written back only in the error memory cells MC by, for example, an instruction preset in the memory device 10 (such as a pre-charge command) or an instruction from outside the memory device 10, such as an instruction from the memory controller 20.

<1-2-2> Determination Method in Read Operation

Next, a specific determination method in the determination operation (step S1006) will be described.

Figure 18:
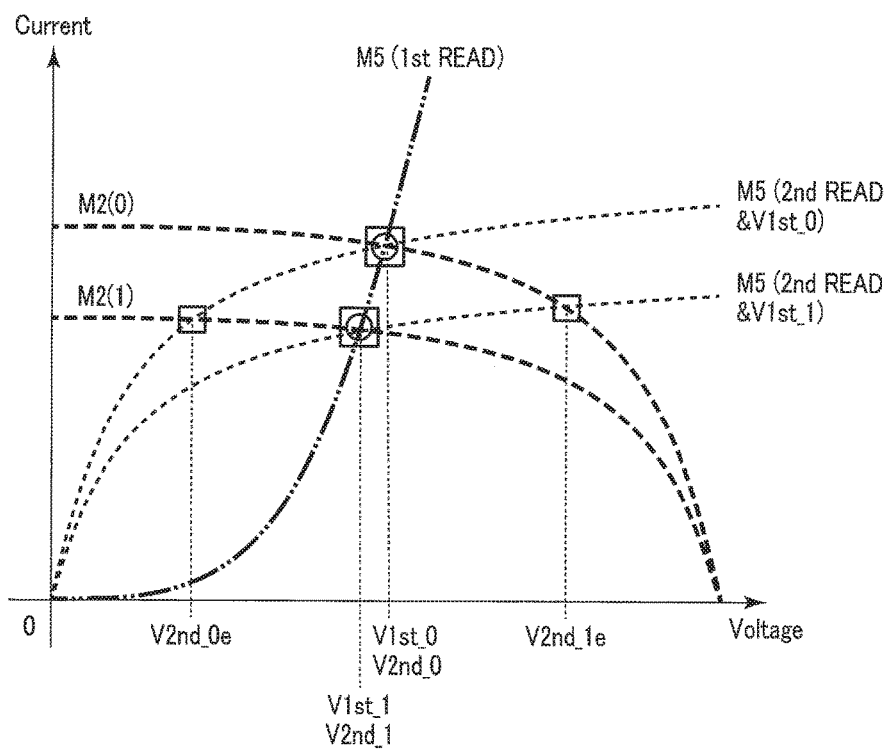
FIG. 18 is a graph showing operation characteristics of the preamplifier based on characteristics of the memory cell.
Figure 19:
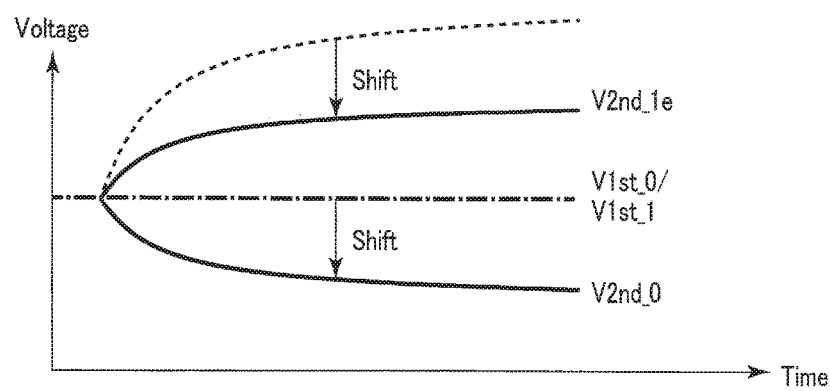
FIG. 19 is a diagram showing the relationship between voltage V1st and voltage V2nd.
Figure 20:
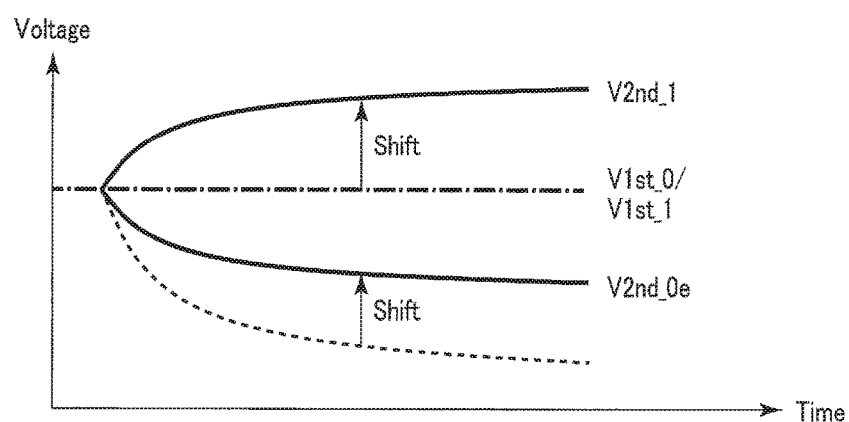
FIG. 20 is a diagram showing the relationship between voltage V1st and voltage V2nd.

Operation characteristics of the preamplifier 121 based on characteristics of the memory cell will be described with reference to FIGS. 18-20. FIG. 18 is a graph showing operation characteristics of the preamplifier 121 based on characteristics of the memory cell. FIGS. 19 and 20 each show the relationship between voltage V1st and voltage V2nd.

FIG. 18 shows the relationship between characteristics (M2(0)) of transistor M2 in the case where the memory cell stores "0" and characteristics (M5(1st READ)) of transistor M5 in the first read. Therefore, the intersection between M2(0) and M5(1st READ) in FIG. 18 indicates voltage information (signal voltage) V1st_0, which means that the memory cell stores data "0" in the first read.

FIG. 18 also shows the relationship between characteristics (M2(1)) of transistor M2 in the case where the memory cell stores "1" and characteristics (M5(1st READ)) of transistor M5 in the first read. Therefore, the intersection between M2(1) and M5(1st READ) in FIG. 18 indicates voltage information (signal voltage) V1st_1, which means that the memory cell stores data "1" in the first read.

FIG. 18 also shows the relationship between characteristics (M2(0)) of transistor M2 in the case where the memory cell stores "0" and characteristics (M5(2nd READ&V1st_0)) of transistor M5 storing voltage V1st_0 in the second read. Therefore, the intersection between M2(0) and M5(2nd READ&V1st_0) in FIG. 18 indicates voltage information (signal voltage) V2nd_0, which means that the memory cell stores data "0" in the first read and stores data "0" in the second read.

FIG. 18 also shows the relationship between characteristics (M2(1)) of transistor M2 in the case where the memory cell stores "1" and characteristics (M5(2nd READ&V1st_1)) of transistor M5 storing voltage V1st_1 in the second read. Therefore, the intersection between M2(1) and M5(2nd READ&V1st_1) in FIG. 18 indicates voltage information (signal voltage) V2nd_1, which means that the memory cell stores data "1" in the first read and stores data "1" in the second read.

FIG. 18 also shows the relationship between characteristics (M2(0)) of transistor M2 in the case where the memory cell stores "0" and characteristics (M5(2nd READ&V1st_1)) of transistor M5 storing voltage V1st_1 in the second read. Therefore, the intersection between M2(0) and M5(2nd READ&V1st_1) in FIG. 18 indicates voltage information (signal voltage) V2nd_1e, which means that the memory cell stores data "1" in the first read and stores data "0" in the second read.

The meaning of voltage information (signal voltage) V2nd_1e will be more specifically described. When a memory cell stores data "1", but is in the distribution of the "0" state (at a position where the current value is larger than Iref) in step S1001 (error 2 in FIG. 18), the memory cell MC is determined in error as being in the "0" state in the reference read operation. The memory cell MC in the "1" state is then overwritten to take the "0" state in step S1003. Namely, voltage information (signal voltage) V2nd_1e means that the memory cell MC is an error 2 memory cell.

FIG. 18 also shows the relationship between characteristics (M2(1)) of transistor M2 in the case where the memory cell stores "1" and characteristics (M5(2nd READ&V1st_0)) of transistor M5 storing voltage V1st_0 in the second read. Therefore, the intersection between M2(1) and M5(2nd READ&V1st_0) in FIG. 18 indicates voltage information (signal voltage) V2nd_0e, which means that the memory cell stores data "0" in the first read and stores data "1" in the second read.

The meaning of voltage information (signal voltage) V2nd_0e will be described more specifically. When a memory cell stores data "0", but is positioned in the distribution of the "1" state (at a position where the current value is smaller than Iref) in step S1001 (error 1 in FIG. 18), the memory cell MC is determined in error as being in the "1" state in the reference read operation. The memory cell MC in the "0" state is then overwritten to take the "1" state in step S1003. Namely, voltage information (signal voltage) V2nd_0e means that the memory cell MC is an error 1 memory cell.

In step S1006, voltage V1st is compared with voltage V2nd to determine data. As shown in FIG. 18, voltage V1st_0 is almost the same as voltage V2nd_0. Voltage V1st_0 cannot be directly compared with voltage 2nd_0. Voltage V1st_1 is also almost the same as voltage V2nd_1. Voltage V1st_1 cannot be directly compared with voltage 2nd_1.

The controller 17 cannot receive the result of the first read operation until step S1006 ends. However, the controller 17 is in receipt of the result of the reference read operation.

In the present embodiment, voltage V2nd_0 or voltage V2nd_1 is shifted using the result of the reference read operation.

When the result of the reference read operation is "0", two cases are conceivable. One is the case where the memory cell MC stores data "0" in step S1001, and is determined as storing data "0" in the reference read (case A), and the other is the case where the memory cell MC stores data "1" in step S1001, and is determined as storing data "0" in the reference read (case B).

Namely, when the result of the reference read operation is "0", voltage V1st_0 is compared with voltage V2nd_0 (case A), and voltage V1st_1 is compared with voltage V2nd_1e (case B). In this case, as shown in FIG. 19, data can be determined by shifting voltage V2nd_0 and voltage V2nd_1e in the negative direction. Namely, upon receipt of data "0" as a result of the reference read operation in step S1002, the controller 17 generates voltage V2nd by shifting voltage V2nd_0 and voltage V2nd_1e in the negative direction in step S1005. The method for generating voltage V2nd will be described later.

When the result of the reference read operation is "0", the controller 17 can determine data by comparing current I1st based on voltage V1st with current I2nd based on voltage V2nd. Specifically, in the case where the result of the reference read operation is "0", when current I1st is larger than current I2nd, the controller 17 can determine that the present case is case A. Namely, the controller 17 can determine that data that was stored in the memory cell MC is "0". In the case where the result of the reference read operation is "0", when current I1st is smaller than current I2nd, the controller 17 can determine that the present case is case B. Namely, the controller 17 can determine that data that was stored in the memory cell MC is "1".

When the result of the reference read operation is "1", two cases are conceivable. One is the case where the memory cell MC stores data "1" in step S1001, and is determined as storing data "1" in the reference read (case C), and the other is the case where the memory cell MC stores data "0" in step S1001, and is determined as storing data "1" in the reference read (case D).

Namely, when the result of the reference read operation is "1", voltage V1st_1 is compared with voltage V2nd_1 (case C), and voltage V1st_0 is compared with voltage V2nd_0e (case D). In this case, data can be determined by shifting voltage V2nd_1 and voltage V2nd_0e in the positive direction as shown in FIG. 20. Namely, upon receipt of data "1" as a result of the reference read operation in step S1002, the controller 17 generates voltage V2nd by shifting voltage V2nd_1 and voltage V2nd_0e in the positive direction in step S1005. The method for generating voltage V2nd will be described later.

When the result of the reference read operation is "1", the controller 17 can determine data by comparing current I1st based on voltage V1st with current I2nd based on voltage V2nd. Specifically, in the case where the result of the reference read operation is "1", when current I1st is larger than current I2nd, the controller 17 can determine that the present case is case D. Namely, the controller 17 can determine that data that was stored in the memory cell MC is "0". In the case where the result of the reference read operation is "1", when current I1st is smaller than current I2nd, the controller 17 can determine that the present case is case C. Namely, the controller 17 can determine that data that was stored in the memory cell MC is "1".

<1-2-3> Details of Read Operation

Figure 21:
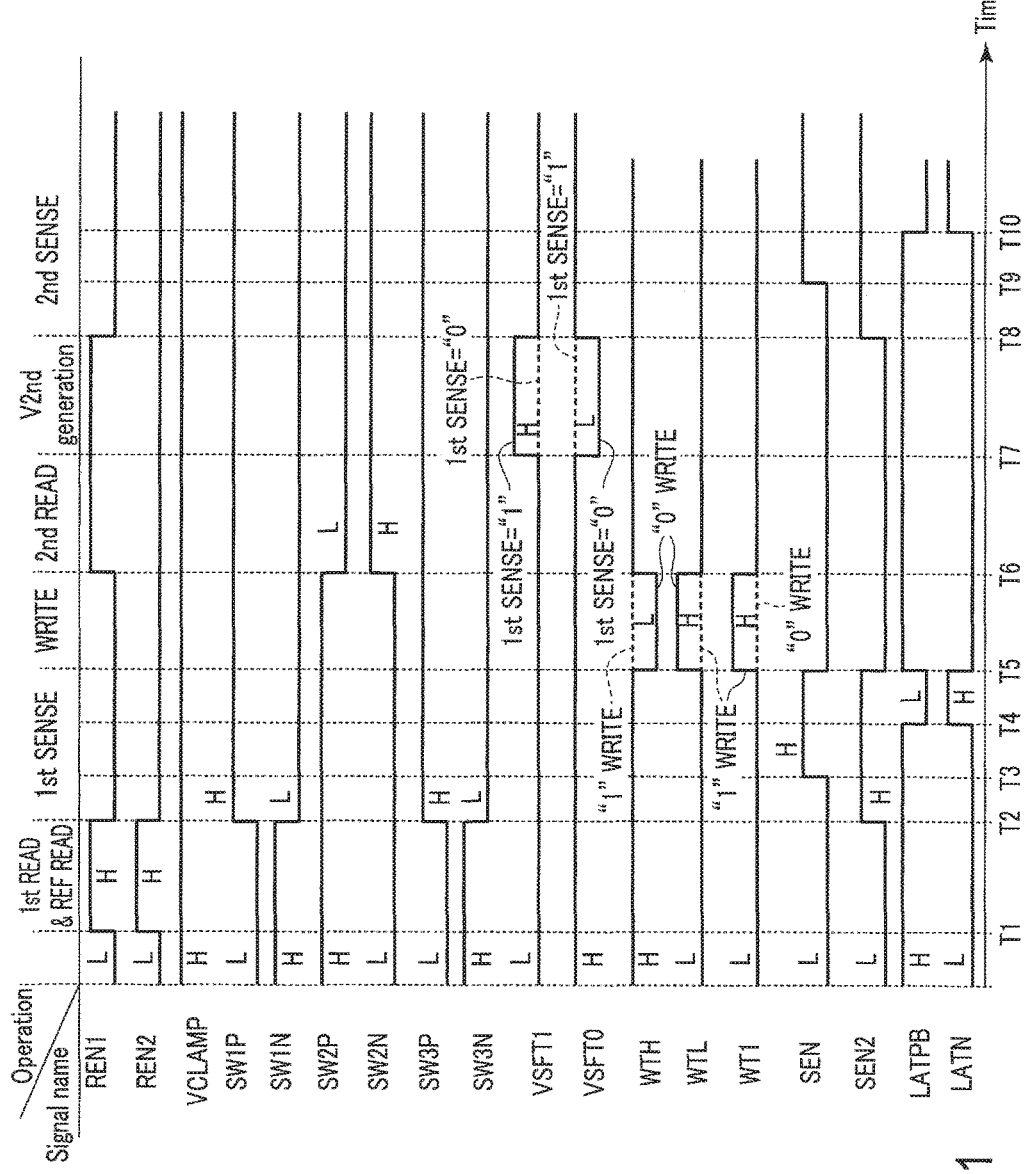
FIG. 21 is a timing chart showing the read operation of the memory system according to the first embodiment.

Details of the read operation of the memory system according to the first embodiment will be described in accordance with the timing chart of FIG. 21. FIG. 21 is a timing chart showing the read operation of the memory system according to the first embodiment.

[Time T1 to Time T2]

To perform the first read operation and the reference read operation (step S1001), the controller 17 brings signal REN1, signal REN2, signal VCLAMP, signal SW1N, signal SW2P, signal SW3N, signal VSFT0 to the "high (H)" level, and brings signal SW1P, signal SW2N, signal SW3P, and signal VSFT1 to the "low (L)" (L<H) level.

Here, the operation of the preamplifier 121 from time T1 to time T2 will be described with reference to FIG. 22. FIG. 22 is a circuit diagram showing the operation of the preamplifier 121 from time T1 to time T2.

As shown in FIG. 22, transistors M3, M4, M6, and M7 are turned on (brought into conduction).

In the first preamplifier 1211, node N1 is grounded via node N2, a bit line (global bit line), a memory cell MC, and a source line (global source line). As a result, the electrical potential of node N1 is lowered, and transistor M1 is turned on. Transistor M1 is driven as a diode-connected transistor.

When transistor M1 is turned on, a cell current (Icell_1st) flows in the memory cell MC via a first current path formed by transistors M1, M3, and M4.

Transistor M2 is driven based on the electrical potential of node N1. Therefore, transistor M2 is turned on in synchronization with transistor M1. Namely, transistors M1 and M2 form a current mirror.

When transistor M2 is turned on, a voltage is transferred to the gate of transistor M5 via transistors M6 and M7. Thus, when transistor M2 is turned on, transistor M5 is turned on. Accordingly, a copy current (Icopy_1st) of the cell current (Icell_1st) flows via a second current path constituted by transistors M2 and M5.

Since transistors M6 and M7 are on, the electrical potential of node N5 is voltage information (signal voltage) V1st based on the copy current (Icopy_1st). This voltage information V1st is the result of the first read operation.

The first current path is electrically separated from the second current path.

As shown in FIG. 22, transistors M10, M11, M14, and M15 are also turned on (brought into conduction). In the second preamplifier 1212, node N8 is grounded via nodes N9 and N10, and the reference cell RC. As a result, the electrical potential of node N8 is lowered, and transistor M12 is turned on. Transistor M12 is driven as a diode-connected transistor.

When transistor M12 is turned on, a reference current (Iref_1st) flows in the reference cell RC via a third current path formed by transistors M12, M14, and M15.

Transistor M13 is driven based on the electrical potential of node N8. Therefore, transistor M13 is turned on in synchronization with transistor M12. Namely, transistors M12 and M13 form a current mirror.

The gate of transistor M16 is coupled to node N5. Therefore, when the electrical potential of node N5 is raised, transistor M16 is turned on. When transistor M16 is turned on, a reference copy current (Icopy_ref) of the reference current (Iref_1st) flows via a fourth current path constituted by transistors M13 and M16.

Since transistors M10 and M11 are on, the electrical potential of node N6 is voltage information (signal voltage) Vref based on the reference copy current (Icopy_ref). This voltage information Vref is the result of the reference read operation.

The third current path is electrically separated from the fourth current path.

[Time T2 to Time T5]

To perform the first sense (step S1002), the controller 17 lowers signal REN1, signal REN2, signal SW1N, signal SW3N to the "L" level, and raises signal SW1P, signal SW3P, and signal SEN2 to the "H" level. The controller 17 also brings signal LATPB to the "H" level, and brings signal LATN and signal SEN to the "L" level.

Here, the operation of the preamplifier 121 from time T2 to time T6 will be described with reference to FIG. 23. FIG. 23 is a circuit diagram showing the operation of the preamplifier 121 from time T2 to time T6.

As shown in FIG. 23, transistors M6 and M7 are turned off (brought out of conduction). Consequently, node N5 is electrically floated (brought into an electrically-floating state). Then, node N5 stores voltage information (signal voltage) V1st. Transistors M10 and M11 are also turned off. Node N6 thereby stores voltage information (signal voltage) Vref. This state is maintained until time T6.

Next, the operation of the sense amplifier 122 from time T2 to time T5 will be described with reference to FIG. 24. FIG. 24 is a circuit diagram showing the operation of the sense amplifier 122 from time T2 to time T5.

As shown in FIG. 24, in the sense amplifier 122, transistors M23, M24, M25, M27, M30, M32, and M33 are turned on.

Transistor M32 supplies current I1st corresponding to voltage V1st.

Transistor M33 supplies current Iref corresponding to Vref.

The controller 17 brings signal SEN to the "H" level at time T3 to turn off transistors M24 and M25, whereby current supply from transistors M24 and M25 is shut off.

Accordingly, the electrical potential of node N21 is determined based on current I1st. The electrical potential of node N22 is determined based on current Iref. Therefore, a voltage difference is created between node N21 and node N22, and is increased at once by positive feedback of transistors M21, M22, M26, and M29.

At time T4, the controller 17 lowers signal LATPB to the "L" level, and raises signal LATN to the "H" level. Transistors M20, M28, and M31 of the sense amplifier 122 are thereby turned on. Accordingly, the difference in electrical potential between signal DO and signal DOB is increased to be as large as the difference between the "H" level and the "L" level.

The sense amplifier 122 thereby determines signal DO and signal DOB.

Subsequently, the controller 17 lowers signal SEN, signal SEN2, and signal LATN to the "L" level at time T5. The controller 17 also raises signal LATPB to the "H" level. The sense amplifier 122 is thereby brought into a sense-enabled state.

[Time T5 to Time T6]

The controller 17 performs the reference write operation (step S1003).

For example, when the memory cell MC has the configuration according to the first example, and the result of the reference read operation is data "1", the operation section 1231 brings signal WTH and signal WT1 to the "H" level, and brings signal WTL and signal WT1B (inversion signal of signal WT1) to the "L" level.

Figure 25:
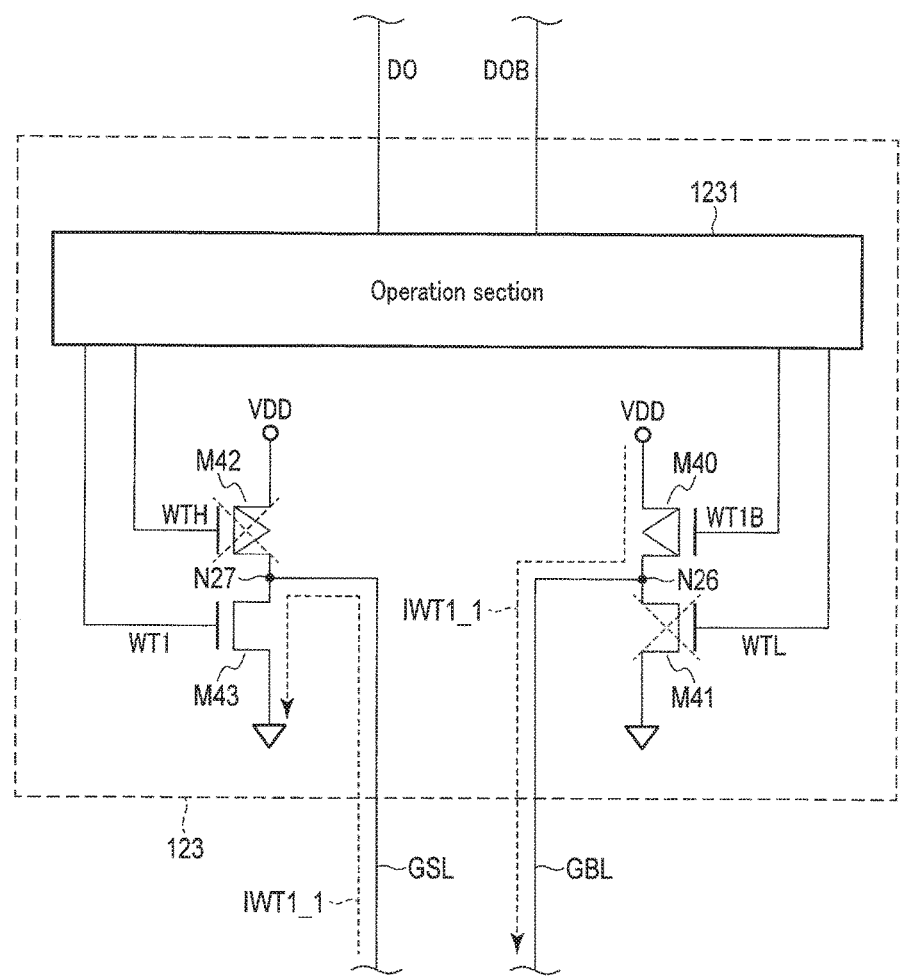
FIG. 25 is a circuit diagram showing the operation of the write driver of the case where the memory cell has the configuration according to the first example, and data "1" is written.

The operation of the write driver 123 of the case where the memory cell MC has the configuration according to the first example and data "1" is written will be described with reference to FIG. 25. FIG. 25 is a circuit diagram showing the operation of the write driver 123 of the case where the memory cell MC has the configuration according to the first example, and data "1" is written.

As shown in FIG. 25, in the write driver 123, transistors M40 and M43 are turned on. Transistor M40 supplies write current IWT1_1 for writing data "1" to the memory cell MC via the global bit line GBL.

The write driver 123 writes data "1" in the memory cell MC.

Next, when the memory cell MC has the configuration according to the first example, and the result of the reference read operation is data "0", the operation section 1231 brings signal WTH and signal WT1 to the "L" level, and brings signal WTL and signal WT1B to the "H" level.

The operation of the write driver 123 of the case where the memory cell MC has the configuration according to the first example and data "0" is written will be described with reference to FIG. 26. FIG. 26 is a circuit diagram showing the operation of the write driver 123 of the case where the memory cell MC has the configuration according to the first example, and data "0" is written.

As shown in FIG. 26, in the write driver 123, transistors M41 and M42 are turned on. Transistor M42 supplies write current IWT1_0 for writing data "0" to the memory cell MC via the global bit line GBL.

The write driver 123 thereby writes data "0" in the memory cell MC.

[Time T6 to Time T7]

To perform the second read operation (step S1004), the controller 17 raises signal REN1 and signal SW2N to the "H" level, and lowers signal SW2P to the "L" level.

Here, the operation of the preamplifier 121 from time T6 to time T7 will be described with reference to FIG. 27. FIG. 27 is a circuit diagram showing the operation of the preamplifier 121 from time T6 to time T7.

As shown in FIG. 27, transistors M3, M4, and M5 are turned on. Node N1 is thereby grounded via node N2, a bit line (global bit line), a memory cell MC, and a source line (global source line). As a result, the electrical potential of node N1 is lowered, and transistor M1 is turned on. Transistor M1 is driven as a diode-connected transistor.

When transistor M1 is turned on, a cell current (Icell_2nd) flows in the memory cell MC via the first current path constituted by transistors M1, M3, and M4.

Furthermore, the electrical potential of node N1 is lowered; therefore, transistor M2 is turned on. The gate electrode of transistor M5 is supplied with voltage V1st. Accordingly, a copy current (Icopy_2nd) of the cell current (Icell_2nd) flows through the second current path constituted by transistors M2 and M5. Transistor M5 operates as a constant current source based on voltage V1st.

[Time T7 to Time T8]

The controller 17 performs a voltage V2nd generation operation (step S1005).

As described above, when the result of the reference read operation is "0", voltage V2nd_0 and voltage V2nd_1e needs to be shifted in the negative direction.

Figure 28:
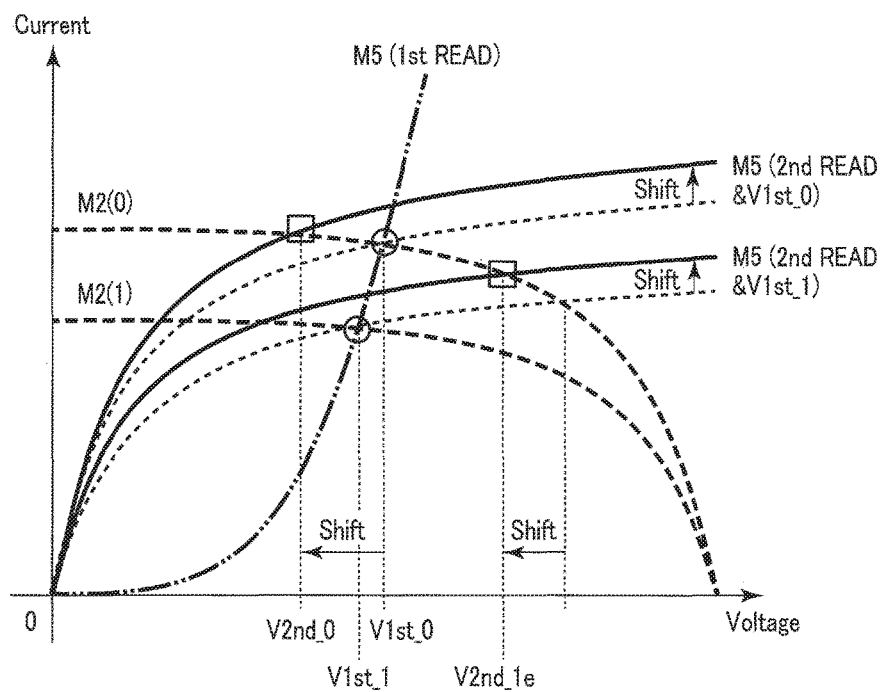
FIG. 28 is a graph showing operation characteristics of the preamplifier based on characteristics of the memory cell.

Here, operation characteristics of the preamplifier 121 based on characteristics of the memory cell of the case where the result of the reference read operation is "0" will be described with reference to FIG. 28. FIG. 28 is a graph showing operation characteristics of the preamplifier 121 based on characteristics of the memory cell.

To shift voltage V2nd_0 and voltage V2nd_1e in the negative direction as shown in FIG. 28, the current flowing in transistor M5 (2nd READ&V1st_1) and current flowing in transistor M5 (2nd READ&V1st_0) may be increased.

Namely, when the result of the reference read operation is "0", the controller 17 brings signal REN1, signal VSFT0 and signal VSFT1 to the "L" level.

Here, the operation of the preamplifier 121 from time T7 to time T8 will be described with reference to FIG. 29. FIG. 29 is a circuit diagram showing the operation of the preamplifier 121 from time T7 to time T8.

As shown in FIG. 29, transistor M17 is turned on. Accordingly, current Isft_0 flows in node N6 via transistor M17.

Voltage V2nd_0 and voltage V2nd_1e are thereby shifted in the negative direction. In this way, voltage V2nd is generated in node N6.

As described above, when the result of the reference read operation is "1", voltage V2nd_1 and voltage V2nd_0e need to be shifted in the positive direction.

Figure 30:
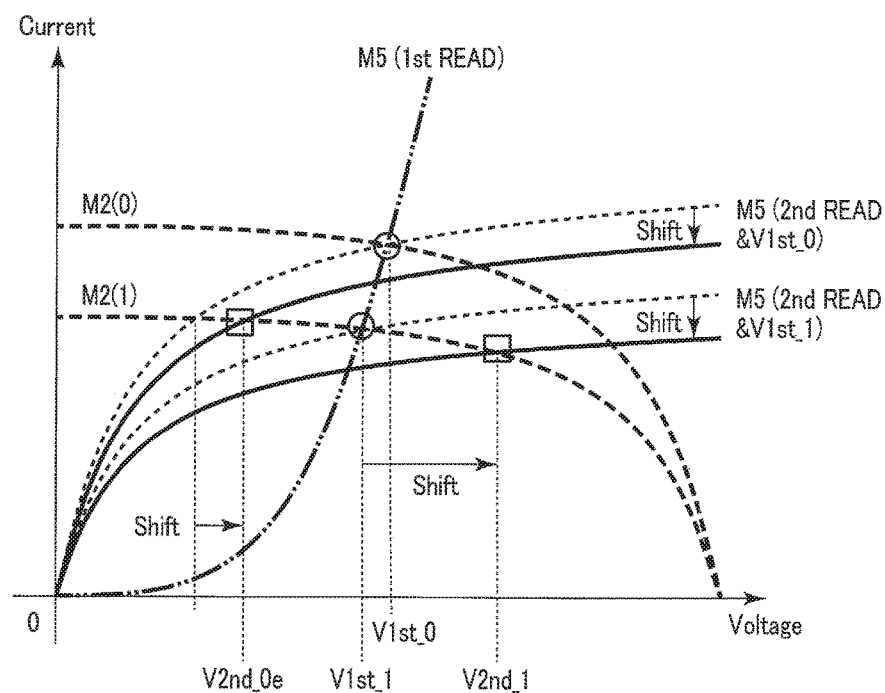
FIG. 30 is a graph showing operation characteristics of the preamplifier based on characteristics of the memory cell.

Here, operation characteristics of the preamplifier 121 based on characteristics of the memory cell in the case where the result of the reference read operation is "1" will be described with reference to FIG. 30. FIG. 30 is a graph showing operation characteristics of the preamplifier 121 based on characteristics of the memory cell.

To shift voltage V2nd_1 and voltage V2nd_0e in the negative direction as shown in FIG. 30, the current flowing in transistor M5 (2nd READ&V1st_1) and current flowing in transistor M5 (2nd READ&V1st_0) may be increased.

Namely, when the result of the reference read operation is "1", the controller 17 brings signal VSFT0 and signal VSFT1 to the "H" level, and brings signal REN1 to the "L" level.

Figure 31:
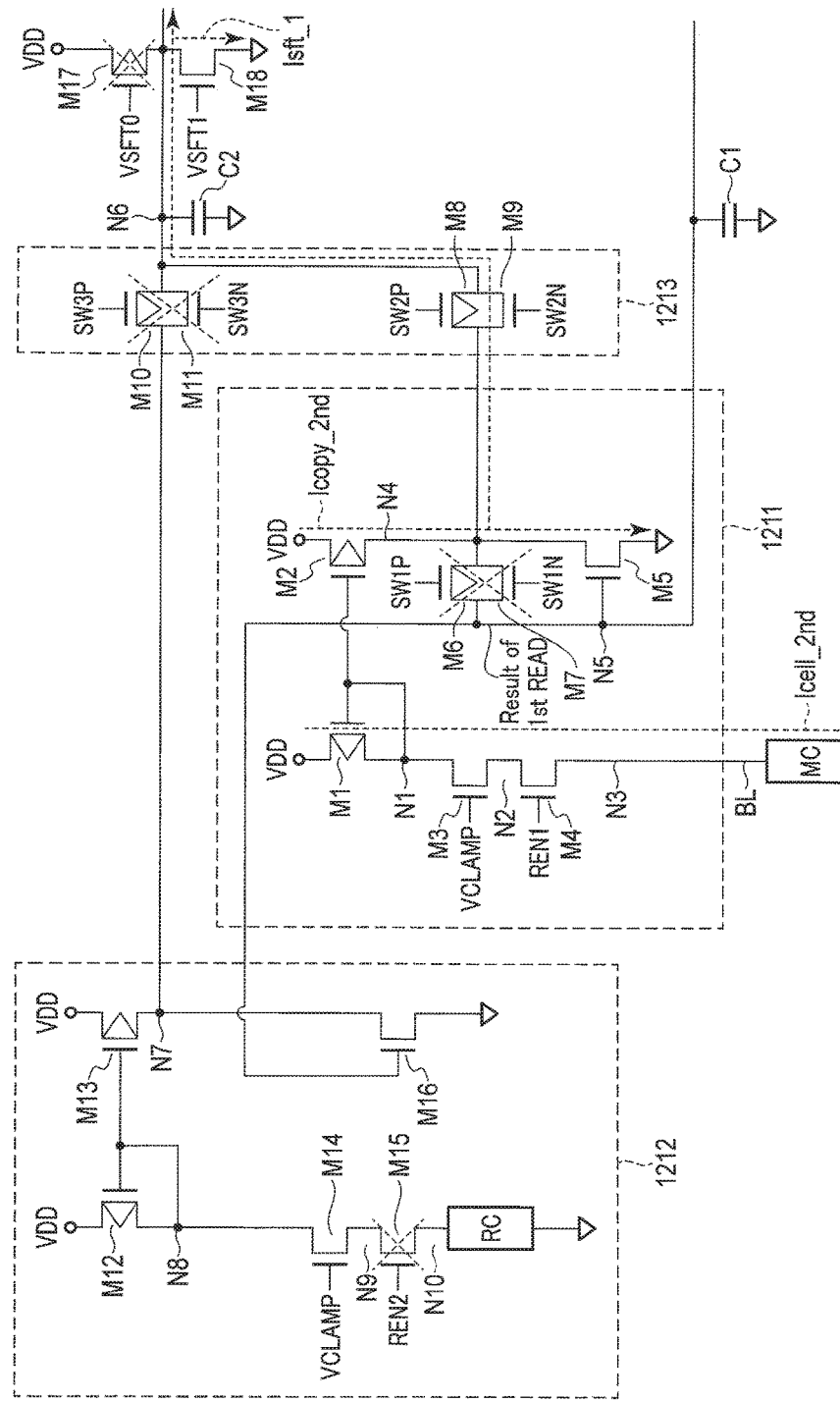
FIG. 31 is a circuit diagram showing the operation of the preamplifier from time T7 to time T8.

Here, the operation of the preamplifier 121 from time T7 to time T8 will be described with reference to FIG. 31. FIG. 31 is a circuit diagram showing the operation of the preamplifier 121 from time T7 to time T8.

As shown in FIG. 31, transistor M18 is turned on. Accordingly, current Isft_1 flows from node N4 via transistor M18.

Consequently, voltage V2nd_1 and voltage V2nd_0e are shifted in the positive direction. In this way, voltage V2nd is generated in node N6.

[After Time T8]

To perform the second sense (step S1006), the controller 17 lowers signal REN1 to the "L" level, and raises signal SEN2 to the "H" level. When the result of the reference read operation is "0", the controller 17 also brings signal VSFT0 to the "H" level. In contrast, when the result of the reference read operation is "1", the controller 17 brings signal VSFT1 to the "L" level.

Next, the operation of the sense amplifier 122 after time T8 will be described with reference to FIG. 32. FIG. 32 is a circuit diagram showing the operation of the preamplifier 122 after time T8.

As shown in FIG. 32, in the sense amplifier 122, transistors M23, M24, M25, M27, M30, M32, and M33 are turned on.

Transistor M32 supplies current I1st corresponding to voltage V1st.

Transistor M33 supplies current I2nd corresponding to voltage V2nd.

The controller 17 brings signal SEN to the "H" level at time T9 to turn off transistors M24 and M25, whereby current supply from transistors M24 and M25 is shut off. Accordingly, the electrical potential of node N21 is determined based on current I1st. The electrical potential of node N22 is determined based on current I2nd. Therefore, a voltage difference is created between node N21 and node N22, and is increased at once by positive feedback of transistors M21, M22, M26, and M29.

At time T9, the controller 17 lowers signal LATPB to the "L" level, and raises signal LATN to the "H" level. Transistors M20, M28, and M31 of the sense amplifier 122 are thereby turned on. Accordingly, the difference in electrical potential between signal DO and signal DOB is increased to be as large as the difference between the "H" level and the "L" level.

The sense amplifier 122 thereby determines signal DO and signal DOB.

<1-3> Advantage

<1-3-1> Outline

According to the above-described embodiment, a reference read operation is performed at the same time as a first read. Based on the reference read operation, a reference write operation is performed. Accordingly, inversion data is written only in the memory cells determined to be error memory cells in the reference read operation.

<1-3-2> Comparative Examples

To facilitate understanding of the above-described embodiment, comparative examples will be described.

<1-3-2-1> Comparative Example 1

Comparative Example 1 will be described with reference to FIGS. 33-35. FIG. 33 is a flowchart showing the read operation of the memory system according to comparative example 1 of the first embodiment. FIG. 34 is a distribution map of cell currents of all memory cells MC included in the memory array. In FIG. 34, the vertical axis indicates the number of memory cells by a logarithm, and the horizontal axis indicates the current value of the current flowing in the memory cell. FIG. 35 illustrates a graph showing operation characteristics of the preamplifier 121 based on characteristics of the memory cell, and a graph showing the relationship between voltage V2nd and the number of memory cells. In the graph showing the relationship between voltage V2nd and the number of memory cells in FIG. 35, the vertical axis indicates the number of memory cells by a logarithm, and the horizontal axis indicates the level of voltage V2nd.

As shown in FIG. 33, the reference read operation as in step S1001 described in the first embodiment is not performed in Comparative Example 1.

In Comparative Example 1, a "0" write operation ("0" WRITE), not the reference write operation based on the result of the reference read operation as in step S1003 described in the first embodiment, is performed.

In this case, as shown in FIG. 34, all the memory cells MC subjected to step S2001 take the "0" state. Accordingly, all the memory cells MC store data "0" in Comparative Example 1.

In Comparative Example 1, there are two types of voltage information (signal voltage) V2nd. The first type of voltage information (signal voltage) V2nd is voltage information (signal voltage) V2nd_0, which means that the memory cell stores data "0" in the first read, and stores data "0" in the second read. The second type of voltage information (signal voltage) V2nd is voltage information (signal voltage) V2nd_1e, which means that the memory cell stores data "1" in the first read, and stores data "0" in the second read.

The number of memory cells MC of voltage V2nd_0 is nearly equal to the number of memory cells MC of voltage V2nd_1e in Comparative Example 1.

Therefore, as shown in FIG. 35, the distribution of memory cells MC of voltage V2nd_0 has a similar shape to the distribution of memory cells MC of voltage V2nd_1e. For example, the margin between the end of the distribution of memory cells MC of voltage V2nd_0 and the end of the distribution of memory cells MC of voltage V2nd_1e is voltage dVC1.

In contrast, in the above-described embodiment, memory cells MC of voltage V2nd_1e are error 2 memory cells MC. The number of error 2 memory cells MC is not large. Therefore, the distribution of memory cells MC of voltage V2nd_1e is smaller than the distribution of memory cells MC of voltage V2nd_0. Thus, the margin between the end of the distribution of memory cells MC of voltage V2nd_0 and the end of the distribution of memory cells MC of voltage V2nd_1e is voltage dVE1 (sVC1<dVE1) wider than in Comparative Example 1 by voltage dV1.

Therefore, in the above-described embodiment, the margin between voltage V2nd_0 and voltage V2nd_1e is wider than in Comparative Example 1.

In addition, in Comparative Example 1, a "0" write operation is performed. This destroys data of the memory cells MC storing data "1". Consequently, in Comparative Example 1, data needs to be written back to those memory cells MC after the read operation.

However, in the above-described embodiment, different data is written only in error memory cells. Therefore, an electric power for writing back data in memory cells MC is lower than in Comparative Example 1.

<1-3-2-2> Comparative Example 2

Comparative Example 2 will be described with reference to FIGS. 36-38. FIG. 36 is a flowchart showing the read operation of the memory system according to Comparative Example 2 of the first embodiment. FIG. 37 is a distribution map of cell currents of all memory cells included in the memory array. In FIG. 37, the vertical axis indicates the number of memory cells by a logarithm, and the horizontal axis indicates the current value of the current flowing in the memory cell. FIG. 38 illustrates a graph showing operation characteristics of the preamplifier 121 based on characteristics of the memory cell, and a graph showing the relationship between voltage V2nd and the number of memory cells. In the graph showing the relationship between voltage V2nd and the number of memory cells in FIG. 38, the vertical axis indicates the number of memory cells by a logarithm, and the horizontal axis indicates the level of voltage V2nd.

As shown in FIG. 36, the reference read operation as in step S1001 described in the first embodiment is not performed in Comparative Example 2.

In Comparative Example 2, a "1" write operation ("1" WRITE), not the reference write operation based on the result of the reference read operations as in step S1003 described in the first embodiment, is performed.

In this case, as shown in FIG. 37, all of the memory cells MC subjected to step S3001 take the "1" state. Accordingly, all of the memory cells MC store data "1" in Comparative Example 2.

In Comparative Example 2, there are two types of voltage information (signal voltage) V2nd. The first type of voltage information (signal voltage) V2nd is voltage information (signal voltage) V2nd_1, which means that the memory cell stores data "1" in the first read, and stores data "1" in the second read. The second type of voltage information (signal voltage) V2nd is voltage information (signal voltage) V2nd_0e, which means that the memory cell stores data "0" in the first read, and stores data "1" in the second read.

The number of memory cells MC of voltage V2nd_1 is nearly equal to the number of memory cells MC of voltage V2nd_0e in Comparative Example 2.

Therefore, as shown in FIG. 38, the distribution of memory cells MC of voltage V2nd_1 has a similar shape to the distribution of memory cells MC of voltage V2nd_0e. For example, the margin between the end of the distribution of memory cells MC of voltage V2nd_1 and the end of the distribution of memory cells MC of voltage V2nd_0e is voltage dVC2.

In contrast, in the above-described embodiment, memory cells MC of voltage V2nd_0e are error 1 memory cells MC. The number of error 1 memory cells MC is not large. Therefore, the distribution of memory cells MC of voltage V2nd_0e is smaller than the distribution of memory cells MC of voltage V2nd_1. Thus, the margin between the end of the distribution of memory cells MC of voltage V2nd_1 and the end of the distribution of memory cells MC of voltage V2nd_0e is voltage dVE2 (dVC2<dVE2) wider than in Comparative Example 2 by voltage dV2.

Therefore, in the above-described embodiment, the margin between voltage V2nd_1 and voltage V2nd_0e is wider than in Comparative Example 2.

In addition, in Comparative Example 2, a "1" write operation is performed. This destroys data of the memory cells MC storing data "0". Consequently, in Comparative Example 2, data needs to be written back to the memory cells MC after the read operation.

However, in the above-described embodiment, different data is written only in error memory cells. Therefore, the electric power for writing back data in memory cells MC is lower than in Comparative Example 2.

<1-3-3> Conclusion

As described above, according to the first embodiment, a reference write operation is performed based on a reference read operation. Therefore, in memory cells determined to be error memory cells in the reference read operation, data different from the one originally stored is stored. In addition, the number of memory cells determined to be error memory cells is not large. Therefore, the distribution of voltage V2nd concerning error memory cells is not wide. As a result, a sufficient margin for reading can be secured.

Moreover, in the above-described embodiment, different data is written back only in the error memory cells; therefore, the electric power for writing back data in memory cells MC can be reduced.

<1-4> Modification 1 of First Embodiment

Described in the first embodiment is the case where the memory cell MC has the configuration according to the first example. However, the first embodiment is also applicable to the case where the memory cell MC has the configuration according to the second example.

Figure 39:
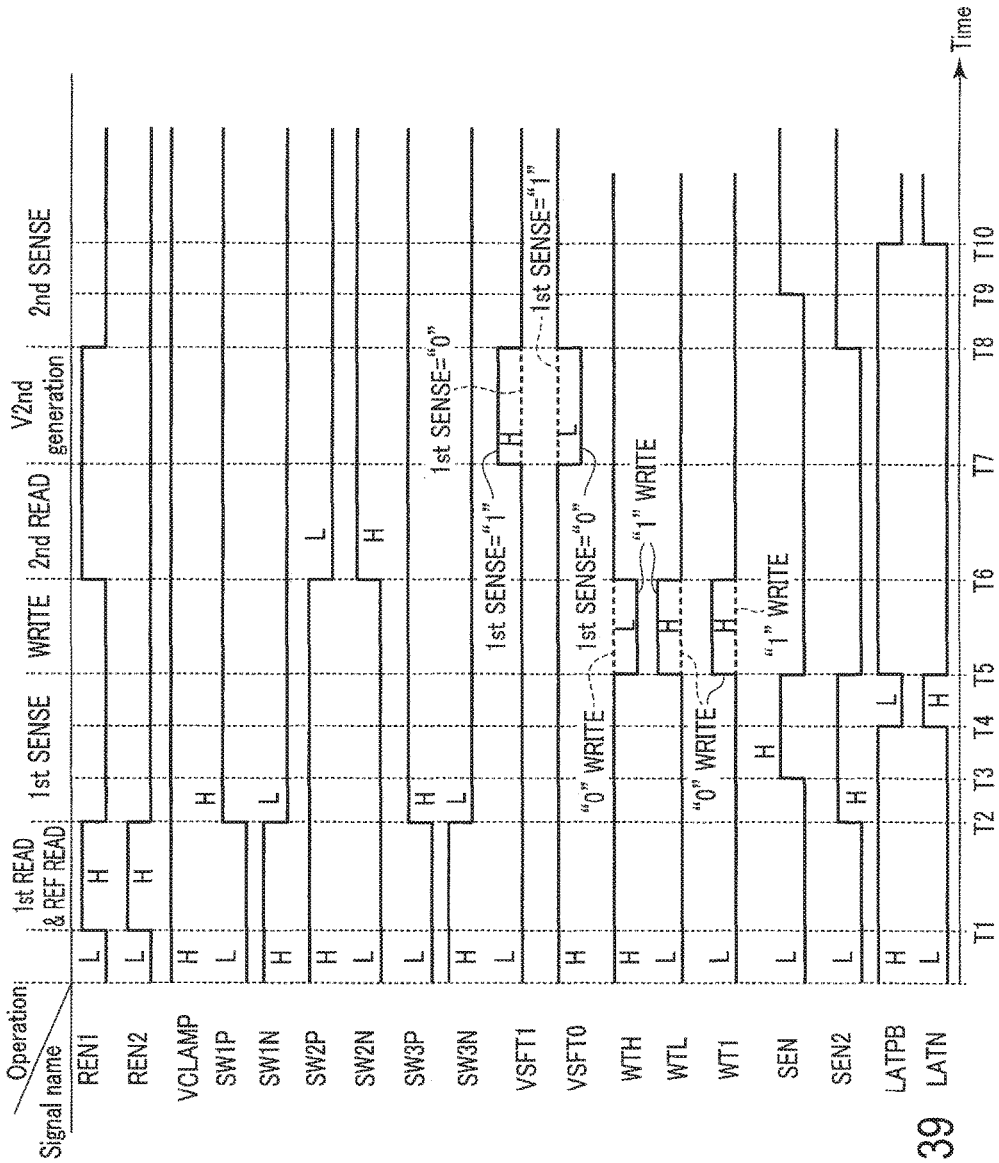
FIG. 39 is a timing chart showing the read operation of the memory system according to Modification 1 of the first embodiment.

Modification 1 of the first embodiment in which the memory cell MC has the configuration according to the second example will be described with reference to FIG. 39. FIG. 39 is a timing chart showing the read operation of the memory system according to Modification 1 of the first embodiment. In the following description, only the matters different from the first embodiment will be described.

As shown in FIG. 39, the controller 17 performs the reference write operation (step S1003) from time T5 to time T6.

For example, when the memory cell MC has the configuration according to the second example, and the result of the reference read operation is data "1", the operation section 1231 brings signal WTH and signal WT1 to the "L" level, and brings signal WTL and signal WT1B to the "H" level.

The operation of the write driver 123 of the case where the memory cell MC has the configuration according to the second example and data "1" is written will be described with reference to FIG. 40. FIG. 40 is a circuit diagram showing the operation of the write driver 123 of the case where the memory cell MC has the configuration according to the second example and data "1" is written.

As shown in FIG. 40, in the write driver 123, transistors M41 and M42 are turned on. Transistor M42 supplies write current IWT2_1 for writing data "1" to the memory cell MC via the global bit line GBL.

The write driver 123 thereby writes data "1" in the memory cell MC.

When the memory cell MC has the configuration of the second example, and the result of the reference read operation is data "0", the operation section 1231 brings signal WTH and signal WT1 to the "H" level, and brings signal WTL and signal WT1B to the "L" level.

The operation of the write driver 123 of the case where the memory cell MC has the configuration according to the second example and data "0" is written will be described with reference to FIG. 41. FIG. 41 is a circuit diagram showing the operation of the write driver 123 of the case where the memory cell MC has the configuration according to the second example and data "0" is written.

As shown in FIG. 41, in the write driver 123, transistors M40 and M43 are turned on. Transistor M40 supplies write current IWT2_0 for writing data "0" to the memory cell MC via the global bit line GBL.

The write driver 123 thereby writes data "0" in the memory cell MC.

As described above, the same advantage as the first embodiment can be performed in the case where the memory cell MC has the configuration of the second example.

<1-5> Modification 2 of First Embodiment

In the first embodiment, the same data as that read in the reference read operation is overwritten in the memory cell MC. However, inversion data of data read in the reference read operation may be overwritten in the memory cell MC.

Described below is Modification 2 of the first embodiment in which inversion data of data read in the reference read operation is overwritten in the memory cell MC. Descriptions of the parts that are the same as those of the first embodiment will be omitted.

<1-5-1> Operation

Figure 43:
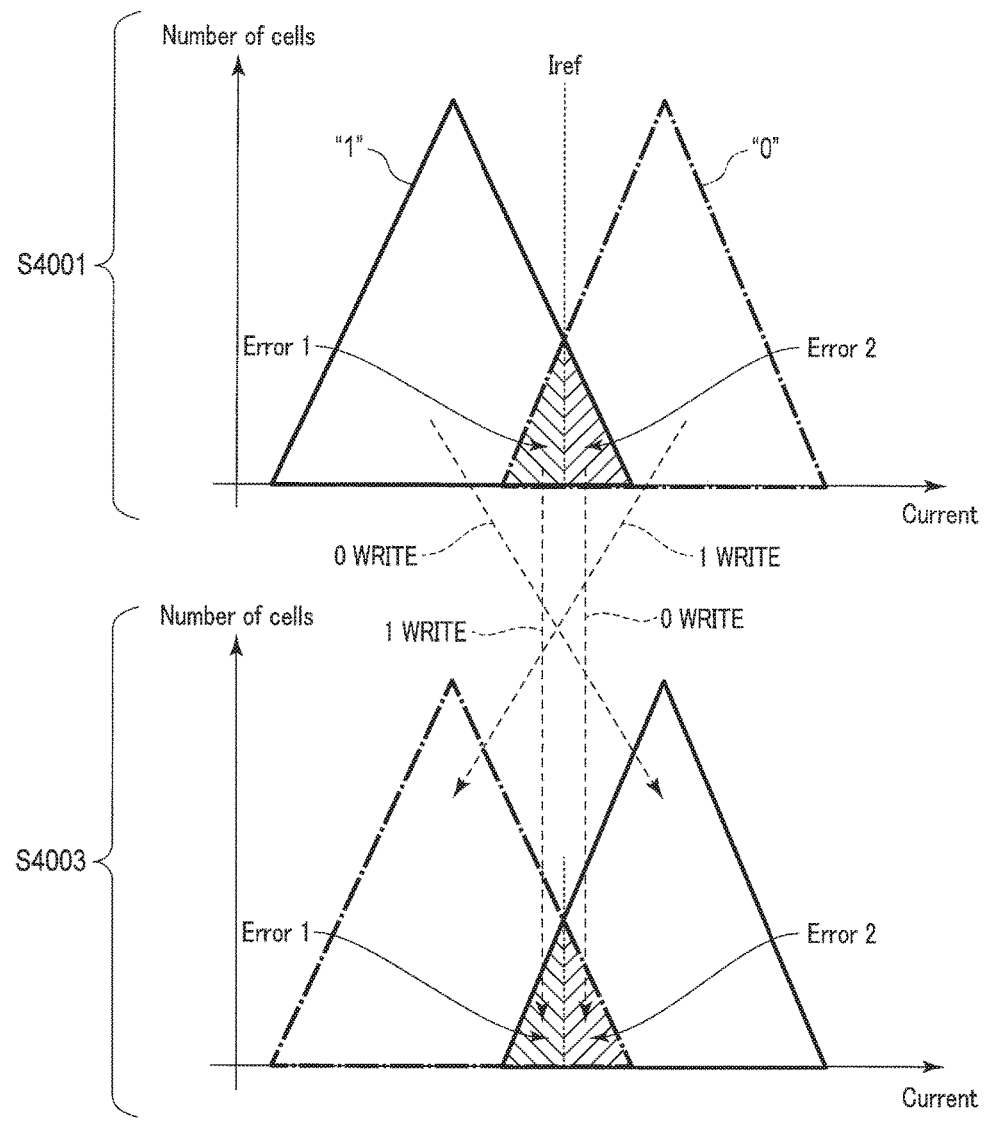
FIG. 43 is a distribution map of cell currents of all memory cells included in the memory array.
Figure 44:
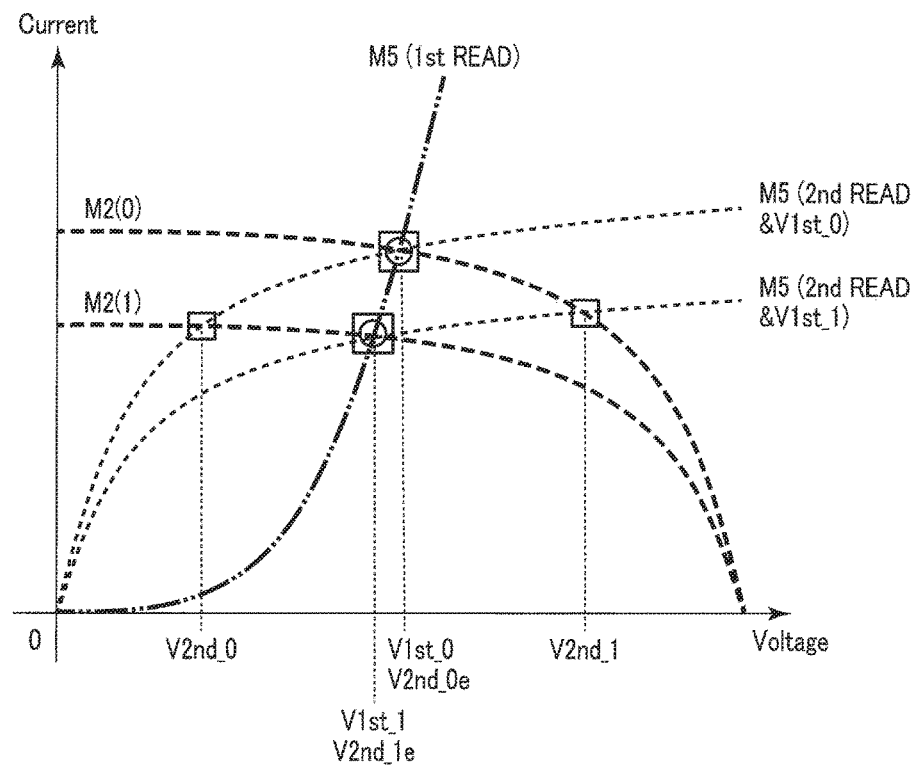
FIG. 44 is a graph showing operation characteristics of the preamplifier based on characteristics of the memory cell.
Figure 45:
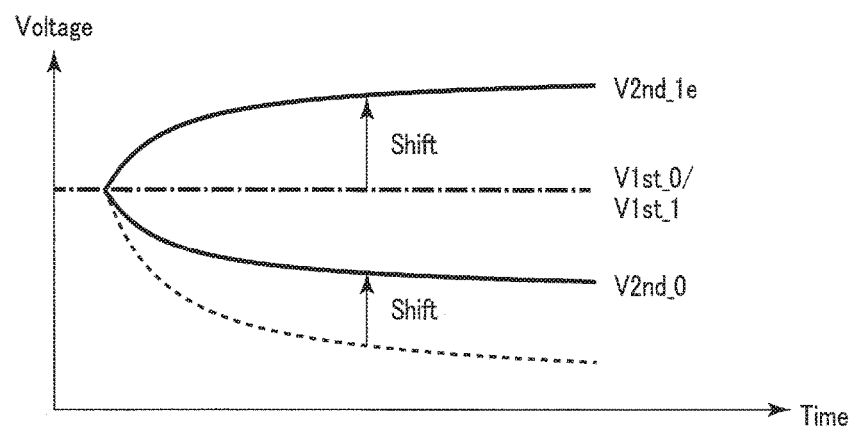
FIG. 45 is a diagram showing the relationship between voltage V1st and voltage V2nd.

A read operation of the memory system according to Modification 2 of the first embodiment will be described with reference to FIGS. 42-46. FIG. 42 is a flowchart showing the read operation of the memory system according to Modification 2 of the first embodiment. FIG. 43 is a distribution map of cell currents of all memory cells included in the memory array. FIG. 44 is a graph showing operation characteristics of the preamplifier 121 based on characteristics of the memory cell. FIG. 45 is a diagram showing the relationship between voltage V1st and voltage V2nd. FIG. 46 is a diagram showing the relationship between voltage V1st and voltage V2nd.

[Step S4003]

The memory device 10 performs an operation (WRITE) to write inversion data of data obtained by the reference read operation onto the memory cells subjected to step S4001. The memory cells subjected to step S4001 are thereby overwritten with inversion data of data obtained by the reference read operation.

Specifically, in the memory cells determined to be error memory cells by the reference read operation, the same data as the one originally stored is stored as shown in FIG. 43. In the memory cells not determined to be error memory cells by the reference read operation, data different from the one originally stored is stored.

The operation characteristics of the preamplifier 121 based on characteristics of the memory cell will be described with reference to FIG. 44. FIG. 44 is a graph showing operation characteristics of the preamplifier 121 based on characteristics of the memory cell.

FIG. 44 also shows the relationship between characteristics (M2(0)) of transistor M2 of the case where the memory cell stores "0" and characteristics (M5(2nd READ&V1st_0)) of transistor M5 storing voltage V1st_0 in the second read. Therefore, the intersection between M2(0) and M5(2nd READ&V1st_0) in FIG. 18 indicates voltage information (signal voltage) V2nd_0e, which means that the memory cell stores data "0" in the first read and stores data "0" in the second read.

The meaning of voltage information (signal voltage) V2nd_0e will be more specifically described. When a memory cell stores data "0", but is positioned in the distribution of the "1" state (at a position where the current value is smaller than Iref) in step S4001 (error 1 in FIG. 18), the memory cell MC is determined in error as being in the "1" state in the reference read operation. The memory cell MC in the "0" state is then overwritten to take the "0" state in step S4003. Namely, voltage information (signal voltage) V2nd_0e means that the memory cell MC is an error 1 memory cell.

FIG. 44 also shows the relationship between characteristics (M2(1)) of transistor M2 of the case where the memory cell stores "1" and characteristics (M5(2nd READ&V1st_1)) of transistor M5 storing voltage V1st_1 in the second read. Therefore, the intersection between M2(1) and M5(2nd READ&V1st_1) in FIG. 44 indicates voltage information (signal voltage) V2nd_1e, which means that the memory cell stores data "1" in the first read and stores data "1" in the second read.

The meaning of voltage information (signal voltage) V2nd_1e will be more specifically described. When a memory cell stores data "1", but is positioned in the distribution of the "0" state (at a position where the current value is larger than Iref) in step S4001 (error 2 in FIG. 18), the memory cell MC is determined in error as being in the "0" state in the reference read operation. The memory cell MC in the "1" state is then overwritten to take the "1" state in step S4003. Namely, voltage information (signal voltage) V2nd_1e means that the memory cell MC is an error 2 memory cell.

FIG. 44 also shows the relationship between characteristics (M2(0)) of transistor M2 of the case where the memory cell stores "0" and characteristics (M5(2nd READ&V1st_1)) of transistor M5 storing voltage V1st_1 in the second read. Therefore, the intersection between M2(0) and M5(2nd READ&V1st_1) in FIG. 44 indicates voltage information (signal voltage) V2nd_1, which means that the memory cell stores data "1" in the first read and stores data "0" in the second read.

As described above, inversion data is stored in step S4003 after step S4001 in Modification 2 of the first embodiment. Therefore, voltage V2nd_1 means that the memory cell MC is not an error memory cell.

FIG. 44 also shows the relationship between characteristics (M2(1)) of transistor M2 of the case where the memory cell stores "1" and characteristics (M5(2nd READ&V1st_0)) of transistor M5 storing voltage V1st_0 in the second read. Therefore, the intersection between M2(1) and M5(2nd READ&V1st_0) in FIG. 44 indicates voltage information (signal voltage) V2nd_0, which means that the memory cell stores data "0" in the first read and stores data "1" in the second read.

As described above, inversion data is stored in step S4003 after step S4001 in Modification 2 of the first embodiment. Therefore, voltage V2nd_0 means that the memory cell MC is not an error memory cell.

In step S4006, voltage V1st is compared with voltage V2nd to determine data. As shown in FIG. 44, voltage V1st_0 is almost the same as voltage V2nd_0e. Voltage V1st_0 cannot be directly compared with voltage V2nd_0e. Voltage V1st_1 is also almost the same as voltage V2nd_1e. Voltage V1st_1 cannot be directly compared with voltage V2nd_1e.

Meanwhile, the controller 17 cannot receive the result of the first read operation until step S1006 ends. However, the controller 17 is in receipt of the result of the reference read operation.

In the present embodiment, voltage V2nd_0e or voltage V2nd_1e is shifted using the result of the reference read operation.

When the result of the reference read operation is "0", two cases are conceivable. One is the case where the memory cell MC stores data "0" in step S4001, and is determined as storing data "0" in the reference read (case E), and the other is the case where the memory cell MC stores data "1" in step S4001, and is determined as storing data "0" in the reference read (case F).

Namely, when the result of the reference read operation is "0", voltage V1st_0 is compared with voltage V2nd_0 (case E), and voltage V1st_1 is compared with voltage V2nd_1e (case F). In this case, data can be determined by shifting voltage V2nd_0 and voltage V2nd_1e in the positive direction as shown in FIG. 45. Namely, upon receipt of data "0" as a result of the reference read operation in step S4002, the controller 17 generates voltage V2nd by shifting voltage. V2nd_0 and voltage V2nd_1e in the positive direction in step S4005.

When the result of the reference read operation is "0", the controller 17 can determine data by comparing current I1st based on voltage V1st with current I2nd based on voltage V2nd. Specifically, in the case where the result of the reference read operation is "0", when current I1st is larger than current I2nd, the controller 17 can determine that the present case is case E. Namely, the controller 17 can determine that data that was stored in the memory cell MC is "0". In the case where the result of the reference read operation is "0", when current I1st is smaller than current I2nd, the controller 17 can determine that the present case is case F. Namely, the controller 17 can determine that data that was stored in the memory cell MC is "1".

When the result of the reference read operation is "1", two cases are conceivable. One is the case where the memory cell MC stores data "1" in step S4001, and is determined as storing data "1" in the reference read (case G), and the other is the case where the memory cell MC stores data "0" in step S4001, and is determined as storing data "1" in the reference read (case H).

Namely, when the result of the reference read operation is "1", voltage V1st_1 is compared with voltage V2nd_1 (case G), and voltage V1st_0 is compared with voltage V2nd_0e (case H). In this case, as shown in FIG. 46, data can be determined by shifting voltage V2nd_1 and voltage V2nd_0e in the negative direction. Namely, upon receipt of data "1" as a result of the reference read operation in step S4002, the controller 17 generates voltage V2nd by shifting voltage V2nd_1 and voltage V2nd_0e in the negative direction in step S4005. The method for generating voltage V2nd will be described later.

When the result of the reference read operation is "1", the controller 17 can determine data by comparing current I1st based on voltage V1st with current I2nd based on voltage V2nd. Specifically, in the case where the result of the reference read operation is "1", when current I1st is larger than current I2nd, the controller 17 can determine that the present case is case H. Namely, the controller 17 can determine that data that was stored in the memory cell MC is "0". In the case where the result of the reference read operation is "1", when current I1st is smaller than current I2nd, the controller 17 can determine that the present case is case G. Namely, the controller 17 can determine that data that was stored in the memory cell MC is "1".

<1-5-2> Advantage

<1-5-2-1> Advantage 1

As described above, Modification 2 of the first embodiment is the same as the first embodiment except that inversion data of the reference read result is written.

Therefore, Modification 2 of the first embodiment can provide a wider margin than in Comparative Examples 1 and 2 of the first embodiment, for example.

The relationship between Modification 2 of the first embodiment and Comparative Example 1 of the first embodiment will be described with reference to FIG. 47. FIG. 47 illustrates a graph showing operation characteristics of the preamplifier 121 based on characteristics of the memory cell, and a graph showing the relationship between voltage V2nd and the number of memory cells.

As shown in FIG. 47, the memory cells MC of voltage V2nd_0e are error 1 memory cells MC in Modification 2 of the first embodiment. The number of error 1 memory cells MC is not large. Therefore, the distribution of memory cells MC of voltage V2nd_0e is smaller than the distribution of memory cells MC of voltage V2nd_1. Thus, the margin between the end of the distribution of memory cells MC of voltage V2nd_1 and the end of the distribution of memory cells MC of voltage V2nd_0e is voltage dVE1 (sVC1<dVE1) wider than in Comparative Example 1 by voltage dV1.

Therefore, Modification 2 of the first embodiment can provide a wider margin between voltage V2nd_1 and voltage V2nd_0e than in Comparative Example 1.

Figure 48:
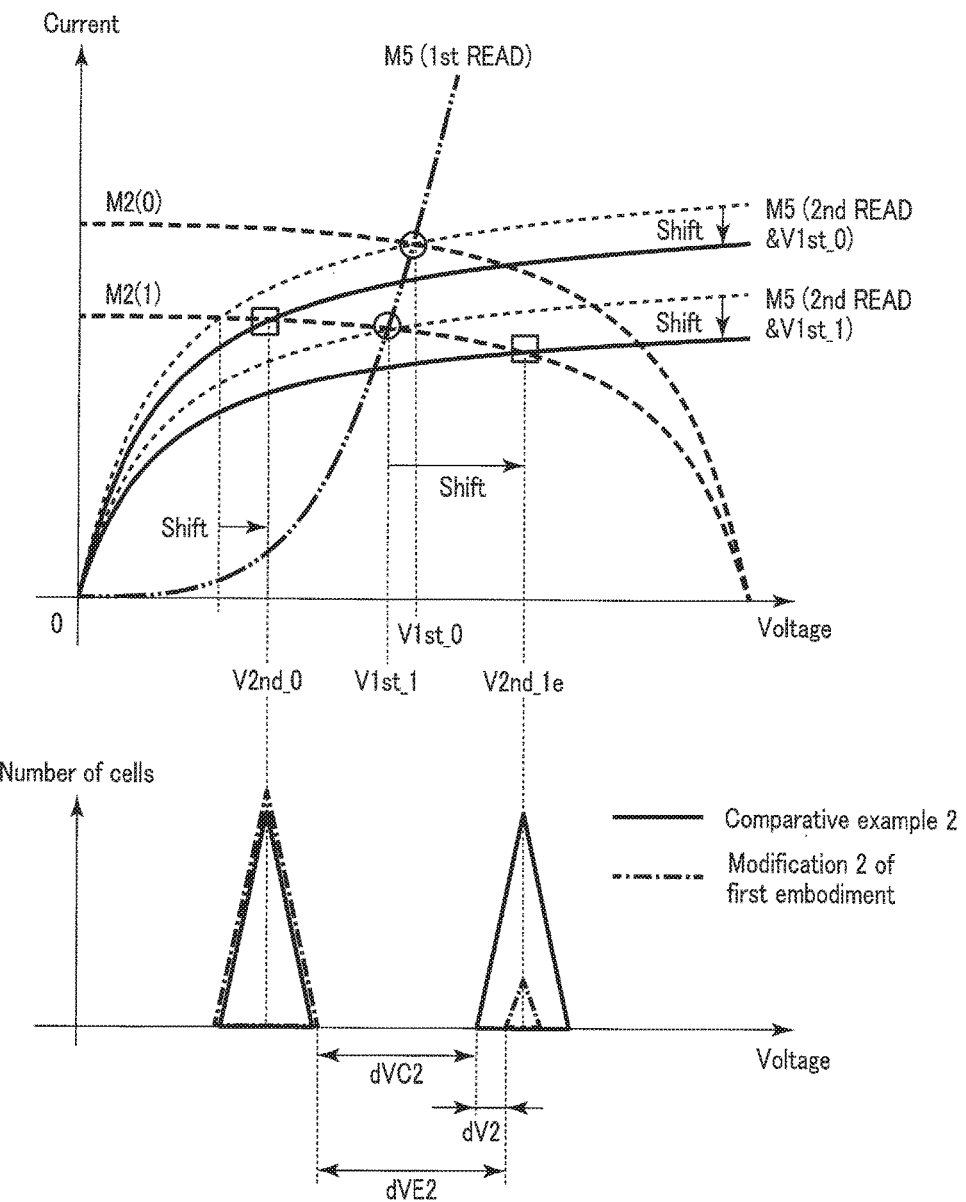
FIG. 48 illustrates a graph showing operation characteristics of the preamplifier based on characteristics of the memory cell, and a graph showing the relationship between voltage V2nd and the number of memory cells.

The relationship between Modification 2 of the first embodiment and Comparative Example 2 of the first embodiment will be described with reference to FIG. 48. FIG. 48 illustrates a graph showing operation characteristics of the preamplifier 121 based on characteristics of the memory cell, and a graph showing the relationship between voltage V2nd and the number of memory cells.

As shown in FIG. 48, the memory cells MC of voltage V2nd_1e are error 2 memory cells MC in Modification 2 of the first embodiment. The number of error 2 memory cells MC is not large. Therefore, the distribution of memory cells MC of voltage V2nd_1e is smaller than the distribution of memory cells MC of voltage V2nd_0. Thus, the margin between the end of the distribution of memory cells MC of voltage V2nd_0 and the end of the distribution of memory cells MC of voltage V2nd_1e is voltage dVE2 (sVC2<dVE2) wider than in Comparative Example 2 by voltage dV2.

Therefore, Modification 2 of the first embodiment can provide a wider margin between voltage V2nd_0 and voltage V2nd_1e than in Comparative Example 2.

As a result, Modification 2 of the first embodiment can perform the same advantage as the first embodiment.

<1-5-2-2> Advantage 2

Figure 49:
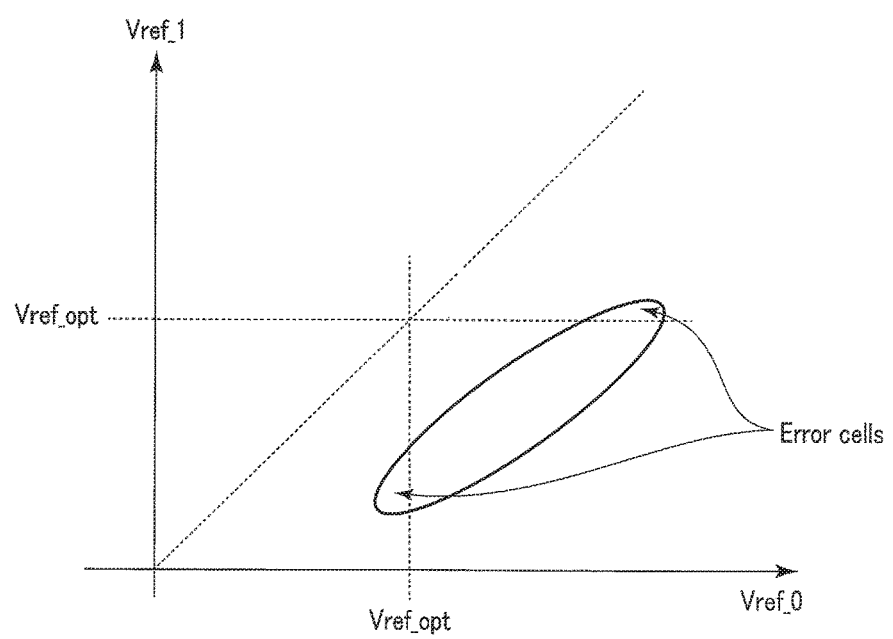
FIG. 49 shows magnetoresistance (MR) characteristics of memory cells.
Figure 50:
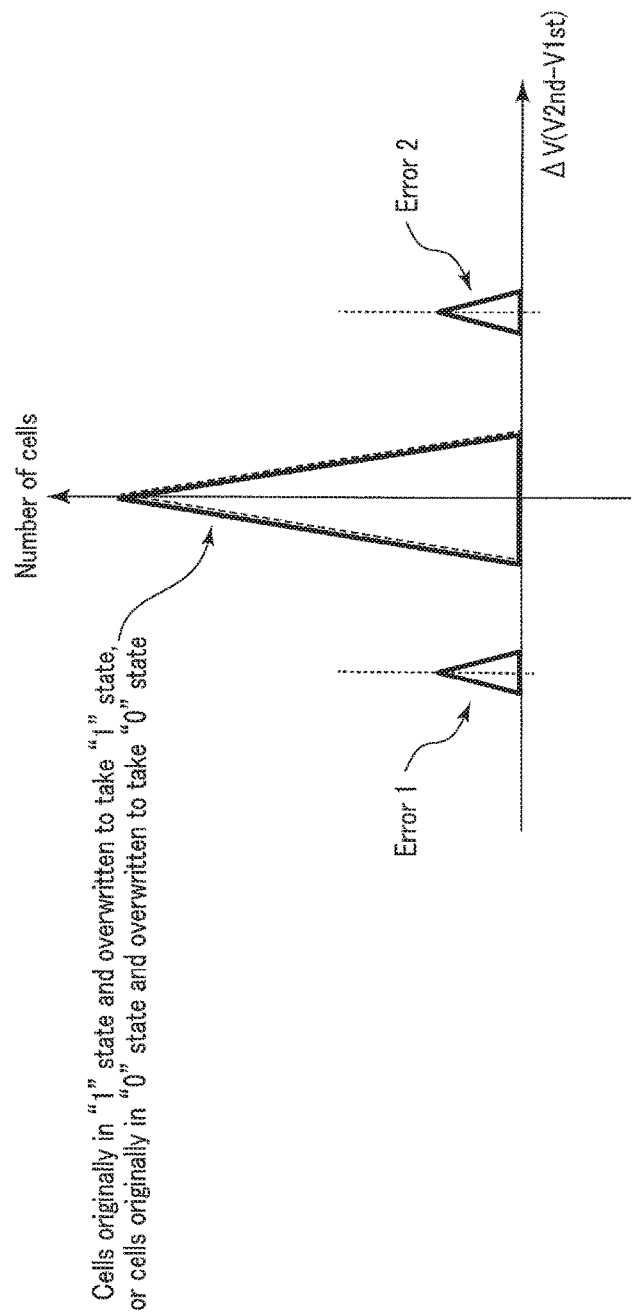
FIG. 50 is a diagram showing the relationship between (voltage V2nd-voltage V1st) and the number of cells.
Figure 51:
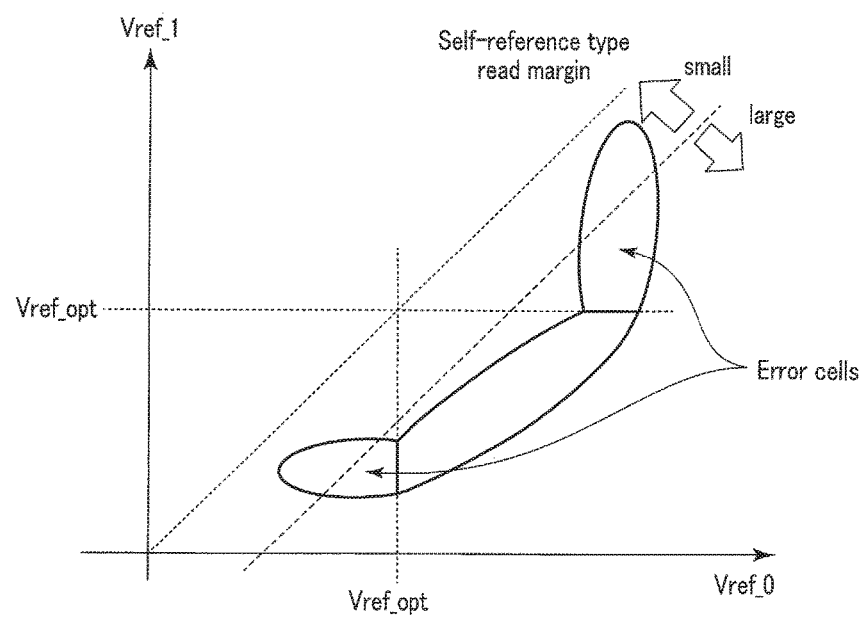
FIG. 51 shows magnetoresistance (MR) characteristics of memory cells.

Advantage 2 will be described with reference to FIGS. 49-53. FIG. 49 shows magnetoresistance (MR) characteristics of memory cells. FIG. 50 is a diagram showing the relationship between (voltage V2nd-voltage V1st) and the number of cells. FIG. 51 shows magnetoresistance (MR) characteristics of memory cells. FIGS. 52 and 53 each show the relationship between (voltage V2nd-voltage V1st) and the number of cells.

When memory cells included in the MAT (or a read unit page) are those having normal characteristics as shown in FIG. 49, the distributions after the reference write operation are as shown in FIG. 50.

However, memory cells included in the MAT (or a read unit page) may be those having low MR characteristics, as shown in FIG. 51.

In this case, when data is written based on the reference read operation as described in the first embodiment, the distributions as shown in FIG. 52 are obtained. In the case of the distributions shown in FIG. 52, each margin between distributions is narrow.

By writing inversion data of the data of the reference read result in memory cells as described in Modification 2 of the first embodiment, the distributions as shown in FIG. 53 can be obtained.

A sufficient margin can thereby be secured in comparison with the case of FIG. 52.

<2> Second Embodiment

The second embodiment will be described. Described in the first embodiment is the method for performing a sense by shifting voltage V2nd. In the second embodiment, the case of shifting a current in the sense amplifier without shifting voltage V2nd will be described. The basic configuration and basic operation of the memory system according to the second embodiment are the same as those of the memory system according to the above-described first embodiment. Thus, descriptions of matters described in the first embodiment and matters easily inferable from the first embodiment will be omitted.

<2-1> Configuration

<2-1-1> Configuration of Preamplifier

Next, details of the preamplifier 121 of the memory device according to the second embodiment will be described with reference to FIG. 54. FIG. 54 is a circuit diagram of the preamplifier 121 of the memory device according to the second embodiment.

Unlike the preamplifier 121 of the memory device according to the first embodiment, the preamplifier 121 of the memory device according to the second embodiment does not include transistors M17 and M18 for shifting voltage V2nd, as shown in FIG. 54.

<2-1-2> Configuration of Sense Amplifier

Figure 55:
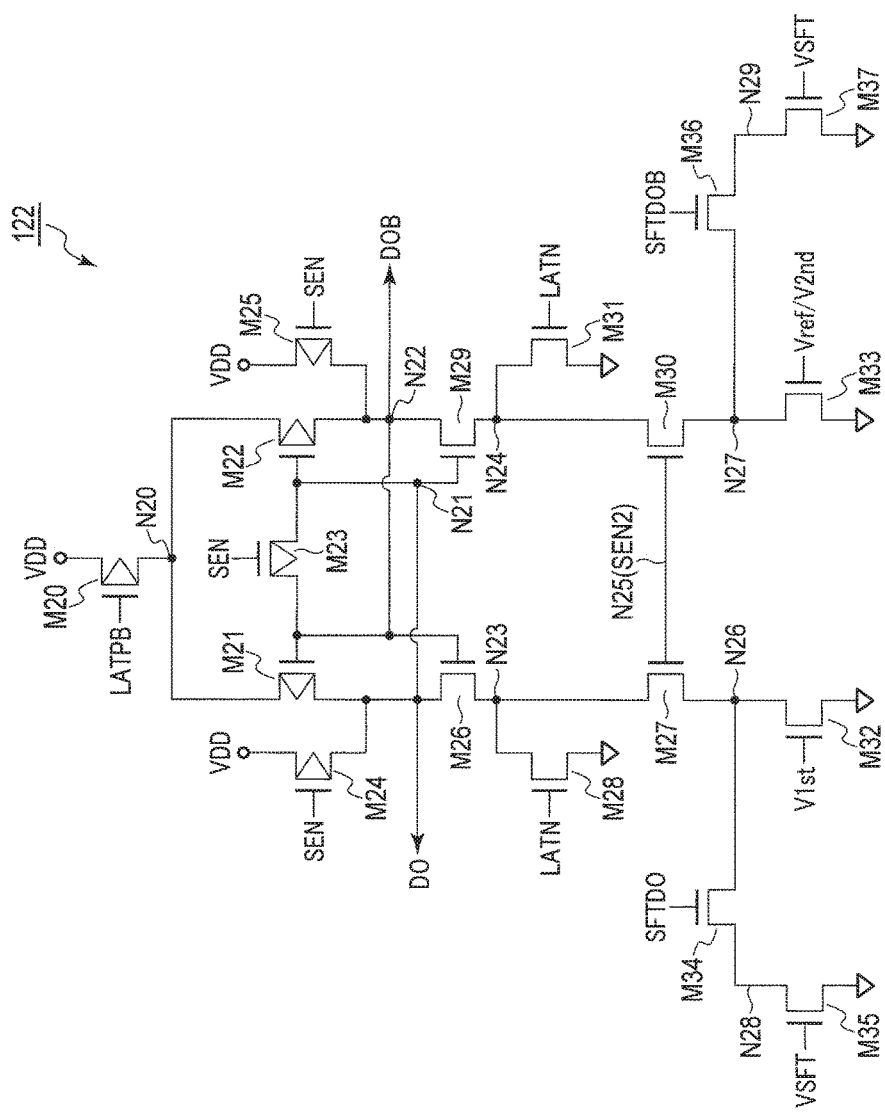
FIG. 55 is a circuit diagram of the sense amplifier of the memory device according to the second embodiment.

Next, a configuration of the sense amplifier 122 of the memory device according to the second embodiment will be described with reference to FIG. 55. FIG. 55 is a circuit diagram of the sense amplifier 122 of the memory device according to the second embodiment.

As shown in FIG. 55, the sense amplifier 122 of the memory device according to the second embodiment includes NMOS transistors M34, M35, M36, and M37, in addition to the transistors included in the sense amplifier 122 of the memory device according to the first embodiment.

One end of transistor M34 is coupled to node N26, the other end thereof is coupled to node N28, and the gate electrode thereof is supplied with signal SFTDO.

One end of transistor M35 is coupled to node N28, the other end thereof is supplied with the reference voltage VSS, and the gate electrode thereof is supplied with signal VSFT.

One end of transistor M36 is coupled to node N27, the other end thereof is coupled to node. N29, and the gate electrode thereof is supplied with signal SFTDOB.

One end of transistor M37 is coupled to node N29, the other end thereof is supplied with the reference voltage VSS, and the gate electrode thereof is supplied with signal VSFT.

The operation of the sense amplifier 122 will be described later.

<2-2> Read Operation

<2-2-1> Outline of Read Operation

The outline of the read operation of the memory system according to the second embodiment will be described with reference to FIG. 56. FIG. 56 is a flowchart showing the read operation of the memory system according to the second embodiment.

[Step S5001 to Step S5003]

The operation from step S5001 to step S5003 is the same as the operation from step S1001 to Step S1003.

[Step S5004]

The memory device 10 performs a second read operation (2nd READ) on the memory cell subjected to step S5001. The voltage generated as a result of the second read operation is used as voltage information (signal voltage) V2nd. Unlike in the first embodiment, the voltage generated as a result of the second read operation is not shifted.

[Step S5005]

The sense amplifier 122 determines the result of V1st generated in step S5001 based on voltage V2nd generated in step S5004 (second sense). Specifically, the sense amplifier 122 determines data stored in the memory cell by comparing current I1st based on V1st with a current obtained by adding a shift current to current I2nd based on V2nd or comparing a current obtained by adding a shift current to current I1st based on V1st with current I2nd based on V2nd.

After that, the memory device 10 writes back data only in memory cells MC determined to be error memory cells. The error memory cell MC is found by the memory device 10 by comparing the result of the first sense and the result of the second sense. When the result of the first sense differs from the result of the second sense, the memory cell MC is determined to be an error memory cell. In this case, the result of the second sense is written back in the memory cell MC.

Data is written back only in error memory cells MC by, for example, an instruction preset in the memory device 10 (such as a pre-charge command) or an instruction from outside the memory device 10, such as an instruction from the memory controller 20.

<2-2-2> Determination Method in Read Operation

Next, a specific determination method in the determination operation (step S5005) will be described.

In the first embodiment, voltage V2nd is generated by shifting the voltage generated as a result of the second read operation. However, in the present embodiment, the voltage generated as a result of the second read operation is not shifted. Therefore, as shown in FIG. 18, voltage V1st_0 is almost the same as voltage V2nd_0. Voltage V1st_0 cannot be directly compared with voltage V2nd_0. Voltage V1st_1 is also almost the same as voltage V2nd_1. Voltage V1st_1 cannot be directly compared with voltage V2nd_1.

Therefore, the present embodiment enables determination of which of current I1st based on voltage V1st and current I2nd based on voltage V2nd is larger by adding a shift current to current I1st based on voltage V1st or current I2nd based on voltage V2nd at the sense amplifier 122.

The relationship between voltage V1st and voltage V2nd and the relationship between current I1st and current I2nd will be described with reference to FIGS. 57 and 58. Each of FIGS. 57 and 58 illustrates a diagram showing the relationship between voltage V1st and voltage V2nd, and a diagram showing the relationship between current I1st and current I2nd.

The controller 17 cannot receive the result of the first read operation until step S5005 ends. However, the controller 17 is in receipt of the result of the reference read operation.

In the present embodiment, voltage V1st or voltage V2nd is shifted using the result of the reference read operation.

When the result of the reference read operation is "0", two cases are conceivable. One is the case where the memory cell MC stores data "0" in step S5001, and is determined as storing data "0" in the reference read (case A), and the other is the case where the memory cell MC stores data "1" in step S5001, and is determined as storing data "0" in the reference read (case B).

Namely, when the result of the reference read operation is "0", current I1st_0 based on voltage V1st_0 is compared with current I2nd_0 based on voltage V2nd_0 (case A), and current I1st_1 based on voltage V1st_1 is compared with current I2nd_1e based on voltage V2nd_1e (case B). In this case, as shown in FIG. 57, data can be determined by shifting current I1st_0 and current I1st_1 in the positive direction. Namely, upon receipt of data "0" as a result of the reference read operation in step S5002, the controller 17 shifts current I1st_0 and current I1st_1 in the positive direction in step S5005. The method for shifting current I1st will be described later.

In the case where the result of the reference read operation is "0", when current I1st is larger than current I2nd, the controller 17 can determine that the present case is case A. Namely, the controller 17 can determine that data that was stored in the memory cell MC is "0". In the case where the result of the reference read operation is "0", when current I1st is smaller than current I2nd, the controller 17 can determine that the present case is case B. Namely, the controller 17 can determine that data that was stored in the memory cell MC is "1".

When the result of the reference read operation is "1", two cases are conceivable. One is the case where the memory cell MC stores data "1" in step S5001, and is determined as storing data "1" in the reference read (case C), and the other is the case where the memory cell MC stores data "0" in step S5001, and is determined as storing data "1" in the reference read (case D).

Namely, when the result of the reference read operation is "1", current I1st_1 based on voltage V1st_1 is compared with current I2nd_1 based on voltage V2nd_1 (case C), and current I1st_0 based on voltage V1st_0 is compared with current I2nd_0e based on voltage V2nd_0e (case D). In this case, as shown in FIG. 58, data can be determined by shifting current I2nd_1 and current I2nd_0e in the positive direction. Namely, upon receipt of data "1" as a result of the reference read operation in step S5002, the controller 17 shifts current I2nd_1 and current I2nd_0e in the positive direction in step S5005. The method for shifting current I2nd will be described later.

In the case where the result of the reference read operation is "1", when current I1st is larger than current I2nd, the controller 17 can determine that the present case is case D. Namely, the controller 17 can determine that data that was stored in the memory cell MC is "0". In the case where the result of the reference read operation is "1", when current I1st is smaller than current I2nd, the controller 17 can determine that the present case is case C. Namely, the controller 17 can determine that data that was stored in the memory cell MC is "1".

<2-2-3> Details of Read Operation

Details of the read operation of the memory system according to the second embodiment will be described in accordance with the timing chart of FIG. 59. FIG. 59 is a timing chart showing the read operation of the memory system according to the second embodiment.

[Time T11 to Time T17]

The operation from time T11 to time T17 is the same as the operation from time T1 to time T7 in FIG. 21.

[After Time T17]

To perform the second sense (step S5005), the controller 17 lowers signal REN1 to the "L" level and raises signal SEN2 and signal VSFT to the "H" level. When the result of the reference read operation is "0", the controller 17 also brings signal SFTDO from "L" level to the "H" level. In contrast, when the result of the reference read operation is "1", the controller 17 brings signal SFTDOB from the "L" level to the "H" level.

Figure 60:
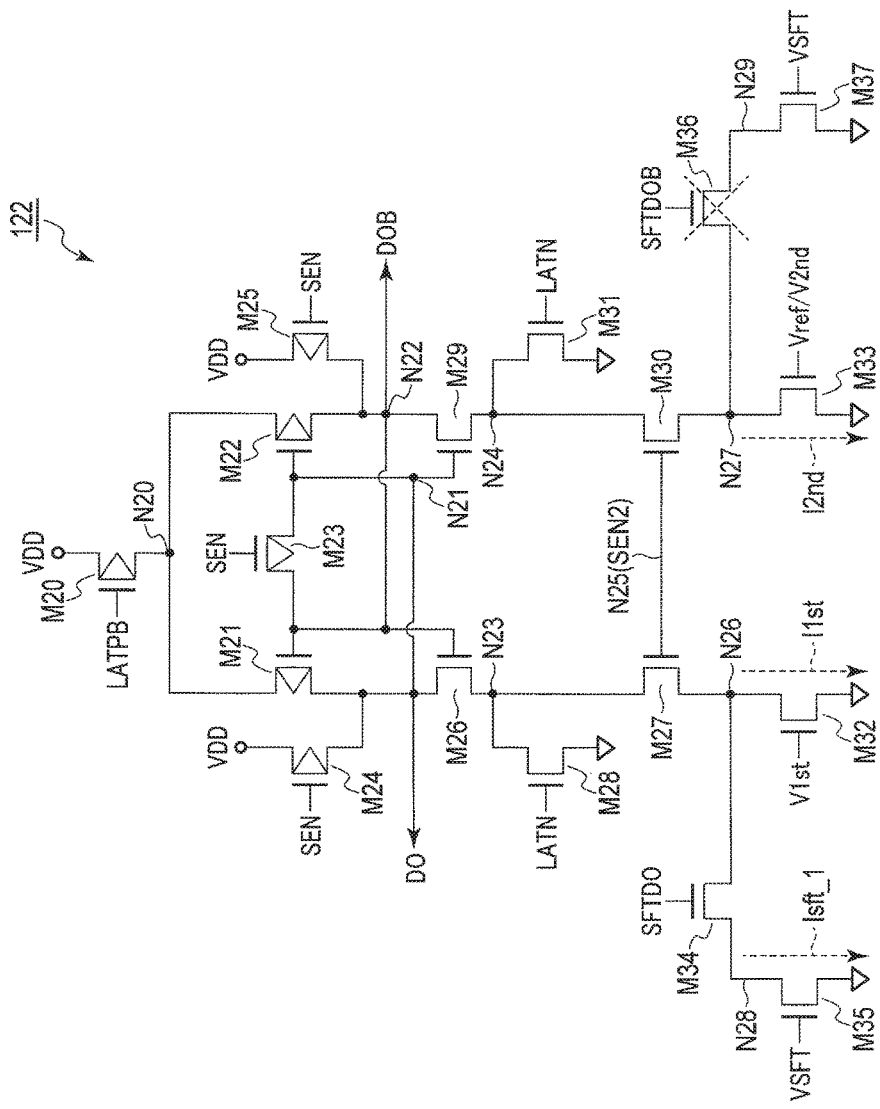
FIG. 60 is a circuit diagram showing the operation of the sense amplifier after time T17.

Next, the operation of the sense amplifier 122 after time T17 of the case where the result of the reference read operation is "0" will be described with reference to FIG. 60. FIG. 60 is a circuit diagram showing the operation of the sense amplifier 122 after time T17.

As shown in FIG. 60, in the sense amplifier 122, transistors M23, M24, M25, M27, M30, M32, M33, M34, and M35 are turned on.

Transistor M32 supplies current I1st corresponding to voltage V1st.

Transistors M34 and M35 supply current Isft_1 corresponding to voltage VSFT.

Accordingly, a sum current of current I1st and current Isft_1 flows in node N26.

Transistor M33 supplies current I2nd corresponding to voltage V2nd.

The controller 17 brings signal SEN to the "H" level at time T18 to turn off transistors M24 and M25, whereby current supply from transistors M24 and M25 is shut off. Accordingly, the electrical potential of node N21 is determined based on current I1st+current Isft_1. The electrical potential of node N22 is determined based on current I2nd. Therefore, a voltage difference is created between node N21 and node N22, and is increased at once by positive feedback of transistors M21, M22, M26, and M29.

At time T18, the controller 17 lowers signal LATPB to the "L" level, and raises signal LATN to the "H" level. Transistors M20, M28, and M31 of the sense amplifier 122 are thereby turned on. Accordingly, the difference in electrical potential between signal DO and signal DOB is increased to be as large as the difference between the "H" level and the "L" level.

The sense amplifier 122 thereby determines signal DO and signal DOB.

Figure 61:
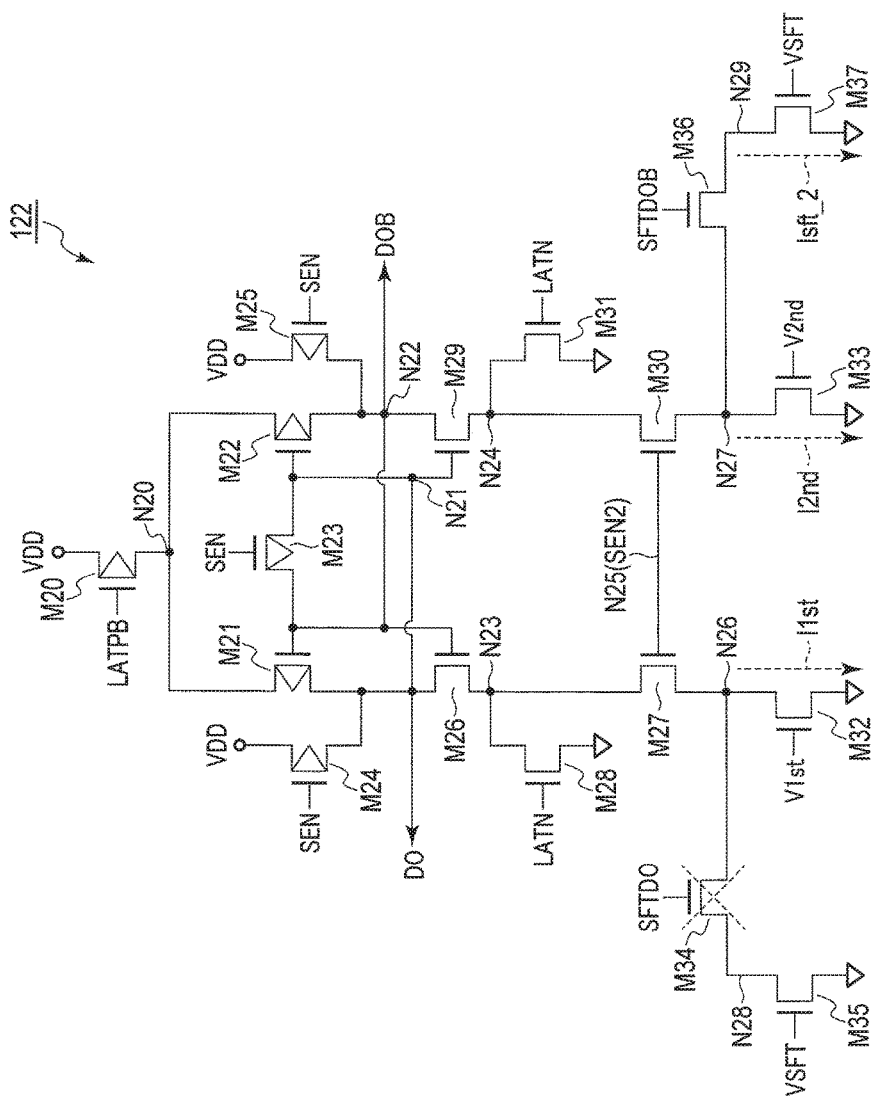
FIG. 61 is a circuit diagram showing the operation of the sense amplifier after time T17.

Next, the operation of the sense amplifier 122 after time T17 of the case where the result of the reference read operation is "1" will be described with reference to FIG. 61. FIG. 61 is a circuit diagram showing the operation of the sense amplifier 122 after time T17.

As shown in FIG. 61, in the sense amplifier 122, transistors M23, M24, M25, M27, M30, M32, M33, M34, and M35 are turned on.

Transistor M32 supplies current I1st corresponding to voltage V1st.

Transistor M33 supplies current I2nd corresponding to voltage V2nd.

Transistors M36 and M37 supply current Isft_2 corresponding to voltage VSFT.

Accordingly, a sum current of current I2nd and current Isft_2 flows in node N27.

The controller 17 brings signal SEN to the "H" level at time T18 to turn off transistors M24 and M25, whereby current supply from transistors M24 and M25 is shut off. Accordingly, the electrical potential of node N21 is determined based on current I1st. The electrical potential of node N22 is determined based on (current I2nd+current Isft_2). Therefore, a voltage difference is created between node N21 and node N22, and is increased at once by positive feedback of transistors M21, M22, M26, and M29.

At time T18, the controller 17 lowers signal LATPB to the "L" level, and raises signal LATN to the "H" level. Transistors M20, M28, and M31 of the sense amplifier 122 are thereby turned on. Accordingly, the difference in electrical potential between signal DO and signal DOB is increased to be as large as the difference between the "H" level and the "L" level.

The sense amplifier 122 thereby determines signal DO and signal DOB.

<2-3> Advantage

The above-described embodiment can gain the same advantage as the first embodiment.

<2-4> Modification 1 of Second Embodiment

Described in the second embodiment is the case where the memory cell MC has the configuration according to the first example. However, the second embodiment is also applicable to the case where the memory cell MC has the configuration according to the second example.

Modification 1 of the second embodiment in which the memory cell MC has the configuration according to the second example will be described with reference to FIG. 62. FIG. 62 is a timing chart showing the read operation of the memory system according to Modification 1 of the second embodiment. In the following description, only the matters different from the second embodiment will be described.

As shown in FIG. 62, the controller 17 performs the reference write operation (step S5003) from time T15 to time T16.

For example, when the memory cell MC has the configuration according to the second example, and the result of the reference read operation is data "1", the operation section 1231 brings signal WTH and signal. WT1 to the "L" level, and brings signal WTL and signal WT1B to the "H" level.

Accordingly, in the write driver 123, transistors M41 and M42 are turned on, as shown in FIG. 40. Transistor M42 supplies write current IWT2_1 for writing data "1" to the memory cell MC via the global bit line GBL.

The write driver 123 writes data "1" in the memory cell MC.

When the memory cell MC has the configuration according to the second example, and the result of the reference read operation is data "0", the operation section 1231 brings signal WTH and signal WT1 to the "H" level, and brings signal WTL and signal WT1B to the "L" level.

Accordingly, in the write driver 123, transistors M40 and M43 are turned on, as shown in FIG. 41. Transistor M40 supplies write current IWT2_0 for writing data "0" to the memory cell MC via the global bit line GBL.

The write driver 123 writes data "0" in the memory cell MC.

As described above, the same advantage as the first embodiment can be performed in the case where the memory cell MC has the configuration according to the second example.

<2-5> Modification 2 of Second Embodiment

In the second embodiment, the same data as that read in the reference read operation is overwritten in the memory cell MC. However, inversion data of data read in the reference read operation may be overwritten in the memory cell MC.

Modification 2 of the second embodiment in which inversion data of data read in the reference read operation is overwritten in the memory cell MC will be described with reference to FIG. 63. Hereinafter, descriptions of parts similar to those of the second embodiment will be omitted.

FIG. 63 is a flowchart showing the read operation of the memory system according to Modification 2 of the second embodiment.

The operation of steps S6001 and S6002 is the same as the operation of steps S1001 and S1002. The operation of step S6003 is the same as the operation of step S4003. The operation of steps S6004 and S6005 is the same as the operation of steps S5004 and S5005.

As a result, Modification 2 of the second embodiment can gain the same advantage as the first embodiment.

<3> Third Embodiment

The third embodiment will be described. In the third embodiment, a case where the number of memory cells to write data is reduced will be described. The basic configuration and basic operation of the memory system according to the third embodiment are the same as those of the memory system according to the above-described first and second embodiments. Thus, descriptions of matters described in the first and second embodiments and matters easily inferable from the first and second embodiments will be omitted.

<3-1> Outline

The outline of the third embodiment will be described with reference to FIGS. 64 and 65. FIG. 64 is a distribution map of cell currents of all memory cells included in the memory array. FIG. 65 is a diagram showing the relationship between the reference currents and the reference write operations.

In the read operation of the first embodiment, the result of the reference read operation is overwritten in the memory cell. However, from the view point of the number of erases, it is preferable not to overwrite the memory cells other than the memory cells determined to be error memory cells in the reference read.

Therefore, as shown in FIG. 64, the current region in which error memory cells are expected to be present is dealt with as a write target region in the third embodiment.

In the write operation during the read operation, a "1" write is performed on a "1" write target region, which is a part of the write target region. In the write operation during the read operation, a "0" write is performed on a "0" write target region, which is a part of the write target region.

As shown in FIGS. 64 and 65, there are four cases corresponding to distributions of cell currents divided using three reference currents Iref1, Iref2, and Iref3 (Iref1<Iref2<Iref3).

The first case corresponds to the distribution of cell currents equal to or smaller than reference current Iref1 (case 1). In this case 1, there is no possibility that error memory cells are present, and a write is skipped.

The second case corresponds to the distribution of cell currents equal to or smaller than reference current Iref2 and equal to or larger than reference current Iref1 (case 2). In this case 2, error 1 memory cells may be present, and a "1" write is performed.

The third case corresponds to the distribution of cell currents equal to or smaller than reference current Iref3 and equal to or larger than reference current Iref2 (case 3). In this case 3, error 2 memory cells may be present, and a "0" write is performed.

The fourth case corresponds to the distribution of cell currents equal to or larger than reference current Iref3 (case 4). In this case 4, there is no possibility that error memory cells are present, and a write is skipped.

Determination of the above four cases is performed in the sense amplifier unit (SAU) 124 to be described later.

By limiting the write target region as described above, deterioration of memory cells MC can be inhibited.

The configuration and method for limiting the write target region will be described below.

<3-2> Configuration

<3-2-1> Sense Amplifier/Write Driver

The sense amplifier/write driver 12 of the memory device according to the third embodiment will be described with reference to FIG. 66. FIG. 66 is a block diagram showing the sense amplifier/write driver 12 of the memory device according to the third embodiment.

As shown in FIG. 66, the sense amplifier/write driver 12 includes a plurality of core circuits 120. The core circuit 120 is provided for each pair of the global bit line and global source line. The core circuit 120 includes a preamplifier 121, a sense amplifier unit (SAU) 124, and a write driver 123.

The sense amplifier unit 124 generates data (DOX, DOBX) based on voltages V1st and Vref supplied from the preamplifier 121. There are three types of data (DOX, DOBX): data meaning "skip a write", data meaning "perform a '0' write", and data meaning "perform a '1' write." The sense amplifier 122 generates data (DO, DOB) based on voltages V1st and V2nd.

Based on the data from the sense amplifier 124, the write driver 123 applies a given voltage to the global bit line and the global source line in the reference write operation.

<3-2-2> Configuration of Sense Amplifier Unit

<3-2-2-1> Outline

Next, a configuration of the sense amplifier unit 124 of the memory device according to the third embodiment will be described with reference to FIG. 67. FIG. 67 is a block diagram showing the sense amplifier unit 124 of the memory device according to the third embodiment.

As shown in FIG. 67, the sense amplifier unit 124 includes a first sense amplifier 1241, a second sense amplifier 1242, a third sense amplifier 1243, and an operation section 1244.

The first sense amplifier 1241 generates data (DO1/DOB1) based on, for example, voltages Vref and V1st. The first sense amplifier 1241 determines whether a first read result is not more than reference current Iref1.

The second sense amplifier 1242 generates data (DO2/DOB2) based on, for example, voltages Vref and V1st. The second sense amplifier 1242 generates data (DO2/DOB2) based on, for example, voltages V1st and V2nd. The second sense amplifier 1242 determines whether the first read result is not more than reference current Iref2.

The third sense amplifier 1243 generates data (DO3/DOB3) based on, for example, voltages Vref and V1st. The third sense amplifier 1243 determines whether the first read result is not more than reference current Iref3.

Upon receipt of data (DO1/DOB1), data (DO2/DOB2), and data (DO3/DOB3) in the first data (DOX/DOBX) generation operation to be described later, the operation section 1244 generates data (DOX, DOBX) meaning "skip a write", "perform a '0' write", or "perform a '1' write". The method for generating data (DOX, DOBX) will be described later.

The operation section 1244 also outputs data (DO2/DOB2) as data (DO/DOB) in the second data (DO/DOB) generation operation to be described later.

<3-2-2-2> First Sense Amplifier

Next, a configuration of the first sense amplifier 1241 of the memory device according to the third embodiment will be described with reference to FIG. 68. FIG. 68 is a circuit diagram of the first sense amplifier 1241 of the memory device according to the third embodiment.

As shown in FIG. 68, the first sense amplifier 1241 of the memory device according to the third embodiment includes NMOS transistors M38 and M39 in addition to the transistors included in the sense amplifier 122 of the memory device according to the first embodiment.

One end of transistor M38 is coupled to node N26, the other end thereof is coupled to node N30, and the gate electrode thereof is supplied with signal SFTDO.

One end of transistor M39 is coupled to node N30, the other end thereof is supplied with the reference voltage VSS, and the gate electrode thereof is supplied with signal VSFT.

The operation of the first sense amplifier 1241 will be described later.

<3-2-2-3> Second Sense Amplifier

The second sense amplifier 1242 of the memory device according to the third embodiment is similar to the sense amplifier 122 of the memory device according to the first embodiment. In the second sense amplifier 1242, data (DO2) is output from node N21, and data (DOB2) is output from node N22 in FIG. 9.

The operation of the second sense amplifier 1242 will be described later.

<3-2-2-4> Third Sense Amplifier

Next, a configuration of the third sense amplifier 1243 of the memory device according to the third embodiment will be described with reference to FIG. 69.

As shown in FIG. 69, the third sense amplifier 1243 of the memory device according to the third embodiment includes NMOS transistors M40 and M41 in addition to the transistors included in the sense amplifier 122 of the memory device according to the first embodiment.

One end of transistor M40 is coupled to node N27, the other end thereof is coupled to node N31, and the gate electrode thereof is supplied with signal SFTDO.

One end of transistor M41 is coupled to node N31, the other end thereof is supplied with the reference voltage VSS, and the gate electrode thereof is supplied with signal VSFT.

The operation of the third sense amplifier 1243 will be described later.

<3-3> Read Operation

<3-3-1> Outline of Read Operation

The outline of the read operation of the memory system according to the third embodiment will be described with reference to FIG. 70. FIG. 70 is a flowchart showing the read operation of the memory system according to the third embodiment.

[Step S7001]

The operation of step S7001 is the same as the operation of step S1001.

[Step S7002]

In step S7002, a first sense is performed using the first to third sense amplifiers 1241 to 1243.

The first sense amplifier 1241 compares current Iref based on voltage Vref generated by step S7001 with a sum current of current I1st based on voltage V1st generated by step S7001 and current Isft. The first sense amplifier 1241 thereby determines whether the first read result is not more than reference current Iref1.

The second sense amplifier 1242 compares current Iref based on voltage Vref generated by step S7001 with current I1st based on voltage V1st generated by step S7001. The second sense amplifier 1242 thereby determines whether the first read result is not more than reference current Iref2.

The third sense amplifier 1243 compares a sum current of current Iref based on voltage Vref generated by step S7001 and voltage Isft with current I1st based on voltage V1st generated by step S7001. The third sense amplifier 1243 determines whether the first read result is not more than reference current Iref3.

[Step S7003]

Upon receipt of data "1" indicating that "the first read result is not more than reference current Iref1" from the first sense amplifier 1241, the operation section 1244 determines that the present case is case 1, and generates data (DOX, DOBX) meaning "skip a write".

Upon receipt of data "0" indicating that "the first read result is not less than reference current Iref1" from the first sense amplifier 1241 and data "1" indicating that "the first read result is not more than reference current Iref2" from the second sense amplifier 1242, the operation section 1244 determines that the present case is case 2, and generates data (DOX, DOBX) meaning "perform a '1' write".

Upon receipt of data "0" indicating that "the first read result is not less than reference current Iref2" from the second sense amplifier 1242 and data "1" indicating that "the first read result is not more than reference current Iref3" from the third sense amplifier 1243, the operation section 1244 determines that the present case is case 3, and generates data (DOX, DOBX) meaning "perform a '0' write".

Upon receipt of data "0" indicating that "the first read result is not less than reference current Iref3" from the third sense amplifier 1243, the operation section 1244 determines that the present case is case 4, and generates data (DOX, DOBX) meaning "skip a write".

[Step S7004]

The memory device 10 performs a write in accordance with the operation section 1244.

Specifically, when the write driver 123 receives data (DOX, DOBX) meaning "skip a write" from the operation section 1244, the write driver 123 does not perform a write operation on the target memory cell.

When the write driver 123 receives data (DOX, DOBX) meaning "perform a '1' write" from the operation section 1244, the write driver 123 performs a "1" write operation on the target memory cell.

When the write driver 123 receives data (DOX, DOBX) meaning "perform a '0' write" from the operation section 1244, the write driver 123 performs a "0" write operation on the target memory cell.

Accordingly, in the memory cells determined to be error memory cells by the reference read operation, data different from the one originally stored is stored. In the memory cells not determined to be error memory cells by the reference read operation, the same data as the one originally stored is stored.

[Step S7005]

The memory device 10 performs the second read operation (2nd READ) on the memory cell subjected to step S7001.

[Step S7006]

The preamplifier 121 shifts (decreases or increases) the voltage generated as a result of the second read operation to generate voltage information (signal voltage) V2nd.

[Step S7007]

The second sense amplifier 1242 determines the result of voltage V1st generated by step S7001 based on voltage V2nd generated by step S7006 (second sense). Specifically, the second sense amplifier 1242 compares current I1st based on V1st with current I2nd based on V2nd to determine data stored in the memory cell.

[Step S7008]

The operation section 1244 outputs data (DO2/DOB2) received from the second sense amplifier 1242 as second data (DO/DOB).

After that, the memory device 10 writes back data only in memory cells MC determined to be error memory cells. The error memory cell MC is found by the memory device 10 by comparing the result of the first sense and the result of the second sense. When the result of the first sense differs from the result of the second sense, the memory cell MC is determined to be an error memory cell. In this case, the result of the second sense is written back in the memory cell MC.

Data is written back only in error memory cells MC by, for example, an instruction preset in the memory device 10 (such as a pre-charge command) or an instruction from outside the memory device 10, such as an instruction from the memory controller 20.

<3-3-2> Details of Senses

Senses in the read operation of the memory system according to the third embodiment will be described in accordance with the timing chart of FIG. 71. FIG. 71 is a timing chart showing the senses in the read operation of the memory system according to the third embodiment.

[Time T2 to Time T5]

To perform the first sense (step S7002), the controller 17 raises signal SEN2, Signal VSFT, and signal SFTDO to the "H" level.

Here, the first sense amplifier 1241 will be described.

In the first sense amplifier 1241, transistors M23, M24, M25, M27, M30, M32, M33, M38, and M39 are turned on (see FIG. 68).

Transistor M32 supplies current I1st corresponding to voltage V1st. Transistors M38 and M39 supply current Isft_1 corresponding to voltage VSFT.

A sum current of current I1st and current Isft_1 flows in node N26.

Transistor M33 supplies current Iref corresponding to voltage Vref. Current Iref corresponds to reference current Iref2.

By adding current Isft_1 to current I1st, current I1st is virtually increased.

The first sense amplifier 1241 can thereby virtually compare current I1st with reference current Iref1 (Iref1=Iref2−Isft1).

Here, the second sense amplifier 1242 will be described.

In the second sense amplifier 1242, transistors M23, M24, M25, M27, M30, M32, and M33 are turned on (see FIG. 9).

Transistor M32 supplies current I1st corresponding to voltage V1st.

Transistor M33 supplies current Iref corresponding to voltage Vref. As described above, current Iref corresponds to reference current Iref2.

The second sense amplifier 1242 can thereby compare current I1st with reference current Iref2.

Here, the third sense amplifier 1243 will be described.

In the third sense amplifier 1243, transistors M23, M24, M25, M27, M30, M32, M33, M40, and M41 are turned on (see FIG. 69).

Transistor M32 supplies current I1st corresponding to voltage V1st.

Transistor M33 supplies current. Iref corresponding to voltage Vref. Current Iref corresponds to reference current Iref2. Transistors M40 and M41 supply current Isft_2 corresponding to voltage VSFT.

A sum current of current Iref and current Isft_2 flows in node N27.

The first sense amplifier 1241 can thereby virtually compare current I1st with reference current Iref3 (Iref3=Iref2+Isft2).

The controller 17 brings signal SEN to the "H" level at time T3 to turn off transistors M24 and M25 of the first to third sense amplifiers 1241 to 1243, whereby current supply from transistors M24 and M25 is shut off. Accordingly, the electrical potential of node N21 is determined based on current I1st. The electrical potential of node N22 is determined based on current Iref. Therefore, a voltage difference is created between node N21 and node N22, and is increased at once by positive feedback of transistors M21, M22, M26, and M29.

At time T4, the controller 17 lowers signal LATPB to the "L" level, and raises signal LATN to the "H" level. Transistors M20, M28, and M31 of the first to third sense amplifiers 1241 to 1243 are thereby turned on. Accordingly, the difference in electrical potential between signal DO (DO1 to DO3) and signal DOB (DOB1 to DOB3) is increased to be as large as the difference between the "H" level and the "L" level.

The first to third sense amplifiers 1241 to 1243 thereby determine signal DO and signal DOB.

Subsequently, the controller 17 lowers signal SEN, signal SEN2, and signal LATN to the "L" level at time T5. The controller 17 also raises signal LATPB to the "H" level. The first to third sense amplifiers 1241 to 1243 are thereby brought into the sense-enabled state.

Then, the operation section 1244 generates first data (DOX/DOBX) based on the results from the first to third sense amplifiers 1241 to 1243.

[Time T8 to Time T10]

To perform the second sense (step S7007), the controller 17 raises signal SEN2, signal VSFT, and signal SFTDO to the "H" level.

Here, the second sense amplifier 1242 will be described. In the second sense (step S7007), data of the first sense amplifier 1241 and the third sense amplifier 1243 is not used, and descriptions of the first sense amplifier 1241 and the third sense amplifier 1243 will be omitted.

In the second sense amplifier 1242, transistors M23, M24, M25, M27, M30, M32, and M33 are turned on (see FIG. 9).

Transistor M32 supplies current I1st corresponding to voltage V1st.

Transistor M33 supplies current Iref corresponding to voltage Vref. As described above, current Iref corresponds to reference current Iref2.

The second sense amplifier 1242 can thereby compare current I1st with reference current Iref2.

The controller 17 brings signal SEN to the "H" level at time T3 to turn off transistors M24 and M25 of the second sense amplifier 1242, whereby current supply from transistors M24 and M25 is shut off. Accordingly, the electrical potential of node N21 is determined based on current I1st. The electrical potential of node N22 is determined based on current Iref. Therefore, a voltage difference is created between node N21 and node N22, and is increased at once by positive feedback of transistors M21, M22, M26, and M29.

At time T4, the controller 17 lowers signal LATPB to the "L" level, and raises signal LATN to the "H" level. Transistors M20, M28, and M31 of the second sense amplifier 1242 are thereby turned on. Accordingly, the difference in electrical potential between signal DO (DO1 to DO3) and signal DOB (DOB1 to DOB3) is increased to be as large as the difference between the "H" level and the "L" level.

The second sense amplifier 1242 thereby determines signal DO and signal DOB.

Then, the operation section 1244 generates second data (DOX2/DOBX2) based on the result from the second sense amplifier 1242.

<3-4> Advantage

According to the above-described embodiment, the reference write operation is performed only on the distribution in which error memory cells may be present.

This performs the advantage of inhibiting deterioration of memory cells MC in addition to the advantage of the first embodiment.

The present embodiment is applicable to Modification 1 of the first embodiment, Modification 2 of the first embodiment, the second embodiment, Modification 1 of the second embodiment, and Modification 2 of the second embodiment.

<4> Others

The term "couple" in the above-described embodiments includes indirect coupling via a transistor, a resistor, or the like.

Herein, an MRAM that stores data using a magnetoresistive effect element (a magnetic tunnel junction (MTJ) element) as a resistance change element is explained as an example; however, the memory device is not limited thereto.

For example, the embodiments may be applicable to a resistance change type memory similar to the MRAM, for example, a semiconductor memory device including an element that stores data using a resistance change, such as ReRAM or PCRAM.

In addition, the embodiments may be applicable to a semiconductor memory device including an element that can read data stored by a resistance change caused by application of a current or voltage, or stored by converting the resistance difference involved with the resistance change into a current difference or a voltage difference, regardless of whether the semiconductor memory device is a volatile memory or a nonvolatile memory.

In each of the above-described embodiments, the bit line pair is referred to as a local bit line LBL and a local source line LSL for descriptive purposes. However, the bit line pair may be referred to as a first bit line and a second bit line, for example.

In the above-described embodiments, the memory system 1 has a configuration in which one memory device 10 is coupled to the memory controller 20. However, the configuration is not limited to this. For example, the memory system 1 may have a configuration in which a plurality of memory devices 10 are coupled to the memory controller 20.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device, comprising:
a memory cell; and
a first circuit that
performs a first read on the memory cell to generate a first voltage,
performs a reference read on the memory cell to generate a second voltage,
generates first data based on the first voltage and the second voltage,
writes the first data in the memory cell on which the first read has been performed,
performs a second read on the memory cell in which the first data has been written to generate a third voltage, and
determines data that was stored in the memory cell when the first read was performed, based on the first voltage and the third voltage.

2. The memory device according to claim 1, wherein the first circuit comprises:
a first preamplifier that generates the first voltage and the third voltage;
a second preamplifier that generates the second voltage; and
a sense amplifier that generates the first data based on the first voltage and the second voltage, and determines data that was in the memory cell when the first read was performed, based on the first voltage and the third voltage.

3. The memory device according to claim 2, wherein when the first read is performed on the memory cell, the first preamplifier
supplies a first current via a first path to the memory cell, and
supplies a second current, which is a copy current of the first current, via a second path electrically separated from the first path to a first voltage generation section that generates the first voltage and to a second voltage generation section that generates the third voltage, and
when the second read is performed on the memory cell, the first preamplifier
supplies a third current via the first path to the memory cell, and
supplies a fourth current, which is a copy current of the third current, via the second path to the second voltage generation section.

4. The memory device of claim 3, wherein
when the reference read is performed on the memory cell, the second preamplifier
supplies an fifth current via a third path electrically separated from the first path to a reference cell,
supplies the first current via the first path to the memory cell, and
supplies a sixth current based on the first and fifth currents via a fourth path electrically separated from the first and third paths to a third voltage generation section that generates the second voltage.

5. The memory device according to claim 1, wherein the first data is data determined as having been stored in the memory cell by the reference read, or inversion data of the data determined as having been stored in the memory cell by the reference read.

6. The memory device according to claim 2, wherein the first circuit further comprises a multiplexer that supplies the second voltage to the sense amplifier in the reference read, and supplies the third voltage to the sense amplifier in the second read.

7. The memory device according to claim 3, wherein when the first read is performed on the memory cell, the first preamplifier supplies the first current via the first path to the memory cell by using a diode-connected first transistor, and
when the second read is performed on the memory cell, the first preamplifier supplies the third current via the first path to the memory cell by using the diode-connected first transistor.

8. The memory device according to claim 7, wherein when the first read is performed on the memory cell, the first preamplifier supplies the second current via the second path to the first voltage generation section by using a diode-connected second transistor, and
when the second read is performed on the memory cell, the first preamplifier supplies the fourth current via the second path to the second voltage generation section by using the diode-connected second transistor.

9. The memory device according to claim 4, wherein when the reference read is performed on the memory cell, the second preamplifier supplies the fifth current via the third path to the reference cell by using a diode-connected third transistor.

10. The memory device according to claim 9, wherein when the reference read is performed on the memory cell, the second preamplifier supplies the sixth current via the fourth path to the third voltage generation section by using a diode-connected fourth transistor.

11. A method for controlling a memory device, the method comprising:
performing a first read on a memory cell to generate a first voltage,
performing a reference read on the memory cell to generate a second voltage, generating first data based on the first voltage and the second voltage, writing the first data in the memory cell on which the first read has been performed, performing a second read on the memory cell in which the first data has been written to generate a third voltage, and determining data that was stored in the memory cell when the first read was performed, based on the first voltage and the third voltage.

12. The method according to claim 11, further comprising:

when performing the first read on the memory cell, supplying a first current via a first path to the memory cell, and supplying a second current, which is a copy current of the first current, via a second path electrically separated from the first path to a first voltage generation section that generates the first voltage and to a second voltage generation section that generates the third voltage, and when performing the second read on the memory cell, supplying a third current via the first path to the memory cell, and supplying a fourth current, which is a copy current of the third current, via the second path to the second voltage generation section.

13. The method according to claim 12, further comprising:

when performing the reference read on the memory cell, supplying an fifth current via a third path electrically separated from the first path to a reference cell, supplying the first current via the first path to the memory cell, and supplying a sixth current based on the first and fifth currents via a fourth path electrically separated from the first and third paths to a third voltage generation section that generates the second voltage.

14. The method according to claim 11, wherein the first data is data determined as having been stored in the memory cell by the reference read, or inversion data of the data determined as having been stored in the memory cell by the reference read.

15. The method according to claim 11, further comprising supplying the second voltage to the sense amplifier in the reference read, and supplying the third voltage to the sense amplifier in the second read.

16. The method according to claim 12, further comprising:

when performing the first read on the memory cell, supplying the first current via the first path to the memory cell by using a diode-connected first transistor, and when performing the second read on the memory cell, supplying the third current via the first path to the memory cell by using the diode-connected first transistor.

17. The method according to claim 16, further comprising:

when performing the first read on the memory cell, supplying the second current via the second path to the first voltage generation section by using a diode-connected second transistor, and when performing the second read on the memory cell, supplying the fourth current via the second path to the second voltage generation section by using the diode-connected second transistor.

18. The method according to claim 13, further comprising:

when performing the first read on the memory cell, supplying the second current via the second path to the first voltage generation section by using a diode-connected second transistor, and when performing the second read on the memory cell, supplying the fourth current via the second path to the second voltage generation section by using the diode-connected second transistor.

19. The method according to claim 18, further comprising:

when performing the reference read on the memory cell, supplying the sixth current via the fourth path to the third voltage generation section by using a diode-connected fourth transistor.

* * * * *